(12) United States Patent
Sharangpani et al.

(10) Patent No.: US 12,457,738 B2
(45) Date of Patent: Oct. 28, 2025

(54) THREE-DIMENSIONAL MEMORY DEVICE CONTAINING ENGINEERED CHARGE STORAGE ELEMENTS AND METHODS FOR FORMING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Adarsh Rajashekhar, Santa Clara, CA (US); Fei Zhou, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 375 days.

(21) Appl. No.: 18/351,205

(22) Filed: Jul. 12, 2023

(65) Prior Publication Data

US 2024/0179897 A1 May 30, 2024

Related U.S. Application Data

(60) Provisional application No. 63/428,574, filed on Nov. 29, 2022.

(51) Int. Cl.
*H10B 41/27* (2023.01)
*H10B 41/10* (2023.01)
(Continued)

(52) U.S. Cl.
CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ................................ H10B 41/27; H10B 43/27
See application file for complete search history.

(56) References Cited

U.S. PATENT DOCUMENTS 8,349,681 B2   1/2013   Alsmeier et al.
8,658,499 B2   2/2014   Makala et al.
(Continued)

OTHER PUBLICATIONS

Moriya, T. et al. "Selective CVD of tungsten and its applications to MOS VLSI." Tungsten and other refractory metals for VLSI applications. 1986; https://inis.iaea.org/search/searchsinglerecord.aspx?recordsFor=SingleRecord&RN=18030935 (Abstract).
(Continued)

*Primary Examiner* — Lauren R Bell
(74) *Attorney, Agent, or Firm* — THE MARBURY LAW GROUP PLLC

(57) ABSTRACT

A semiconductor structure includes an alternating stack of insulating layers and electrically conductive layers, a memory opening vertically extending through the alternating stack, and a memory opening fill structure located in the memory opening and containing a vertical semiconductor channel and a memory film. The memory film includes a tunneling dielectric layer, a continuous charge storage material layer vertically extending through a plurality of the electrically conductive layers, a vertical stack of discrete charge storage elements located at levels of the electrically conductive layers and contacting a respective surface segment of an outer sidewall of the continuous charge storage material layer, and a vertical stack of discrete blocking dielectric material portions containing silicon atoms and oxygen atoms and located at the levels of the electrically conductive layers and vertically spaced apart from each other.

18 Claims, 49 Drawing Sheets

(51) Int. Cl.
  *H10B 41/35* (2023.01)
  *H10B 43/10* (2023.01)
  *H10B 43/27* (2023.01)
  *H10B 43/35* (2023.01)

(56) References Cited

U.S. PATENT DOCUMENTS

| | | | |
|---|---|---|---|
| 8,884,357 B2 | 11/2014 | Wang et al. | |
| 8,946,023 B2 | 2/2015 | Makala et al. | |
| 9,397,093 B2 | 7/2016 | Makala et al. | |
| 9,449,982 B2 | 9/2016 | Lu et al. | |
| 9,698,153 B2 | 7/2017 | Liu et al. | |
| 9,960,180 B1* | 5/2018 | Zhou | H10D 64/037 |
| 10,283,513 B1* | 5/2019 | Zhou | H10D 84/016 |
| 10,516,025 B1 | 12/2019 | Nishikawa et al. | |
| 10,998,331 B2 | 5/2021 | Zhou et al. | |
| 11,101,288 B2* | 8/2021 | Zhang | H01L 21/76877 |
| 11,282,848 B2 | 3/2022 | Makala et al. | |
| 11,302,716 B2 | 4/2022 | Makala et al. | |
| 11,387,244 B2 | 7/2022 | Makala et al. | |
| 11,469,241 B2 | 10/2022 | Makala et al. | |
| 11,659,711 B2 | 5/2023 | Kasai et al. | |
| 2012/0001249 A1 | 1/2012 | Alsmeier et al. | |
| 2014/0353738 A1* | 12/2014 | Makala | H10B 43/20 438/264 |
| 2015/0294978 A1 | 10/2015 | Lu et al. | |
| 2019/0051656 A1* | 2/2019 | Carlson | H10B 43/27 |
| 2020/0006375 A1 | 1/2020 | Zhou et al. | |
| 2021/0257379 A1* | 8/2021 | Cui | H10D 30/693 |
| 2021/0327890 A1 | 10/2021 | Makala et al. | |
| 2021/0327897 A1* | 10/2021 | Kasai | H10B 43/10 |
| 2021/0358931 A1 | 11/2021 | Makala et al. | |
| 2021/0358942 A1* | 11/2021 | Rajashekhar | H10B 43/10 |
| 2021/0358952 A1 | 11/2021 | Makala et al. | |
| 2022/0093644 A1 | 3/2022 | Sharangpani et al. | |
| 2022/0285386 A1 | 9/2022 | Said et al. | |
| 2023/0071503 A1* | 3/2023 | Du | H10B 41/27 |

OTHER PUBLICATIONS

Kang, C. et al., "Effects of Lateral Charge Spreading on the Reliability of TANOS (TaN/AlO/SiN/Oxide/Si) NAND Flash Memory," 2007 IEEE International Reliability Physics Symposium Proceedings. 45th Annual, Phoenix, AZ, USA, 2007, pp. 167-170, doi: 10.1109/RELPHY.2007.369887.

Sandhya, C. et al., "Nitride engineering and the effect of interfaces on Charge Trap Flash performance and reliability," 2008 IEEE International Reliability Physics Symposium, Phoenix, AZ, USA, 2008, pp. 406-411, doi: 10.1109/RELPHY.2008.4558919.

Shin, Y. et al., "A novel NAND-type MONOS memory using 63nm process technology for multi-gigabit flash EEPROMs," IEEE International Electron Devices Meeting, 2005. IEDM Technical Digest., Washington, DC, 2005, pp. 327-330, doi: 10.1109/IEDM.2005.1609341.

Endoh et al., "Novel Ultra High-Density Memory with a Stacked-Surrounding Gate Transistor (S-SGT) Structured Cell," IEDM Proc. (2001) 33-36.

Lie, L.N. et al., "Thermal oxidation of silicides," Journal of Applied Physics, vol. 56, 2127 (1984); https://doi.org/10.1063/1.334212.

U.S. Appl. No. 17/507,224, filed Oct. 21, 2021, SanDisk Technologies LLC.

* cited by examiner

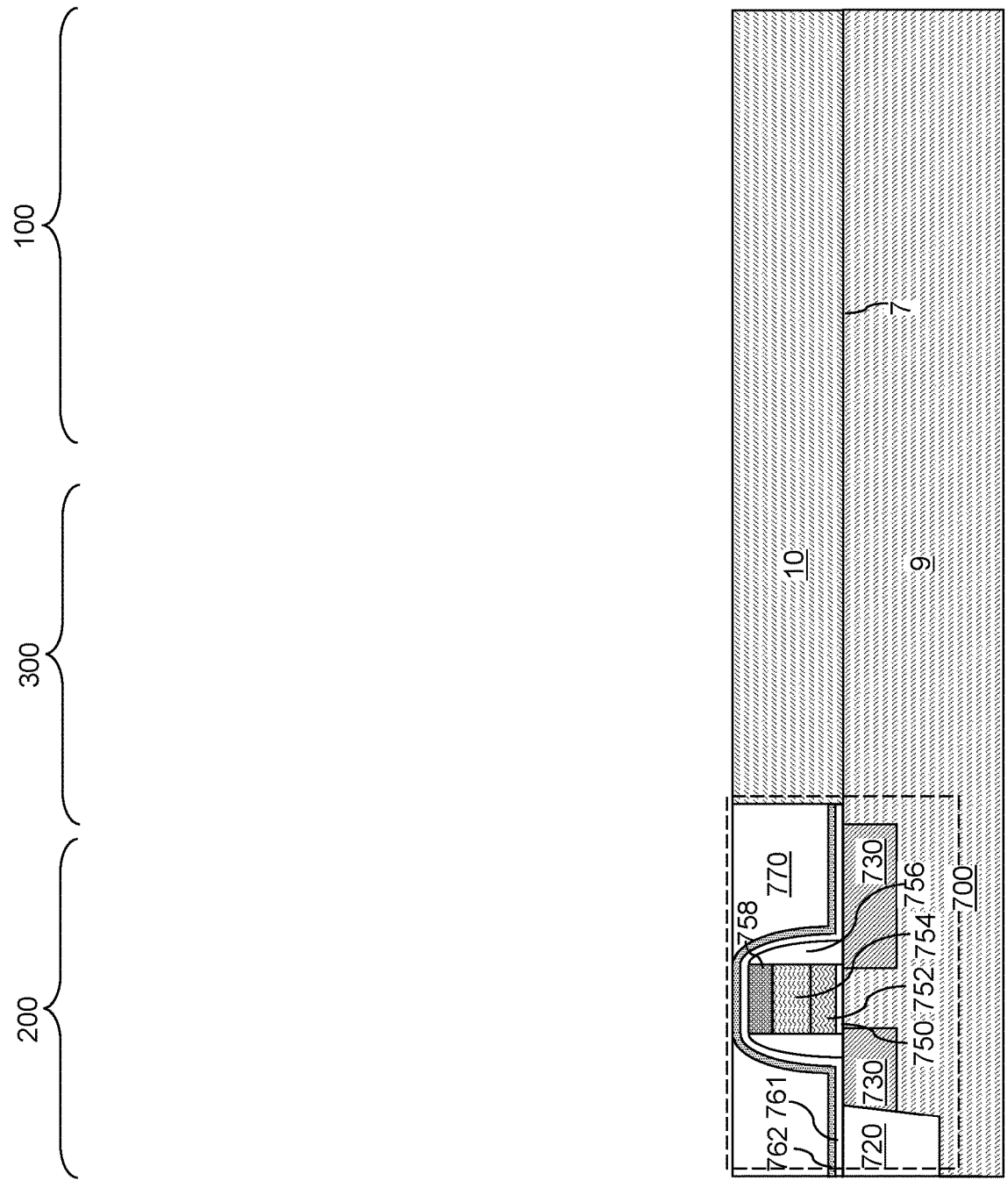

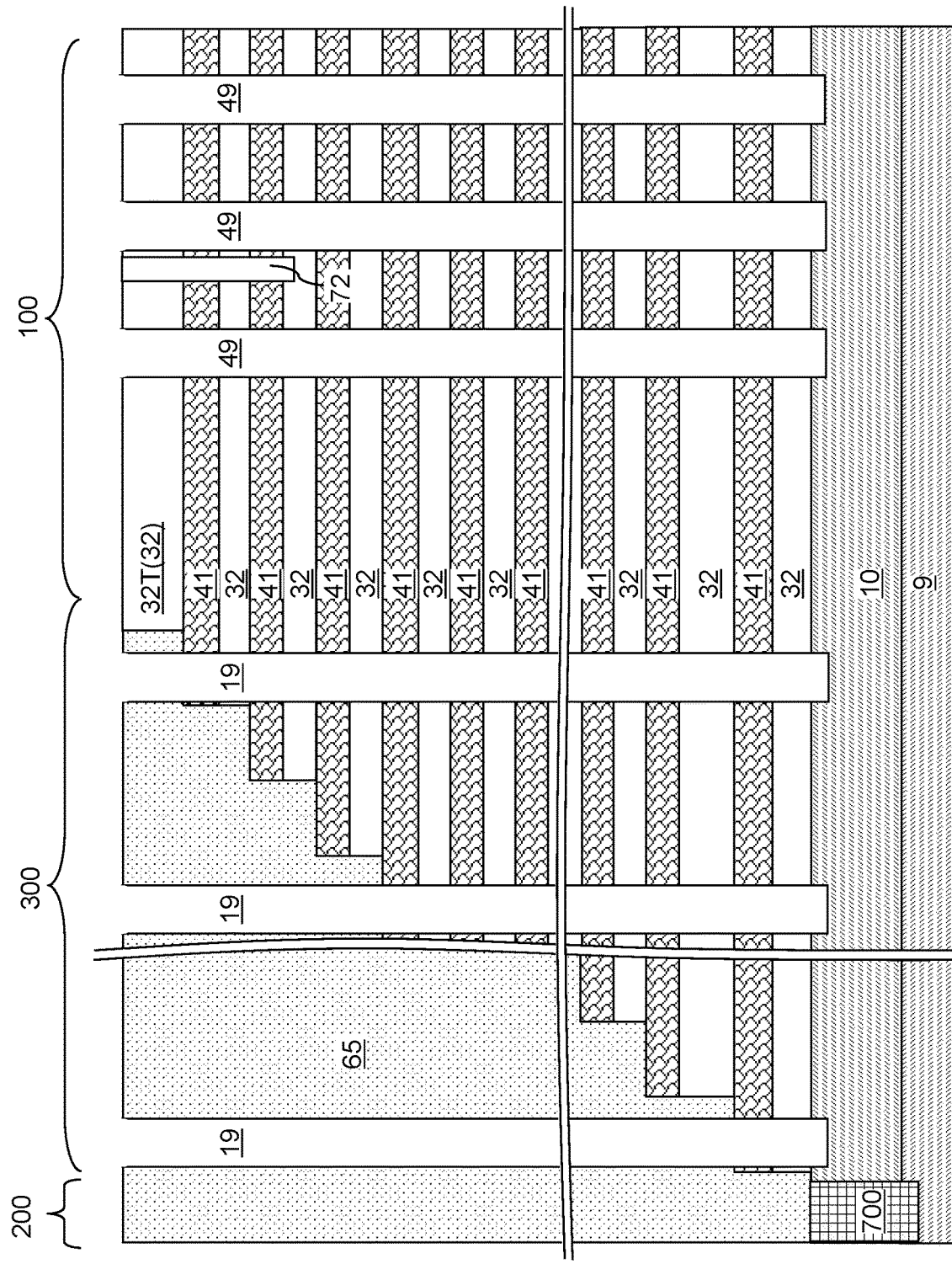

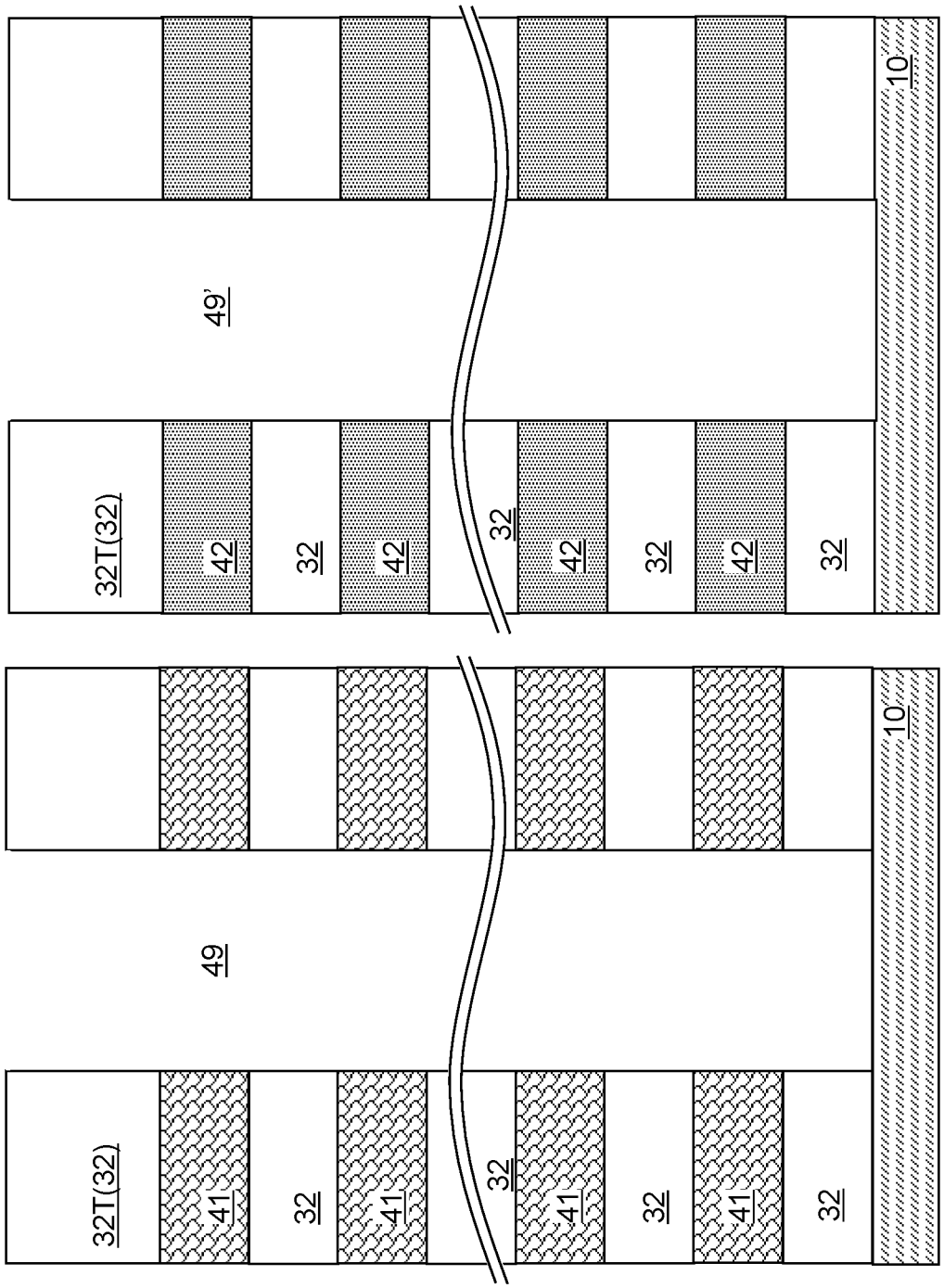

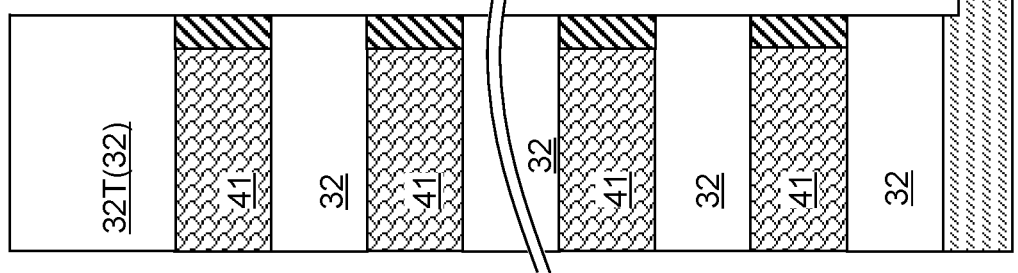
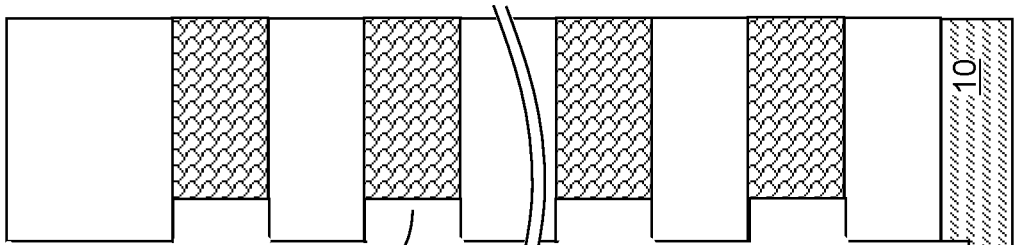
FIG. 5B
FIG. 5A

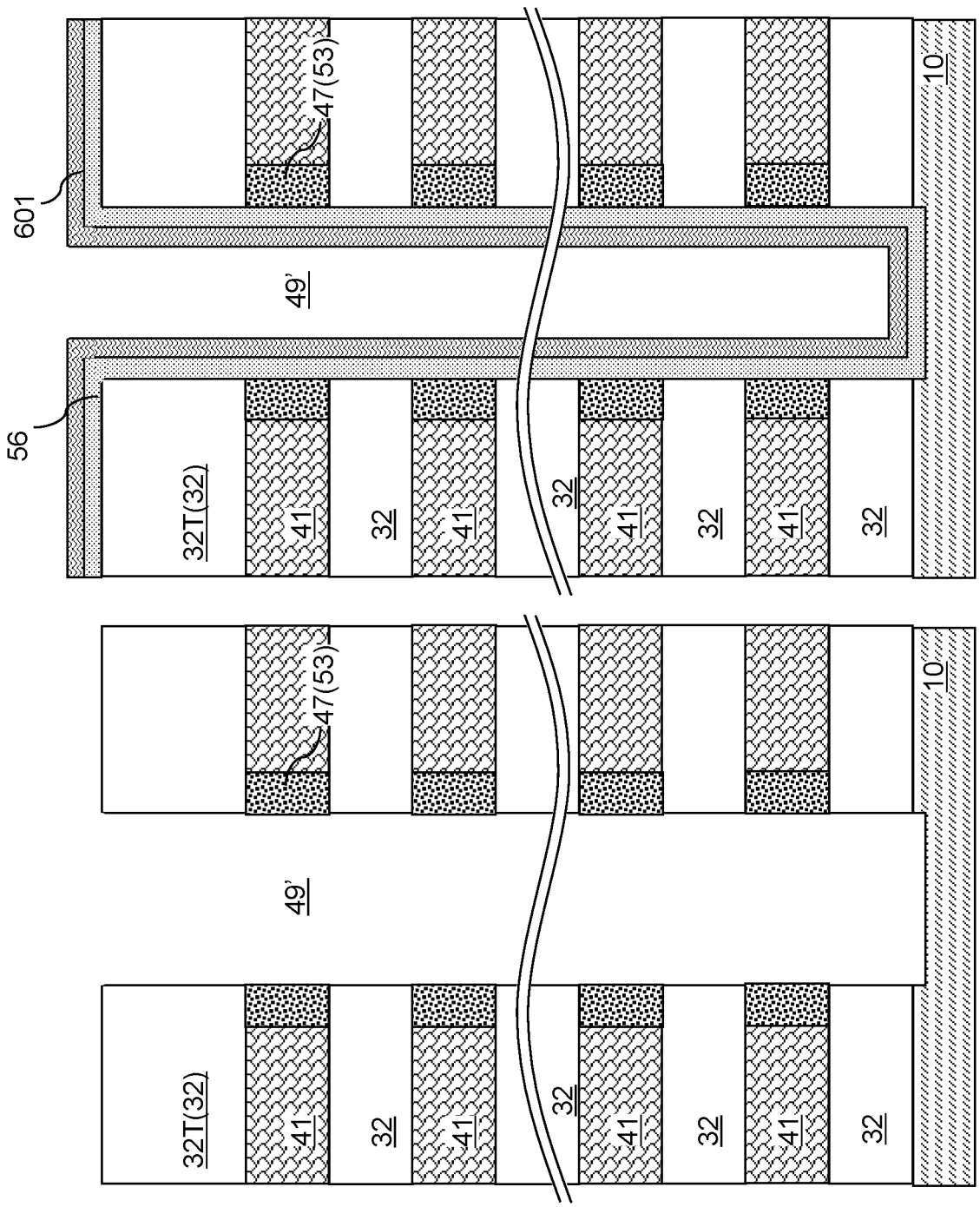

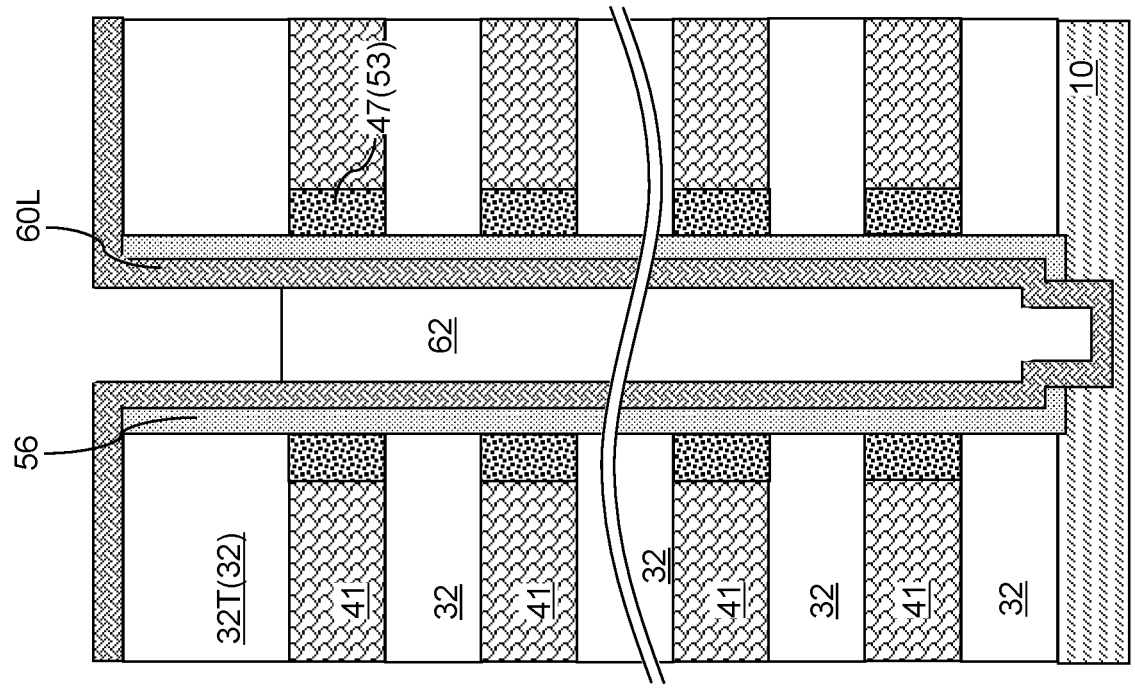
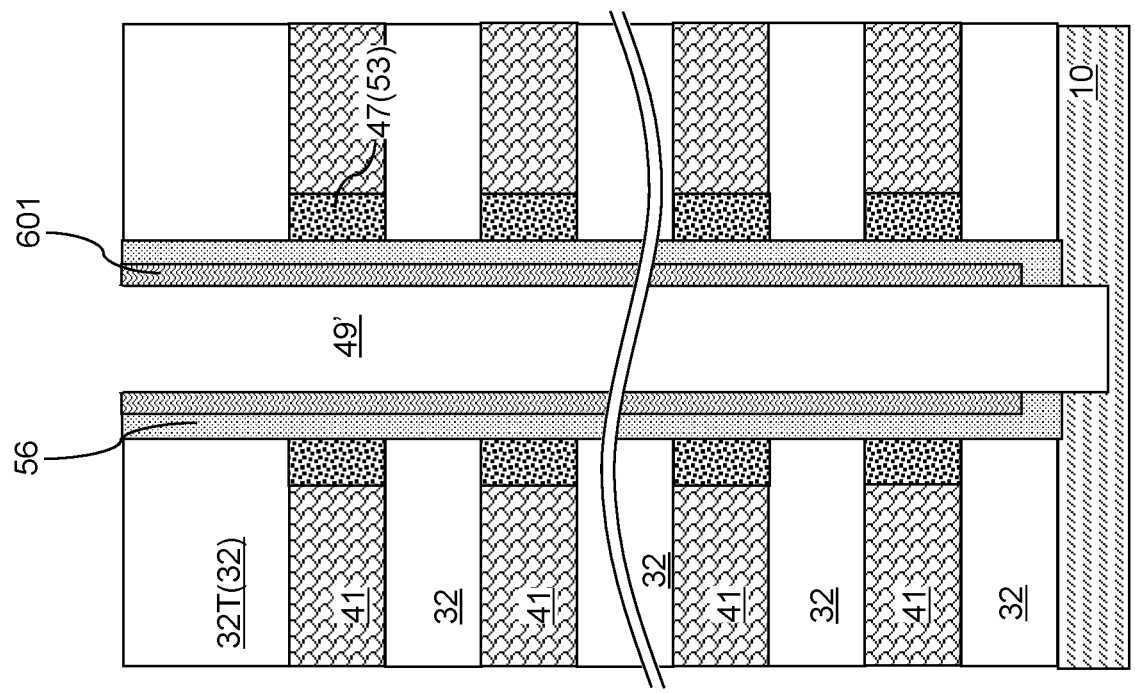

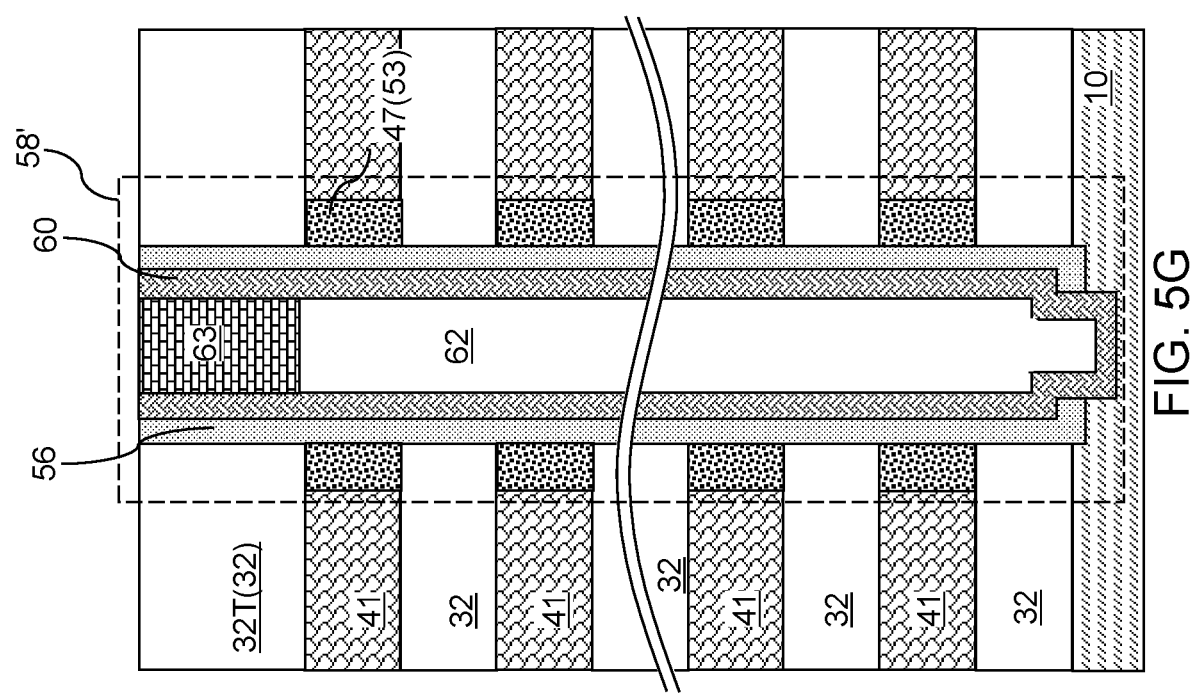

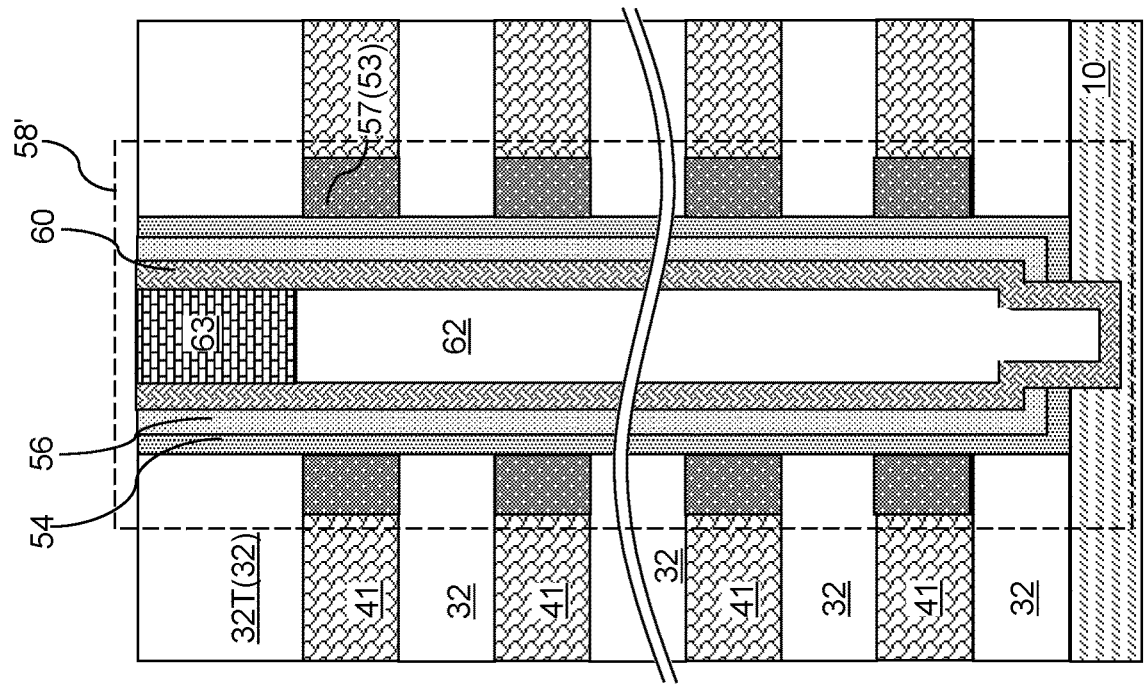
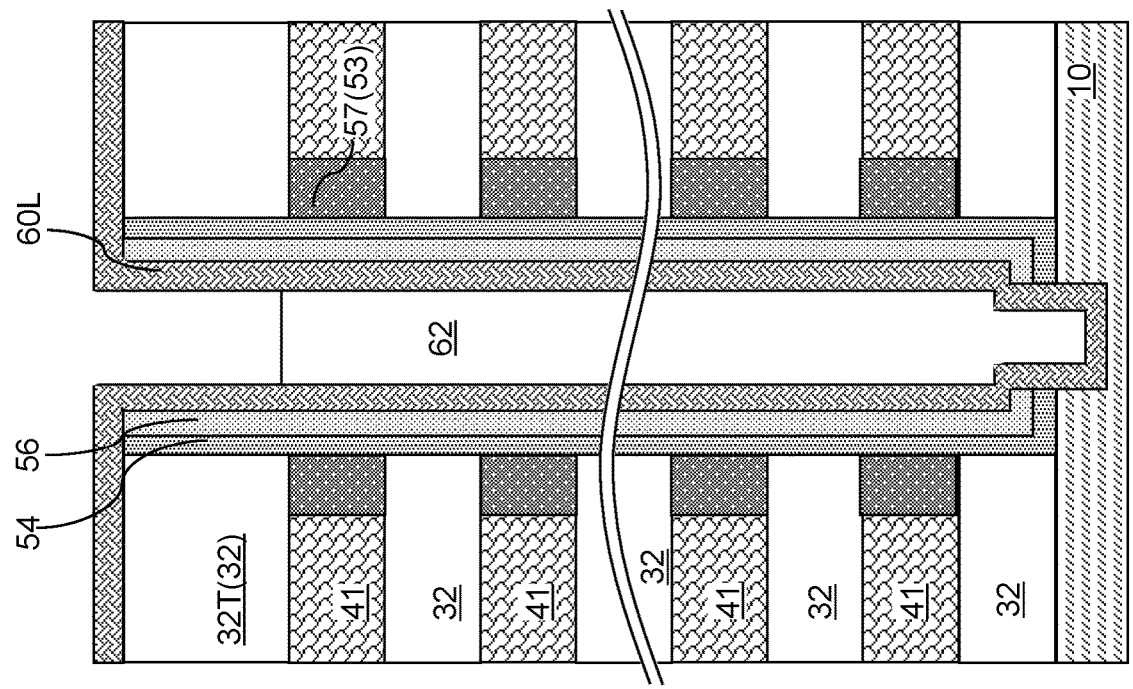
FIG. 7F
FIG. 7E

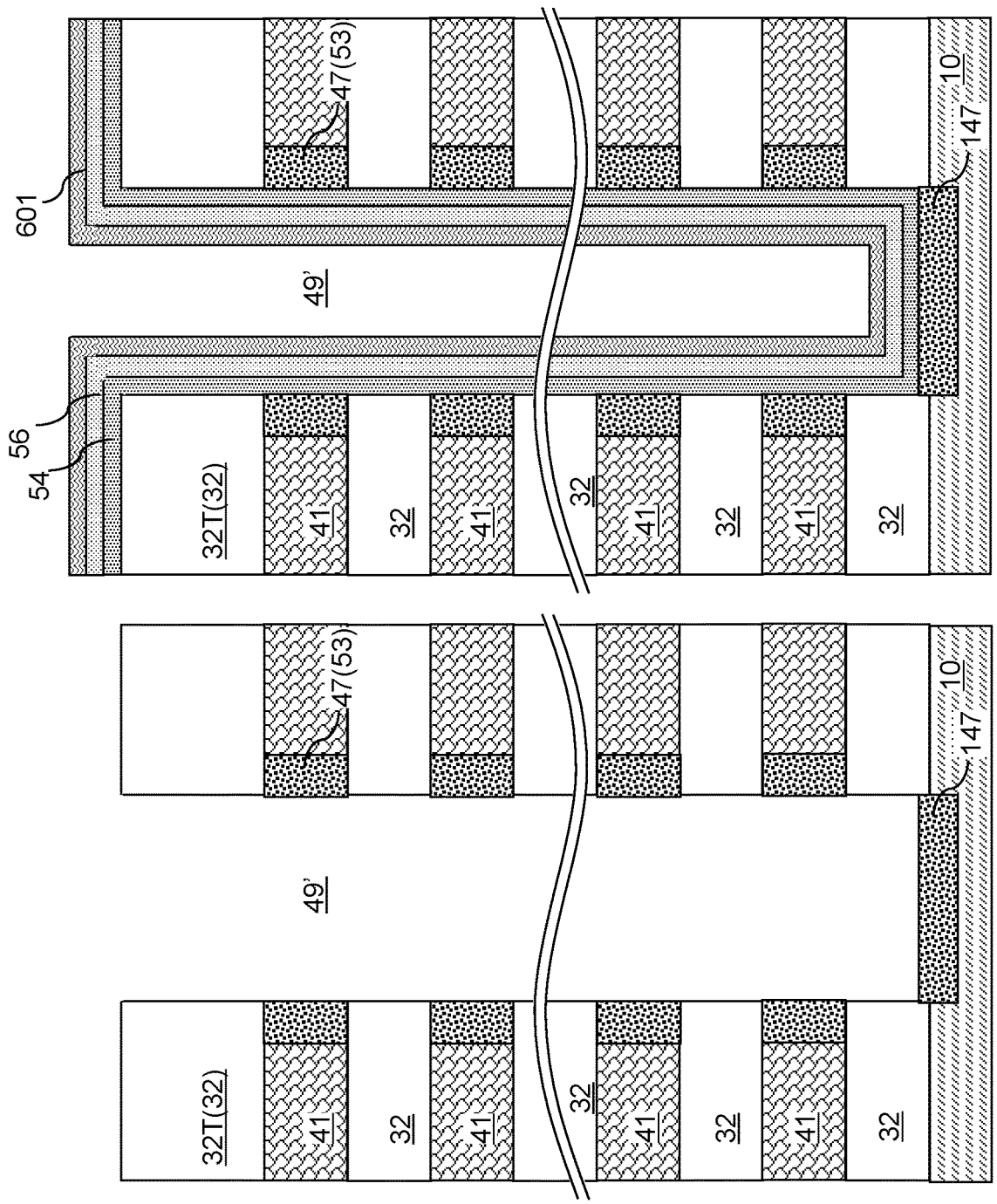

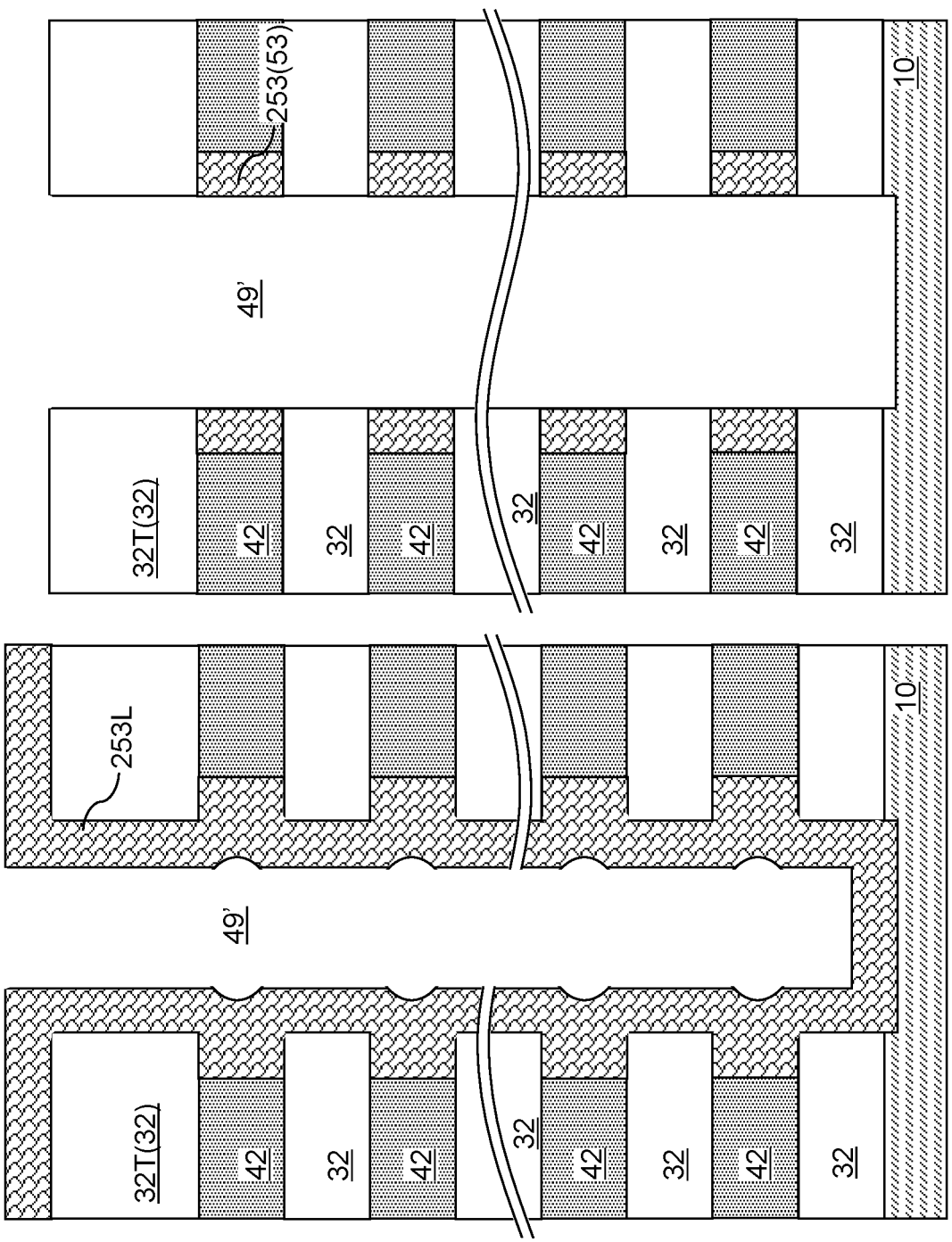

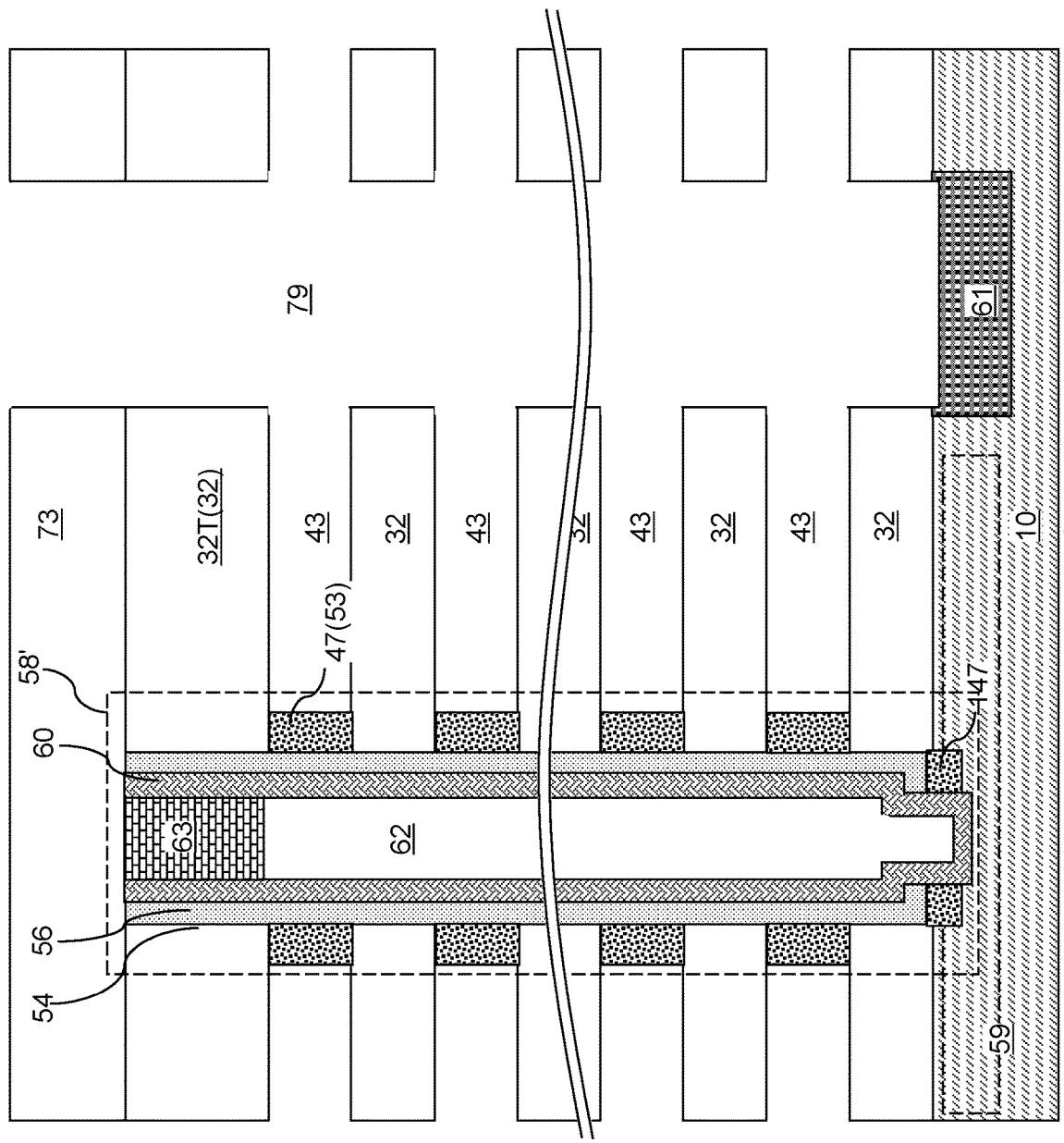

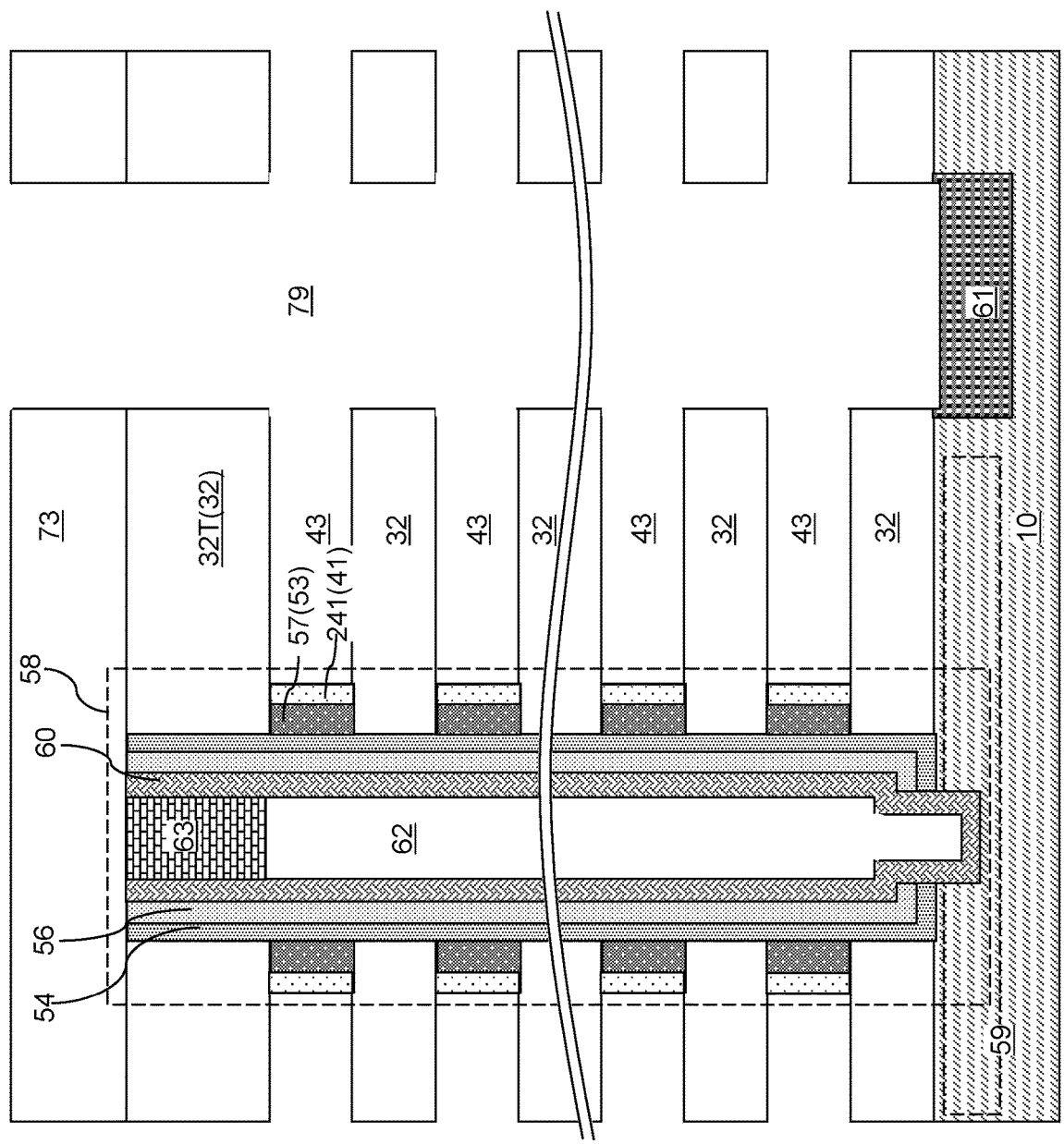

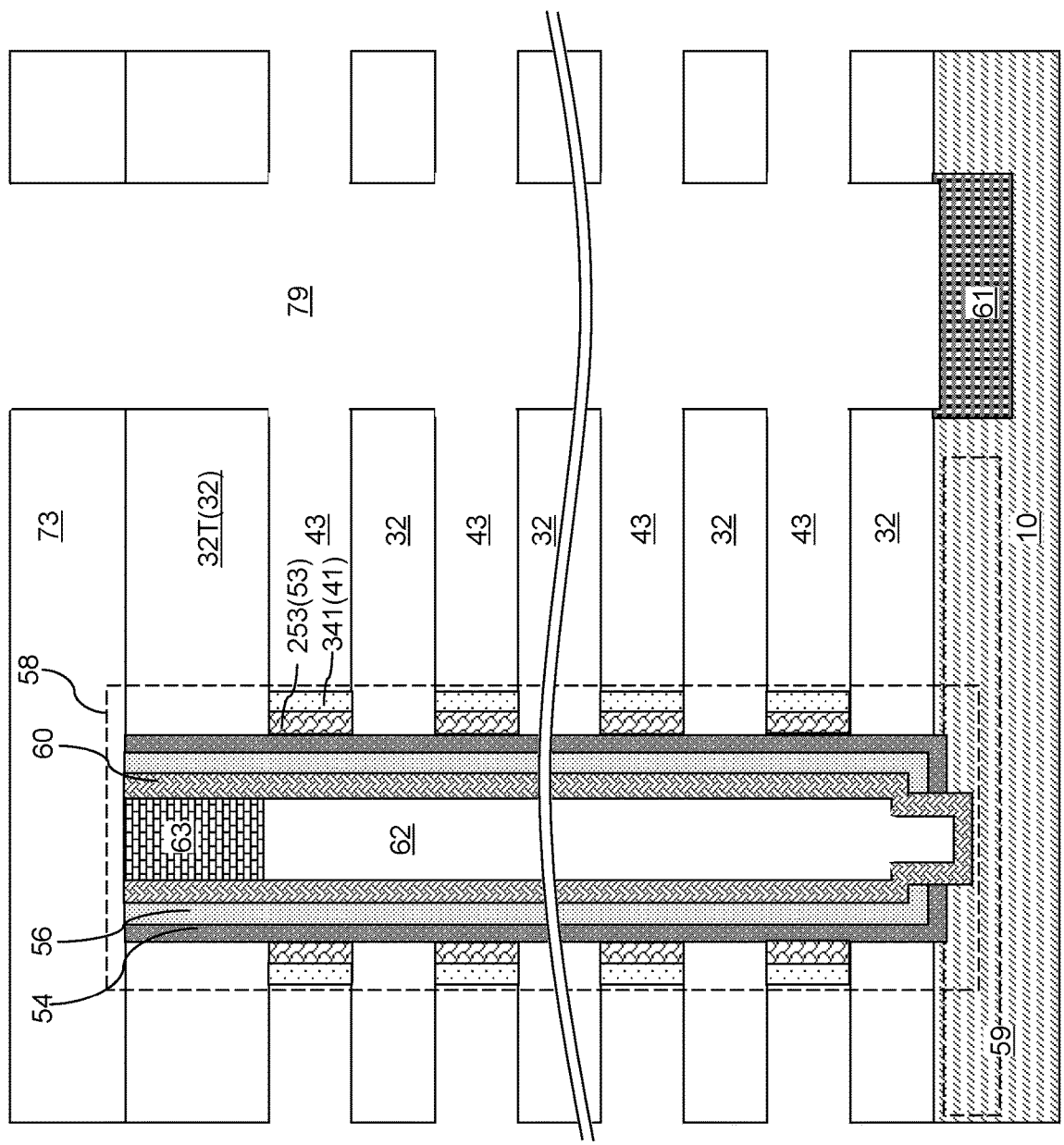

THREE-DIMENSIONAL MEMORY DEVICE CONTAINING ENGINEERED CHARGE STORAGE ELEMENTS AND METHODS FOR FORMING THE SAME

FIELD

The present disclosure relates generally to the field of semiconductor devices, and particularly to a three-dimensional memory device containing engineered charge storage elements and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure includes an alternating stack of insulating layers and electrically conductive layers, a memory opening vertically extending through the alternating stack, and a memory opening fill structure located in the memory opening and containing a vertical semiconductor channel and a memory film. The memory film includes a tunneling dielectric layer, a continuous charge storage material layer vertically extending through a plurality of the electrically conductive layers, a vertical stack of discrete charge storage elements located at levels of the electrically conductive layers and contacting a respective surface segment of an outer sidewall of the continuous charge storage material layer, and a vertical stack of discrete blocking dielectric material portions containing silicon atoms and oxygen atoms and located at the levels of the electrically conductive layers and vertically spaced apart from each other.

According to another aspect of the present disclosure a semiconductor structure includes an alternating stack of insulating layers and electrically conductive layers, a memory opening vertically extending through the alternating stack, and a memory opening fill structure located in the memory opening and comprising a vertical semiconductor channel and a memory film. The memory film comprises a tunneling dielectric layer, a vertical stack of discrete polysilicon or metal silicide floating gates located at levels of the electrically conductive layers, and a vertical stack of discrete blocking dielectric material portions comprising silicon atoms and oxygen atoms and located at the levels of the electrically conductive layers and vertically spaced apart from each other, wherein each of the discrete blocking dielectric material portions has a cylindrical shape and does not extend between horizontal surfaces of the electrically conductive layers and the insulating layers.

According to another aspect of the present disclosure, a method of forming a semiconductor comprises: forming an alternating stack of insulating layers and sacrificial material layers over a substrate; forming a memory opening through the alternating stack; forming an in-process memory opening fill structure in the memory opening, wherein the in-process memory opening fill structure comprises a vertical stack of discrete charge storage elements located at levels of the sacrificial material layers, a tunneling dielectric layer, and a vertical semiconductor channel; forming backside recesses by removing the sacrificial material layers selective to the insulating layers and the vertical stack of discrete charge storage elements; converting outer surface portions of the vertical stack of discrete charge storage elements into a vertical stack of blocking dielectric material portions by performing an oxidation process; and forming electrically conductive layers within the backside recesses.

BRIEF DESCRIPTION OF THE DRAWINGS

FIG. 1 is a schematic vertical cross-sectional view of an exemplary structure after formation of at least one peripheral device, a semiconductor material layer, and a gate dielectric layer according to an embodiment of the present disclosure.

FIG. 4A is a schematic vertical cross-sectional view of the exemplary structure after formation of memory openings and support openings according to an embodiment of the present disclosure.

FIG. 4C is a vertical cross-sectional view of a memory opening in the exemplary structure of FIGS. 4A and 4B.

FIG. 4D is a vertical cross-sectional view of a memory opening in the alternative embodiment of the exemplary structure at the processing steps of FIGS. 4A and 4B.

FIGS. 5A-5G are sequential schematic vertical cross-sectional views of a memory opening within the exemplary structure during formation of an in-process memory opening fill structure in a first configuration according to an embodiment of the present disclosure.

FIGS. 7A-7F are sequential schematic vertical cross-sectional views of a memory opening within the exemplary structure during formation of an in-process memory opening fill structure in a second configuration according to an embodiment of the present disclosure.

FIGS. 8A-8E are sequential schematic vertical cross-sectional views of a memory opening within the exemplary structure during formation of an in-process memory opening fill structure in a third configuration according to an embodiment of the present disclosure.

FIGS. 9A-9H are sequential schematic vertical cross-sectional views of a region around a memory opening in the exemplary structure during formation of an in-process memory opening fill structure in a fourth configuration according to the alternative embodiment of the present disclosure.

FIGS. 13A-13E are sequential vertical cross-sectional views of a region of the exemplary structure during modification of in-process memory opening fill structures in the first configuration and formation of electrically conductive layers and backside trench fill structures according to an embodiment of the present disclosure.

FIGS. 14A-14E are sequential vertical cross-sectional views of a region of the exemplary structure during modification of in-process memory opening fill structures in the second configuration and formation of electrically conductive layers and backside trench fill structures according to an embodiment of the present disclosure.

FIGS. 16A-16E are sequential vertical cross-sectional views of a region of the exemplary structure during modification of in-process memory opening fill structures in the fourth configuration and formation of electrically conductive layers and backside trench fill structures according to an embodiment of the present disclosure.

DETAILED DESCRIPTION

Figure 2A:
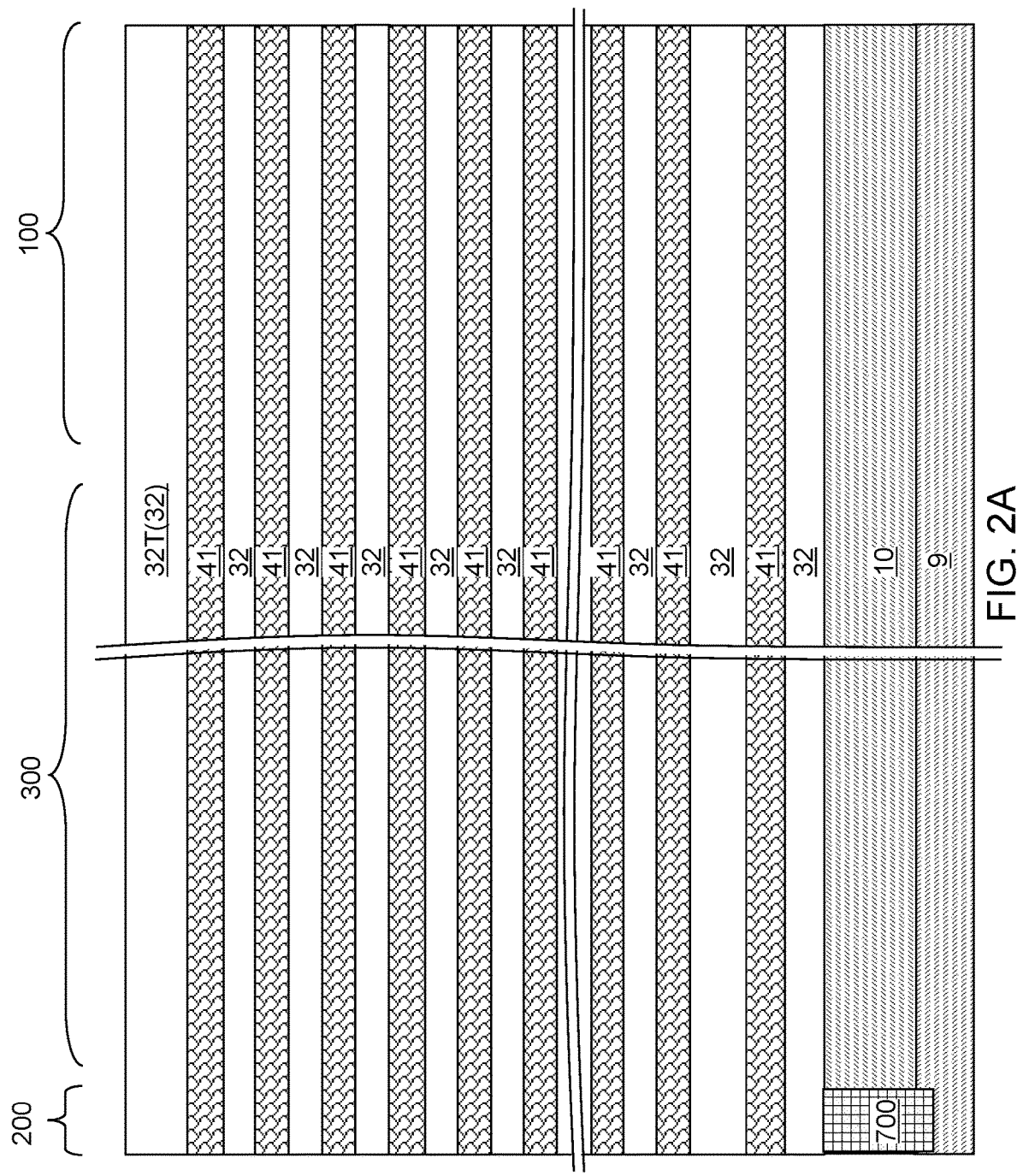
FIG. 2A is a schematic vertical cross-sectional view of the exemplary structure after formation of an alternating stack of insulating layers and semiconductor sacrificial material layers according to an embodiment of the present disclosure.

As discussed above, the present disclosure is directed to three-dimensional memory devices containing engineered charge storage elements, such as hybrid continuous and discrete charge storage elements having a different composition, and methods of manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer (e.g., silicon wafer) 9 and an optional semiconductor material layer (e.g., doped well in the silicon wafer or an epitaxial silicon layer on the silicon wafer) 10. The substrate can have a major surface 7, which can be, for example, a topmost surface of the substrate semiconductor layer 9. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2B:
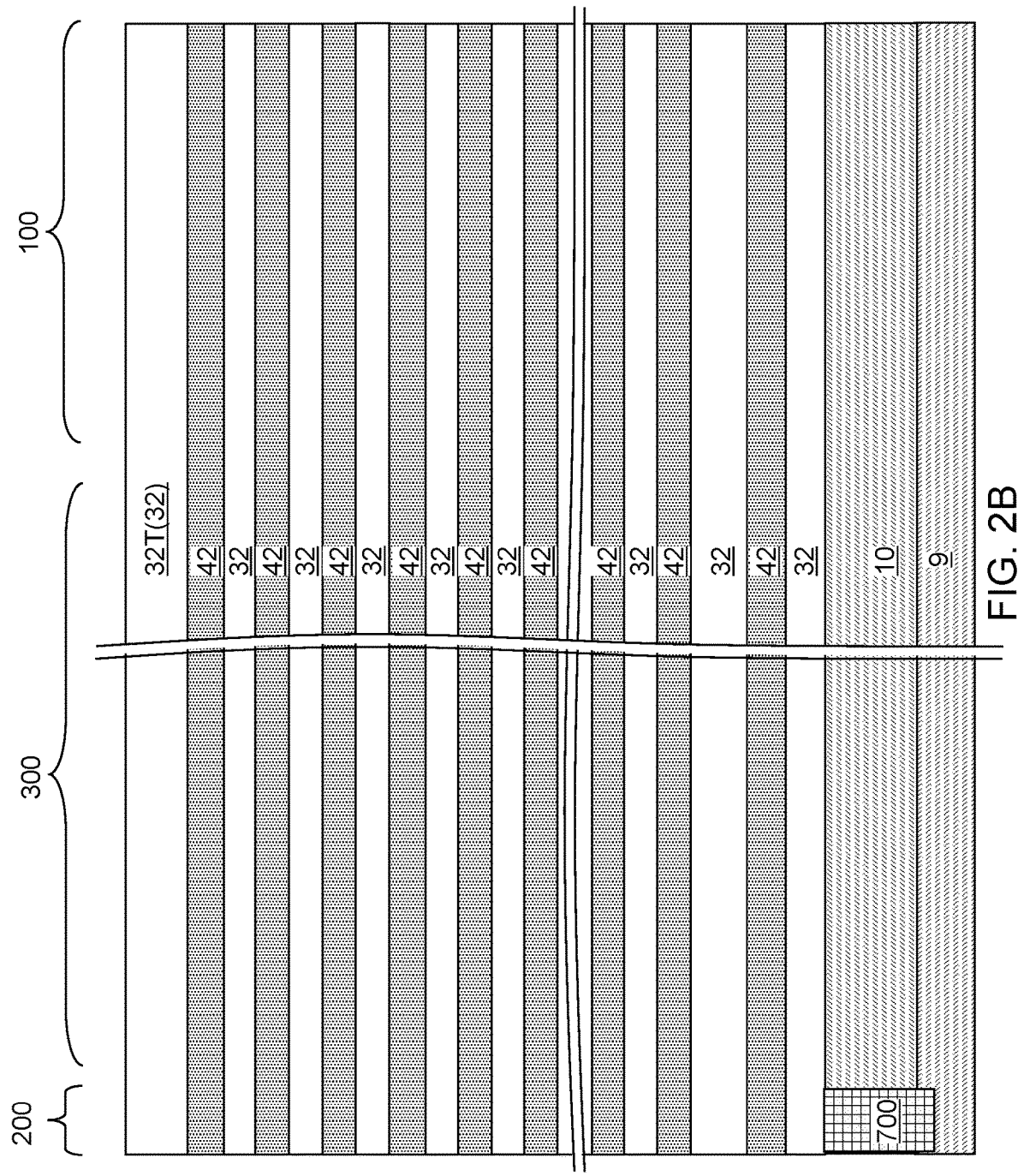
FIG. 2B is a schematic vertical cross-sectional view of an alternative configuration of the exemplary structure after formation of an alternating stack of insulating layers and silicon nitride sacrificial material layers according to an alternative embodiment of the present disclosure.

Referring to FIGS. 2A and 2B, a stack of an alternating plurality of insulating layers 32 and sacrificial material layers (41 or 42) can be formed over the top surface of the substrate (9, 10). Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The sacrificial material layers (41 or 42) comprise a sacrificial material that can be removed selective to the insulating material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. In one embodiment, the sacrificial material layers (41 or 42) may comprise semiconductor sacrificial material layers 41 as illustrated in FIG. 2A, or may comprise silicon nitride sacrificial material layers 42 as illustrated in FIG. 2B. In case the semiconductor sacrificial material layers 41 are employed, the semiconductor sacrificial material layers 41 may comprise amorphous silicon, polysilicon, a silicon-germanium alloy, or a compound semiconductor material.

The thicknesses of the insulating layers 32 and the sacrificial material layers (41 or 42) can be in a range from 20 nm to 50 nm, although lesser and greater thicknesses can be employed for each insulating layer 32 and for each sacrificial material layer (41 or 42). The number of repetitions of the pairs of an insulating layer 32 and a sacrificial material layer (41 or 42) can be in a range from 2 to 1,024, and typically from 8 to 256, although a greater number of repetitions can also be employed. In one embodiment, each sacrificial material layer (41 or 42) in the alternating stack {32, (41 or 42)} can have a uniform thickness that is substantially invariant within each respective sacrificial material layer (41 or 42).

The topmost layer of the alternating stack {32, (41 or 42)} may comprise a topmost insulating layer 32T. The topmost insulating layer 32T may have a greater thickness than the underlying insulating layers 32.

Figure 3:
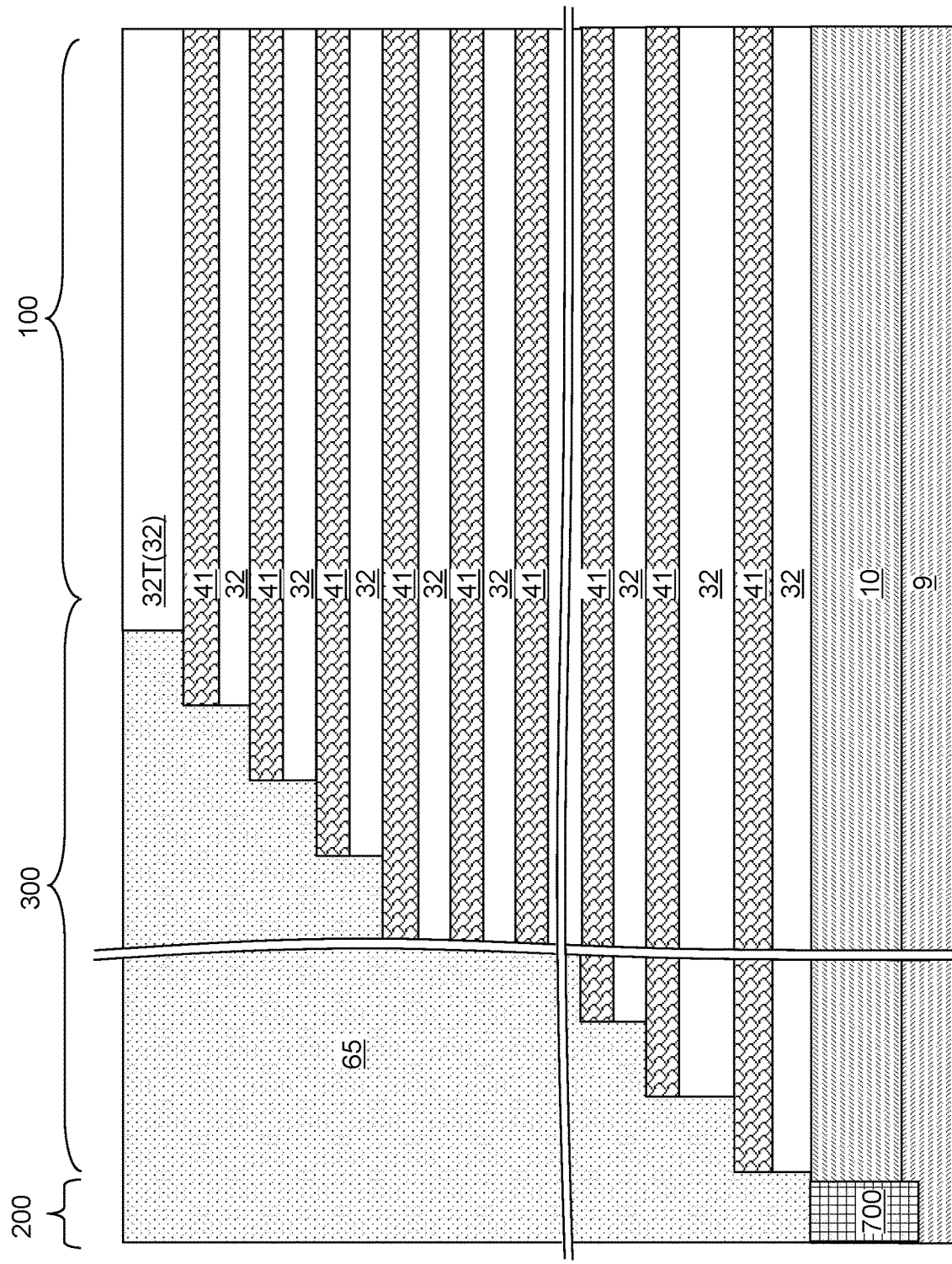
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack {32, (41 or 42)}, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack {32, (41 or 42)} are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer (41 or 42) other than a topmost sacrificial material layer (41 or 42) within the alternating stack {32, (41 or 42)} laterally extends farther than any overlying sacrificial material layer (41 or 42) within the alternating stack {32, (41 or 42)} in the terrace region. The terrace region includes stepped surfaces of the alternating stack {32, (41 or 42)} that continuously extend from a bottommost layer within the alternating stack {32, (41 or 42)} to a topmost layer within the alternating stack {32, (41 or 42)}.

Each vertical step of the stepped surfaces can have the height of one or more pairs of an insulating layer 32 and a sacrificial material layer. In one embodiment, each vertical step can have the height of a single pair of an insulating layer 32 and a sacrificial material layer (41 or 42). In another embodiment, multiple "columns" of staircases can be formed along a first horizontal direction hd1 such that each vertical step has the height of a plurality of pairs of an insulating layer 32 and a sacrificial material layer (41 or 42), and the number of columns can be at least the number of the plurality of pairs. Each column of staircase can be vertically offset among one another such that each of the sacrificial material layers (41 or 42) has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers (41 or 42) (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers (41 or 42) may also be employed. Each sacrificial material layer (41 or 42) has a greater lateral extent, at least along one direction, than any overlying sacrificial material layers (41 or 42) such that each physically exposed surface of any sacrificial material layer (41 or 42) does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the topmost insulating layer 32T and a subset of the sacrificial material layers (41 or 42) located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32T.

Figure 4B:
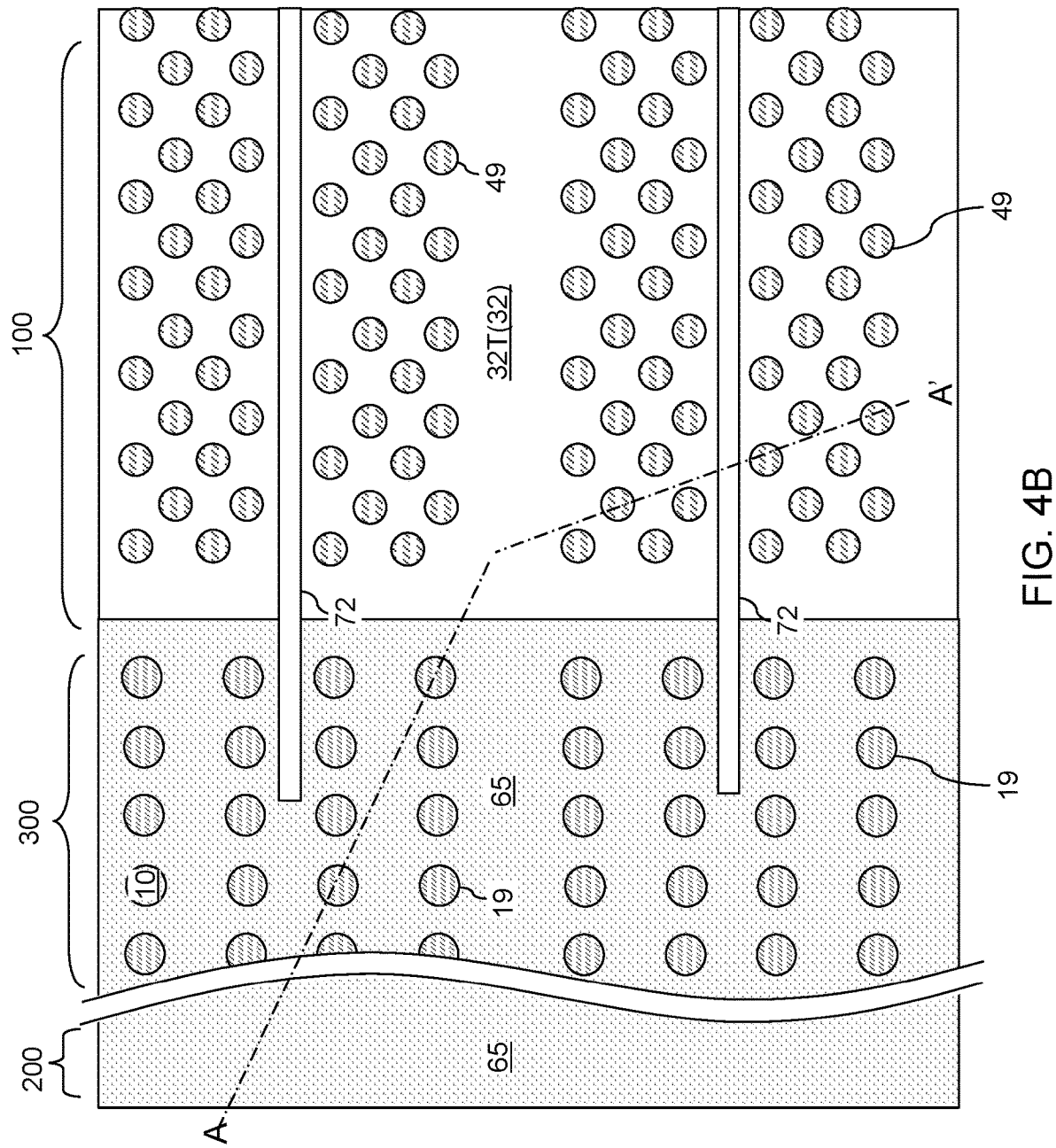
FIG. 4B is a top-down view of the exemplary structure of FIG. 4A. The vertical plane A-A' is the plane of the cross-section for FIG. 4A.

Referring to FIGS. 4A-4D, a lithographic material stack (not shown) including at least a photoresist layer can be formed over the topmost insulating layer 32T and the retro-stepped dielectric material portion 65, and can be lithographically patterned to form openings therein. FIGS. 4A-4C illustrate a configuration in which semiconductor sacrificial material layers 41 are employed, and FIG. 4D illustrates a configuration in which silicon nitride sacrificial material layers 42 are employed.

The openings include a first set of openings formed over the memory array region 100 and a second set of openings formed over the contact region 300. The pattern in the lithographic material stack can be transferred through the topmost insulating layer 32T or the retro-stepped dielectric material portion 65, and through the alternating stack {32, (41 or 42)} by at least one anisotropic etch that employs the patterned lithographic material stack as an etch mask. Portions of the alternating stack {32, (41 or 42)} underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack {32, (41 or 42)} in the memory array region 100. The support openings 19 are formed through the retro-stepped dielectric material portion 65 and the portion of the alternating stack {32, (41 or 42)} that underlie the stepped surfaces in the contact region 300.

The memory openings 49 extend through the entirety of the alternating stack {32, (41 or 42)}. The support openings 19 extend through a subset of layers within the alternating stack {32, (41 or 42)}. The chemistry of the anisotropic etch process employed to etch through the materials of the alternating stack {32, (41 or 42)} can alternate to optimize etching of the first and second materials in the alternating stack {32, (41 or 42)}. The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack {32, (41 or 42)} to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5G are sequential schematic vertical cross-sectional views of a memory opening 49 within the exemplary structure during formation of an in-process memory opening fill structure 58' in a first configuration according to a first embodiment of the present disclosure. The first configuration includes an alternating stack (32, 41) of insulating layers 32 and semiconductor sacrificial material layers 41.

Referring to FIG. 5A, an isotropic recess etch process can be performed to selectively recess physically exposed surfaces of the semiconductor sacrificial material layers 41 around each memory opening 49 and each support opening 19. Sidewalls of the semiconductor sacrificial material layers 41 can be laterally recessed relative to sidewalls of the insulating layers 32 around each memory opening 49 and around each support opening 19, such that lateral recesses 49R are formed at the levels of the semiconductor sacrificial material layers 41. For example, if semiconductor sacrificial material layers 41 comprise silicon layers (e.g., polysilicon layers), then a wet etch process employing hot trimethyl-2 hydroxyethyl ammonium hydroxide ("hot TMY") or tetramethyl ammonium hydroxide (TMAH) may be performed to laterally recess the physically exposed sidewalls of the semiconductor sacrificial material layers 41. The lateral recess distance of the isotropic etch process may be in a range from 2 nm to 30 nm, such as from 6 nm to 15 nm, although lesser and greater lateral recess distances may also be employed.

Referring to FIG. 5B, a metal that can form a metal-semiconductor alloy with the semiconductor material of the semiconductor sacrificial material layers 41 can be deposited in the lateral recesses. In one embodiment, the metal is selectively deposited in the lateral recesses 49R by a selective metal deposition process. In a selective metal deposition process, a metal, such as tungsten or ruthenium, is selectively deposited on silicon sacrificial material layers 41 by CVD or ALD without substantial deposition on silicon oxide insulating layer 32 surfaces. A metal portion 347 can be formed within each annular lateral recess 49R around the memory opening 49. The inner cylindrical sidewalls of the metal portions 347 can be vertically coincident with sidewalls of the insulating layers 32 around the memory opening 49.

In another embodiment, the metal is conformally deposited in each of the memory openings 49 and the support openings 19 to form a metal layer which fills the lateral recesses 49R. In an illustrative example, if the semiconductor sacrificial material layers 41 comprise silicon, then the metal layer may comprise a metal that can form a metal silicide upon reaction with silicon. Metals that can form a metal silicide include, but are not limited to, W, Ti, Co, Mo, Pt, or Ni. In one embodiment, the thickness of the metal layer may be selected such that volumes of the lateral recesses 49R around the memory openings 49 and the support openings 19 are filled with the metal layer. An anisotropic etch process can be performed to remove portions of the metal layer that are not masked by an overlying portion of the insulating layers 32. The metal portion 347 can be formed within each annular lateral recess 49R around the memory opening 49. The inner cylindrical sidewalls of the metal portions 347 can be vertically coincident with sidewalls of the insulating layers 32 around the memory opening 49.

Referring to FIG. 5C, an anneal process can be performed to induce formation of a metal-semiconductor alloy between the conformally deposited metal and the semiconductor material of the semiconductor sacrificial material layers 41. Metal-semiconductor alloy portions 47 are formed by reaction of surface portions of the semiconductor sacrificial material layers 41 and portions 347 of the metal layer located in the lateral recesses 49R and that are proximal to the semiconductor sacrificial material layers 41. The metal-semiconductor alloy portions 47 are subsequently employed as memory elements (e.g., metal silicide floating gates) 53. A vertical stack of memory elements 53 is formed within the lateral recesses 49R within each memory opening 49. Optionally, an anisotropic etch process may be performed to remove portions of the metal-semiconductor alloy portions 47 that protrude out of the lateral recesses 49R in a direction inward from a cylindrical vertical plane including sidewalls of the insulating layers 32 around each memory opening 49. In this case, the inner sidewalls of the metal-semiconductor alloy portions 47 may be vertically coincident with sidewalls of the insulating layers 32.

Referring to FIG. 5D, a tunneling dielectric layer 56 and an optional sacrificial cover material layer 601 may be deposited over the vertical stack of memory elements 53 over the physically exposed surface of the semiconductor material layer 10. The tunneling dielectric layer 56 includes a dielectric material through which charge tunneling can be performed under suitable electrical bias conditions. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the tunneling dielectric layer 56. In one embodiment, the sacrificial cover material layer 601 may include a semiconductor material, such as amorphous silicon, or may include a carbon-based material, such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' may be present within the volume of each memory opening 49 that is not filled with the deposited material layers (56, 601).

Referring to FIG. 5E, an anisotropic etch process may be performed to remove horizontally-extending portions of the optional sacrificial cover material layer 601 and the tunneling dielectric layer 56. Remaining portions of the sacrificial cover material layer 601, if employed, may be subsequently removed selective to the material of the tunneling dielectric layer 56. Alternatively, if the sacrificial cover material layer 601 comprises silicon, then it may be retained to form a part of a semiconductor channel.

Referring to FIG. 5F, a semiconductor channel layer 60L can be deposited directly on the tunneling dielectric layer 56. The semiconductor channel layer 60L directly contacts the semiconductor material layer 10.

The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

In case the memory cavity 49' in each memory opening is not completely filled by the semiconductor channel layer 60L, a dielectric core layer can be deposited in the memory cavity 49' to fill any remaining portion of the memory cavity 49' within each memory opening 49. The dielectric core layer includes a dielectric fill material such as silicon oxide or organosilicate glass. The dielectric core layer can be deposited by a conformal deposition method such as low pressure chemical vapor deposition (LPCVD), or by a self-planarizing deposition process such as spin coating.

A recess etch process can be performed to vertically recess the dielectric core layer. The horizontal portion of the dielectric core layer that overlie the topmost insulating layer 32T can be removed. The dielectric fill material of the dielectric core layer can be further recessed such that each remaining portions of the dielectric core layer is located within a respective memory opening 49 and has a respective top surface below the horizontal plane including the top surface of the topmost insulating layer 32T. Each remaining portion of the dielectric core layer constitutes a dielectric core 62.

Referring to FIG. 5G, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the tunneling dielectric layer 56.

The combination of all material portions that are formed in a memory opening 49 constitutes an in-process memory opening fill structure 58'. The in-process memory opening fill structure 58' comprises a vertical stack of discrete charge storage elements (e.g., silicide floating gates) 53 located at levels of the semiconductor sacrificial material layers 41, a tunneling dielectric layer 56, a vertical semiconductor channel 60, an optional dielectric core 62 and a drain region 63. The vertical stack of discrete charge storage elements 53 comprises discrete portions of a metal-semiconductor alloy (e.g., metal silicide) 47 of the semiconductor element (such as silicon) in the semiconductor sacrificial material layers 41 and a metal. The metal-semiconductor alloy portions 47 which function as the discrete charge storage elements 53 are formed at levels of the semiconductor sacrificial material layers 41, and are vertically spaced apart from each other by the insulating layers 32. In the first configuration illustrated in FIG. 5G, the sacrificial layers comprise semiconductor sacrificial material layers 41, and the vertical stack of discrete charge storage elements 53 in each memory opening 49 is formed by metallization of surface portions of the semiconductor sacrificial material layers 41 around the memory opening 49.

FIGS. 6A-6D are sequential schematic vertical cross-sectional views of a memory opening 49 within the exemplary structure during an alternative processing sequence for formation of an in-process memory opening fill structure 58' in the first configuration according to a second embodiment of the present disclosure.

Figure 6A:
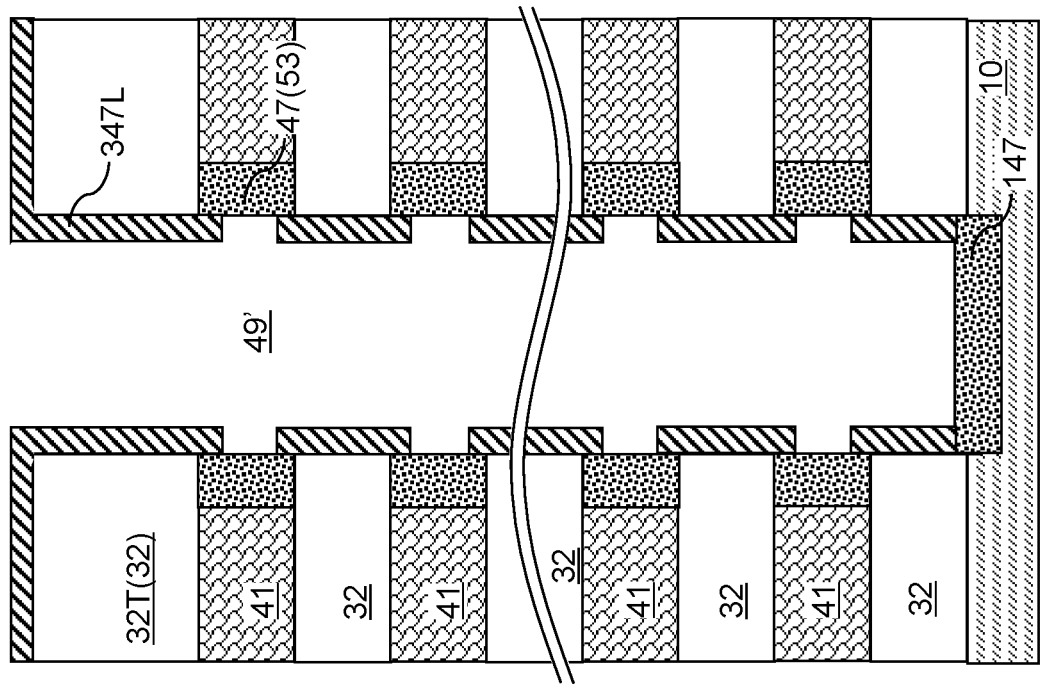
FIGS. 6A-6D are sequential schematic vertical cross-sectional views of a memory opening within the exemplary structure during an alternative processing sequence for formation of an in-process memory opening fill structure in the first configuration according to an embodiment of the present disclosure.

Referring to FIG. 6A, an alternative embodiment of the first configuration of the exemplary structure can be derived from the first configuration of the exemplary structure illustrated in FIG. 5A by conformally depositing a metal layer 347L in the memory openings 49 and the support openings 19. The metal layer 347L comprise, and/or consists essentially of a metal that can form a metal-semiconductor alloy with the semiconductor material of the semiconductor sacrificial material layers 41. In an illustrative example, if the semiconductor sacrificial material layers 41 comprise silicon, the metal layer 347L may comprise a metal that can form a metal silicide upon reaction with silicon. Metals that can form a metal silicide include, but are not limited to, W, Ti, Co, Mo, Pt, and Ni. In one embodiment, the thickness of the metal layer 347L may be selected such that volumes of the lateral recesses 49R around the memory openings 49 and the support openings 19 are filled with the metal layer 347L.

Figure 6B:
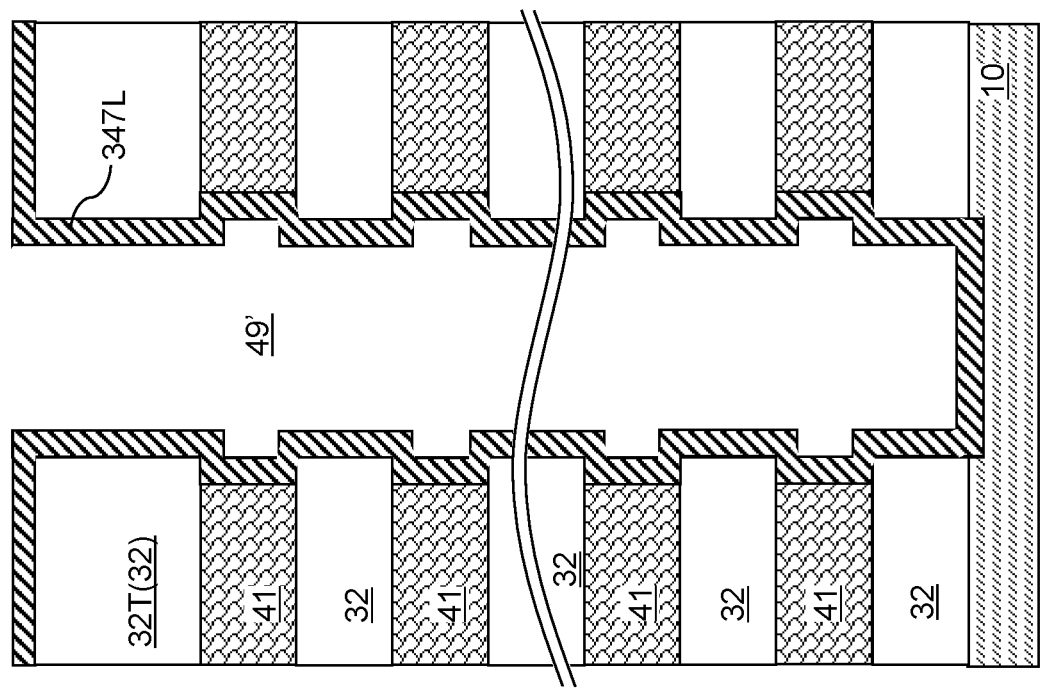

Referring to FIG. 6B, an anneal process can be performed to induce formation of a metal-semiconductor alloy between the conformally deposited metal and the semiconductor material of the semiconductor sacrificial material layers 41. Metal-semiconductor alloy portions 47 are formed by reaction of surface portions of the semiconductor sacrificial material layers 41 and portions of the metal layer 347L that are proximal to the semiconductor sacrificial material layers 41. The metal-semiconductor alloy portions 47 are subsequently employed as memory elements (e.g., metal silicide floating gates) 53. A vertical stack of memory elements 53 is formed within each memory opening 49. A planar metal-semiconductor alloy portion 147 can be formed by reaction of a portion of the metal layer 347L and a surface portion of the semiconductor material layer 10.

Figure 6D:
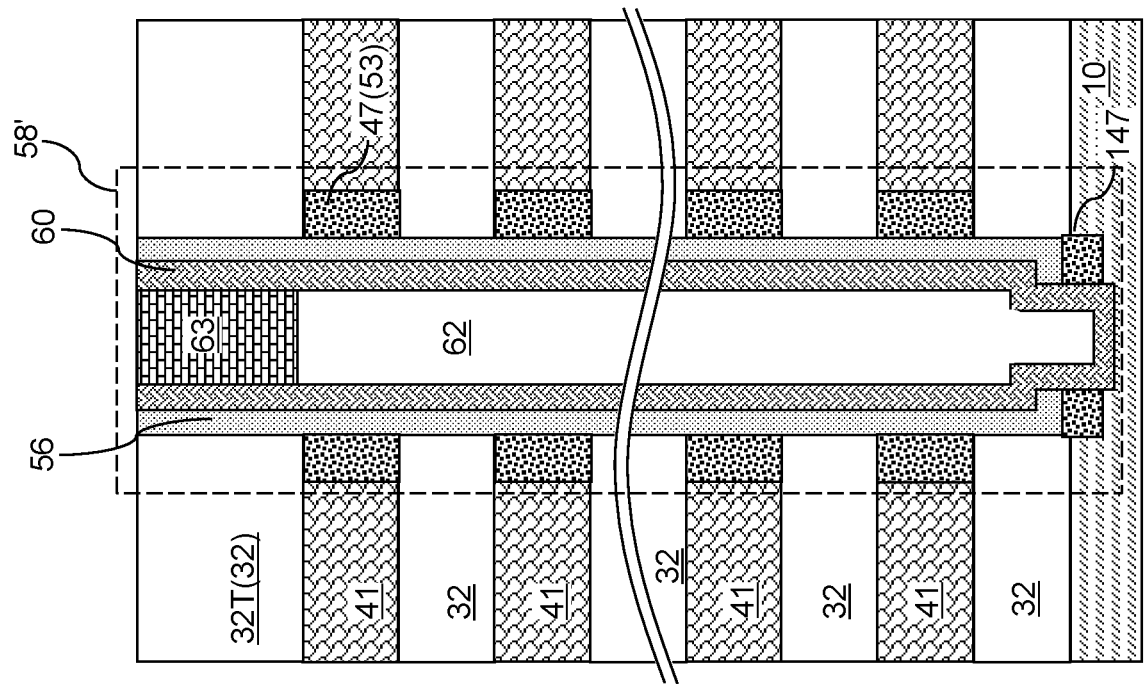
Figure 6C:
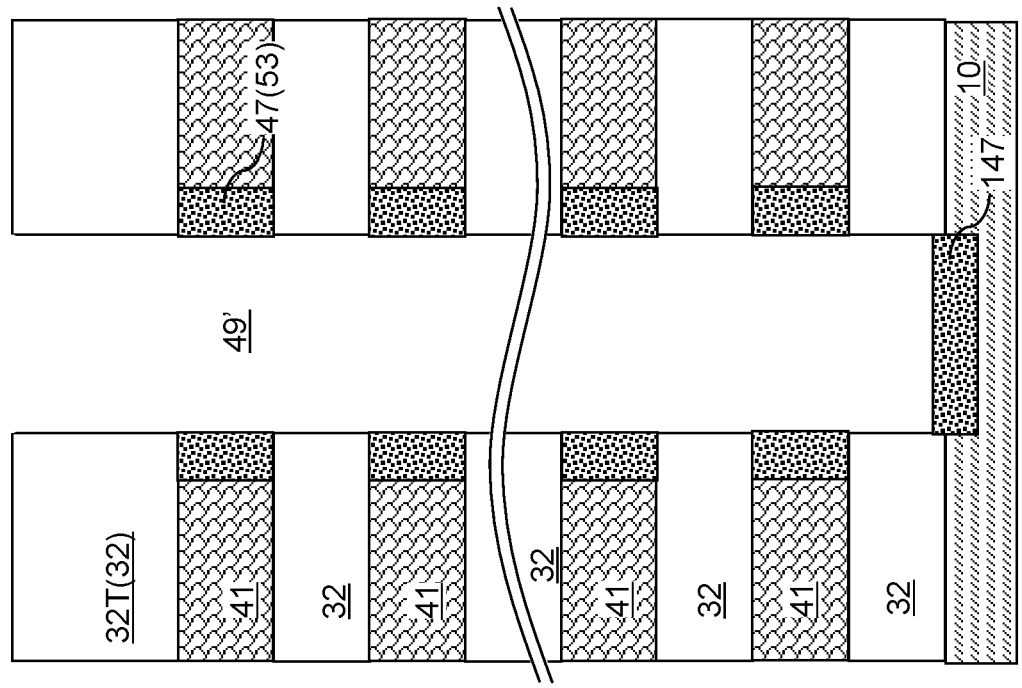

Referring to FIG. 6C, unreacted portions of the metal layer 347L can be removed selective to the metal-semiconductor alloy portions 47, the planar metal semiconductor alloy portion 147, and the insulating layers 32. Optionally, an anisotropic etch process may be performed to remove portions of the metal-semiconductor alloy portions 47 that protrude inward from a cylindrical vertical plane including sidewalls of the insulating layers 32 around each memory opening 49. In this case, the inner sidewalls of the metal-semiconductor alloy portions 47 may be vertically coincident with sidewalls of the insulating layers 32. In this case, the planar metal semiconductor alloy portion 147 can be collaterally removed. Generally, a planar metal semiconductor alloy portion 147 may or may not be present at a bottom portion of each memory opening 49, of which an unfilled volume is herein referred to as a memory cavity 49'.

Referring to FIG. 6D, the processing steps described with reference to FIGS. 5D, 5E, 5F, and 5G can be subsequently performed. Specifically, a tunneling dielectric layer 56 and an optional sacrificial cover material layer 601 may be deposited over the vertical stack of memory elements 53 and over the optional planar metal semiconductor alloy portion 147. An anisotropic etch process may be performed to remove horizontally-extending portions of the optional sacrificial cover material layer 601 and the tunneling dielectric layer 56. If a planar metal semiconductor alloy portion 147 is present at the bottom of each memory opening 49, a center portion of the planar metal semiconductor alloy portion 147 may or may not be etched through by the anisotropic etch process. Remaining portions of the sacrificial cover material layer 601, if employed, may be subsequently removed selective to the material of the tunneling dielectric layer 56.

A semiconductor channel layer 60L can be deposited directly on the tunneling dielectric layer 56. In case a planar metal-semiconductor alloy portion 147 is present in each memory opening 49, the semiconductor channel layer 60L contacts the planar metal-semiconductor alloy portion 147. The semiconductor channel layer 60L may or may not directly contact the semiconductor material layer 10. In case the memory cavity 49' in each memory opening is not completely filled by the semiconductor channel layer 60L, a dielectric core 62 may be formed within each memory opening 49. A drain region 63 and a vertical semiconductor channel 60 can be formed within each memory opening 49.

The combination of all material portions that are formed in a memory opening 49 (as expanded at the processing steps of FIGS. 5A, 6A, and 6B through laterally recessing of the semiconductor sacrificial material layers 41 and metallization) constitutes an in-process memory opening fill structure 58'. The in-process memory opening fill structure 58' comprises a vertical stack of discrete charge storage elements 53 located at levels of the semiconductor sacrificial material layers 41, a tunneling dielectric layer 56, a vertical semiconductor channel 60, a drain region 63 and may optionally comprise a planar metal-semiconductor alloy portion 147 and a dielectric core 62. The vertical stack of discrete charge storage elements 53 comprises discrete portions of a metal-semiconductor alloy (e.g., metal silicide) of the semiconductor element (such as silicon) in the semiconductor sacrificial material layers 41 and a metal. The metal-semiconductor alloy portions 47 which function as the discrete charge storage elements 53 are formed at levels of the semiconductor sacrificial material layers 41, and are vertically spaced apart from each other by the insulating layers 32.

FIGS. 7A-7F are sequential schematic vertical cross-sectional views of a memory opening 49 within the exemplary structure during formation of a memory opening fill structure 58 in a second configuration according to a second embodiment of the present disclosure.

Referring to FIG. 7A, a memory opening 49 in a second configuration of the exemplary structure is illustrated at the processing steps of FIGS. 4A-4C.

Referring to FIG. 7B, the end portions of the semiconductor sacrificial material layers 41 which are exposed in the memory opening 49 are nitrided in a nitrogen containing ambient. The nitridation may comprise thermal or plasma nitridation. The nitrogen containing ambient may comprise nitrogen, ammonia or any other suitable nitrogen containing ambient. For silicon semiconductor sacrificial material layers 41, the nitridation forms silicon-rich silicon nitride charge storage material portions 57 on end portions of the semiconductor sacrificial material layers 41. The silicon-rich silicon nitride charge storage material portions 57 may have a silicon to nitrogen ratio of greater than 3:4, such as 3.2 to 4.5:4. The silicon-rich silicon nitride charge storage material portions 57 are discrete charge storage elements 53. A vertical stack of discrete charge storage elements 53 is formed within each memory opening 49. The charge storage material portions 57 may have inner cylindrical sidewalls that are vertically coincident with sidewalls of the insulating layers 32 around a respective memory opening 49. The vertical stack of discrete charge storage elements 53 can be located at levels of the semiconductor sacrificial material layers 41.

Figure 7C:
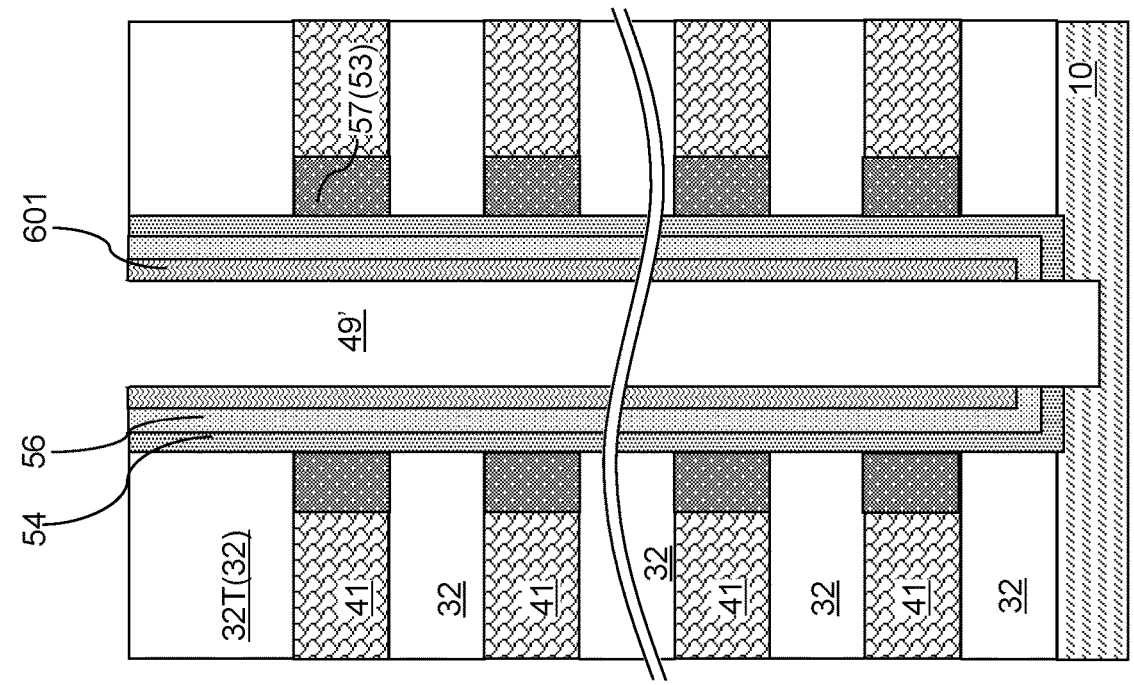

Referring to FIG. 7C, a continuous charge storage material layer 54, a tunneling dielectric layer 56, and an optional sacrificial cover material layer 601 can be sequentially deposited in the memory openings 49 and the support openings 19. The thickness of the continuous charge storage material layer 54 may be in a range from 1 nm to 10 nm, such as from 2 nm to 5 nm, although lesser and greater thicknesses may also be employed.

The continuous charge storage material layer 54 can be formed directly on the vertical stack of discrete charge storage elements 53. In one embodiment, the vertical stack of discrete charge storage elements 53 comprises a silicon-rich silicon nitride material, and the continuous charge storage material layer 54 comprises a nitrogen-rich or stoichiometric silicon nitride material. The nitrogen-rich silicon nitride material may have a silicon to nitrogen ratio of less than 3:4, such as 1.5 to 2.8:4. The stoichiometric silicon nitride material may have a silicon to nitrogen ratio of 3:4.

The continuous charge storage material layer 54 can vertically extend through a plurality of semiconductor sacrificial material layers 41 (which may be all of the semiconductor sacrificial material layers 41), and may have a uniform thickness throughout. The vertical stack of discrete charge storage elements 53 is located at levels of the semiconductor sacrificial material layers 41, and contacts a respective surface segment of an outer sidewall of the continuous charge storage material layer 54.

In one embodiment, the outer sidewall of the continuous charge storage material layer 54 vertically extends straight through the plurality of semiconductor sacrificial material layers 41 (such as all of the semiconductor sacrificial material layers 41), and interfaces between the insulating layers 32 and the outer sidewall of the continuous charge storage material layer 54 are vertically coincident with interfaces between the vertical stack of discrete charge storage elements 53 and the surface segments of the outer sidewall of the continuous charge storage material layer 54.

The tunneling dielectric layer 56 and the optional sacrificial cover material layer 601 can have the same material composition as in the first configuration described with reference to FIG. 5D, and may be formed employing the same set of processing steps as the processing steps described with reference to FIG. 5D.

Figure 7D:
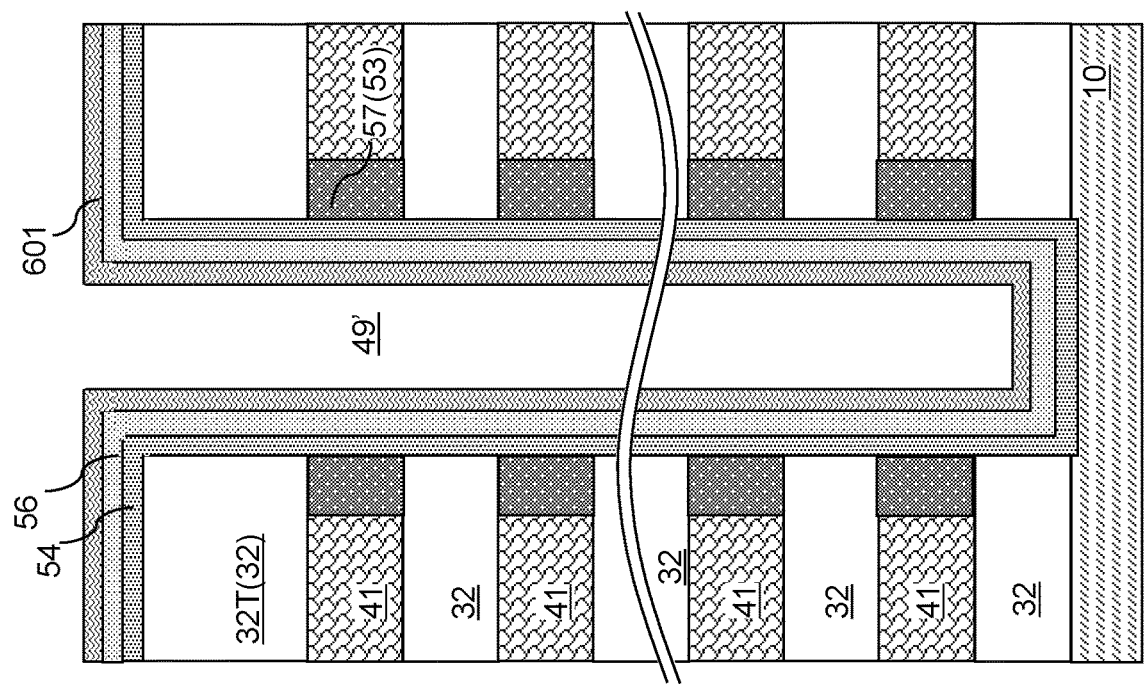

Referring to FIG. 7D, an anisotropic etch process may be performed to remove horizontally-extending portions of the optional sacrificial cover material layer 601, the tunneling dielectric layer 56, and the continuous charge storage material layer 54. The optional sacrificial cover material layer 601 can be subsequently removed selective to the material of the tunneling dielectric layer 56.

Referring to FIG. 7E, the processing steps described with reference to FIG. 5F can be performed to form a semiconductor channel layer 60L and dielectric cores 62.

Referring to FIG. 7F, the processing steps described with reference to FIG. 5G can be performed to form a drain region 63 and a vertical semiconductor channel 60 within each memory opening 49 and within each support opening 19.

The combination of all material portions that are formed in a memory opening 49 constitutes an in-process memory opening fill structure 58'. The in-process memory opening fill structure 58' comprises a vertical stack of discrete charge storage elements 53 located at levels of the semiconductor sacrificial material layers 41, a continuous charge storage material layer 54, a tunneling dielectric layer 56, and a vertical semiconductor channel 60.

FIGS. 8A-8E are sequential schematic vertical cross-sectional views of a memory opening 49 within the exemplary structure during formation of a memory opening fill structure 58 in a third configuration according to an embodiment of the present disclosure.

Referring to FIG. 8A, a third configuration of the exemplary structure is illustrated, which may be the same as the first configuration of the exemplary structure illustrated in FIG. 5C, or an alternative embodiment of the first configuration of the exemplary structure illustrated in FIG. 6C. As such, a planar metal-semiconductor alloy portion 147 may, or may not, be present in the third configuration of the exemplary structure.

Referring to FIG. 8B, the processing steps described with reference to FIG. 7C may be performed to form a continuous charge storage material layer 54, a tunneling dielectric layer 56, and an optional sacrificial cover material layer 601.

Figure 8C:
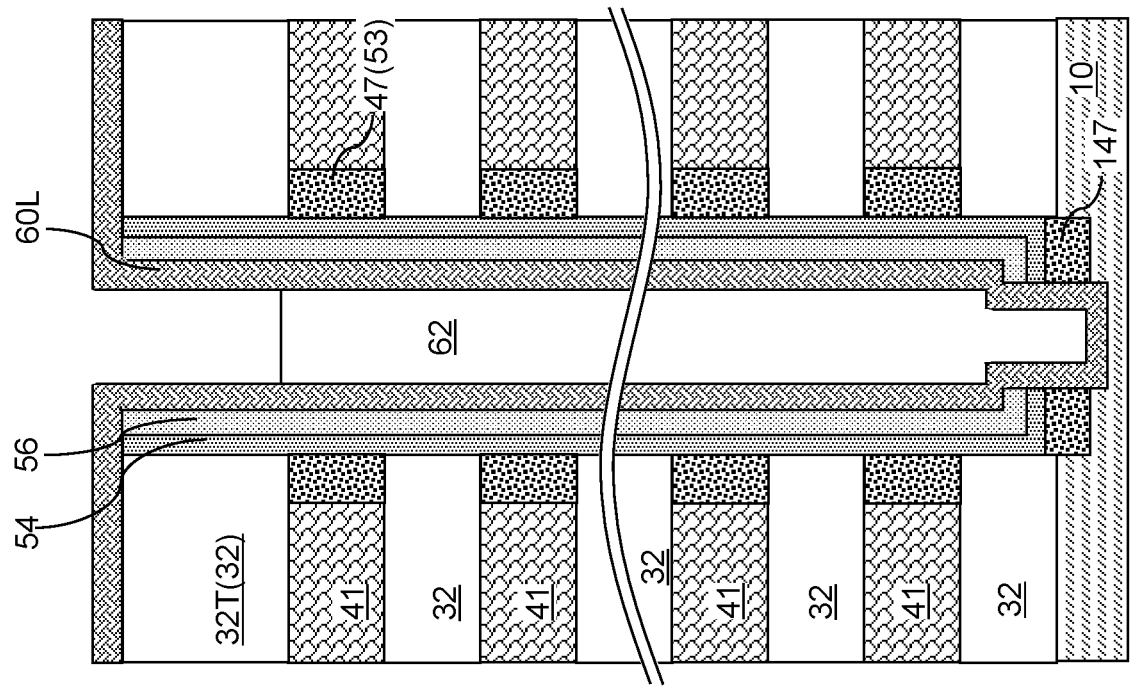

Referring to FIG. 8C, the processing steps described with reference to FIG. 7D may be performed. Specifically, an anisotropic etch process may be performed to remove horizontally-extending portions of the continuous charge storage material layer 54, a tunneling dielectric layer 56, and an optional sacrificial cover material layer 601. If a planar metal-semiconductor alloy portion 147 is present between the semiconductor material layer 10 and the continuous charge storage material layer 54, a center portion of the planar metal-semiconductor alloy portion 147 can be etched through.

Figure 8D:
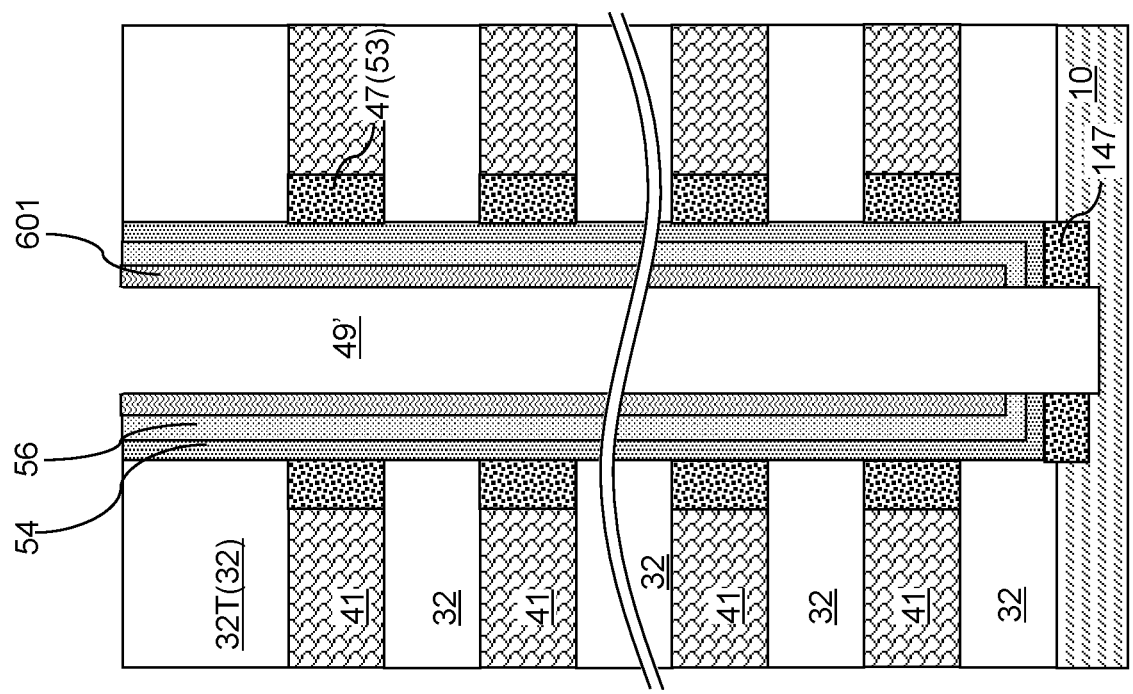

Referring to FIG. 8D, the processing steps described with reference to FIG. 5F can be performed to form a semiconductor channel layer 60L and dielectric cores 62.

Figure 8E:
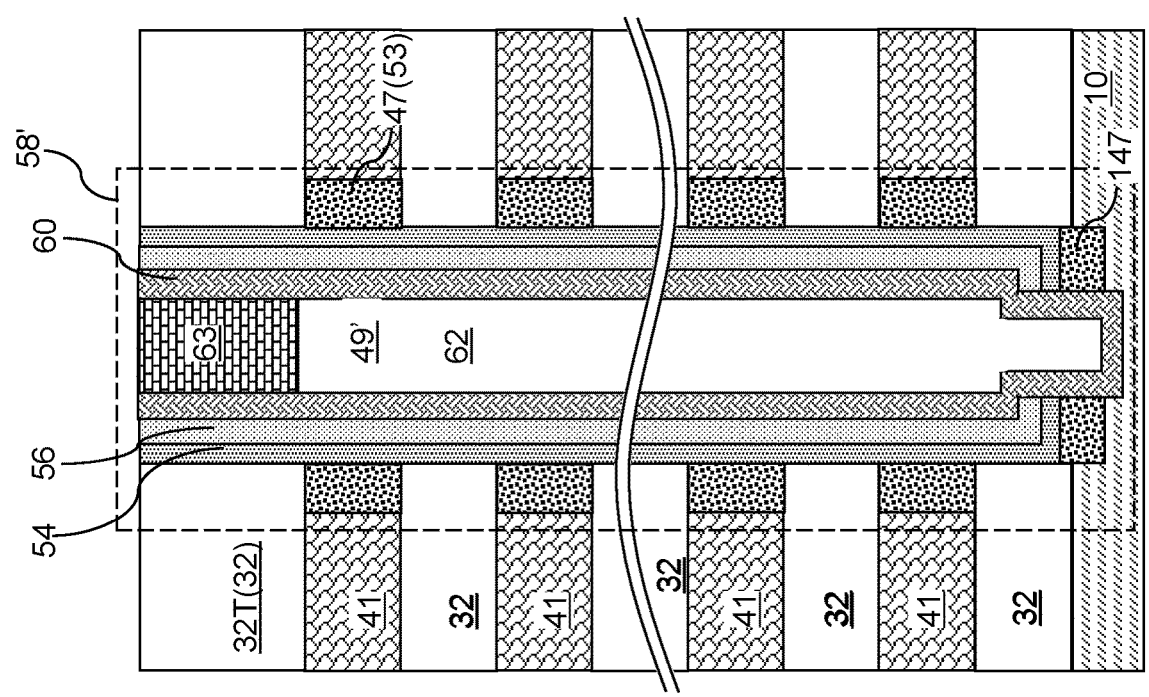

Referring to FIG. 8E, the processing steps described with reference to FIG. 5G can be performed to form a drain region 63 and a vertical semiconductor channel 60 within each memory opening 49 and within each support opening 19.

The combination of all material portions that are formed in a memory opening 49 constitutes an in-process memory opening fill structure 58'. The in-process memory opening fill structure 58' comprises a vertical stack of discrete charge storage elements 53 located at levels of the semiconductor sacrificial material layers 41, a continuous charge storage material layer 54, a tunneling dielectric layer 56, and a vertical semiconductor channel 60, and may comprise a planar metal-semiconductor alloy portion 147. The vertical stack of discrete charge storage elements 53 comprises metal-semiconductor alloy portions (e.g., metal silicide portions) 47. The metal-semiconductor alloy portions 47 comprises the discrete charge storage elements 53 that are formed at levels of the semiconductor sacrificial material layers 41, and are vertically spaced apart from each other by the insulating layers 32. In the third configuration illustrated in FIG. 8E, the semiconductor sacrificial material layers 41 comprise a semiconductor material, and the vertical stack of discrete charge storage elements 53 in each memory opening 49 is formed by metallization of surface portions of the semiconductor sacrificial material layers 41 and reacting the metal and the semiconductor.

A continuous charge storage material layer 54 vertically extends through a plurality of semiconductor sacrificial material layers 41 (which may be all of the semiconductor sacrificial material layers 41), and has a uniform thickness throughout. A vertical stack of discrete charge storage elements 53 is located at levels of the semiconductor sacrificial material layers 41, and contacts a respective surface segment of an outer sidewall of the continuous charge storage material layer 54. In one embodiment, the outer sidewall of the continuous charge storage material layer 54 vertically extends straight through the plurality of semiconductor sacrificial material layers 41. Interfaces between the insulating layers 32 and the outer sidewall of the continuous charge storage material layer 54 are vertically coincident with interfaces between the vertical stack of discrete charge storage elements 53 and the surface segments of the outer sidewall of the continuous charge storage material layer 54. In one embodiment, the vertical stack of discrete charge storage elements 53 consists essentially of a metal-semiconductor alloy of a semiconductor element and a metal, which may be a metal silicide material. A planar metal-semiconductor alloy portion 147 may be in contact with a bottom surface of the continuous charge storage material layer 54 and a semiconductor material layer in the substrate (9, 10).

FIGS. 9A-9H are sequential schematic vertical cross-sectional views of a region around a memory opening 49 in the exemplary structure during formation of a memory opening fill structure 58 in a fourth configuration according to an alternative embodiment of the present disclosure.

Figure 9B:
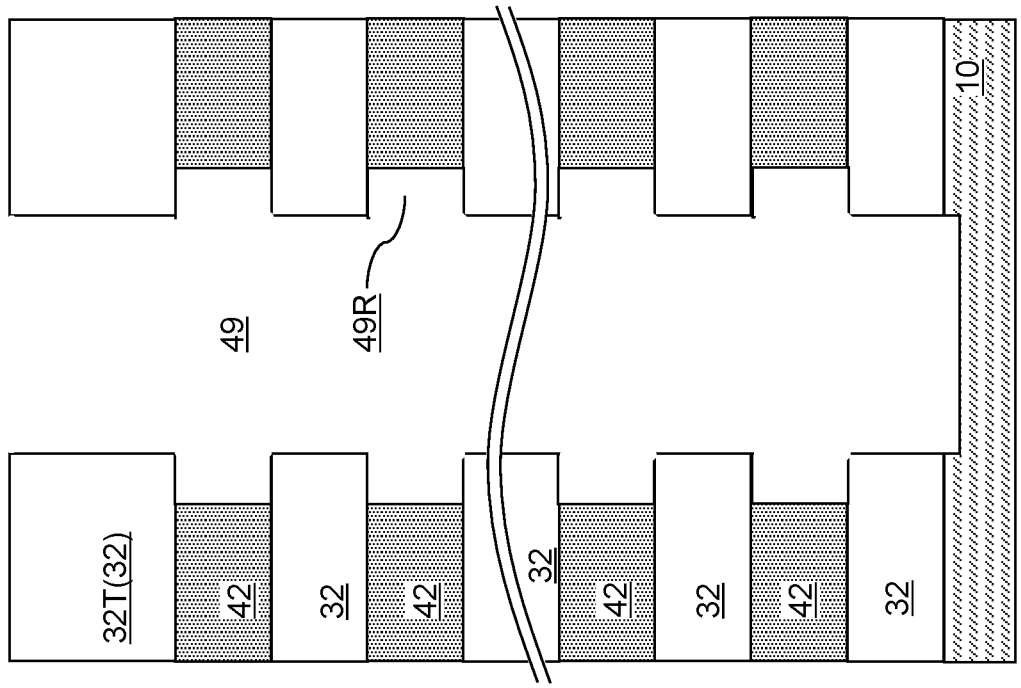
Figure 9A:
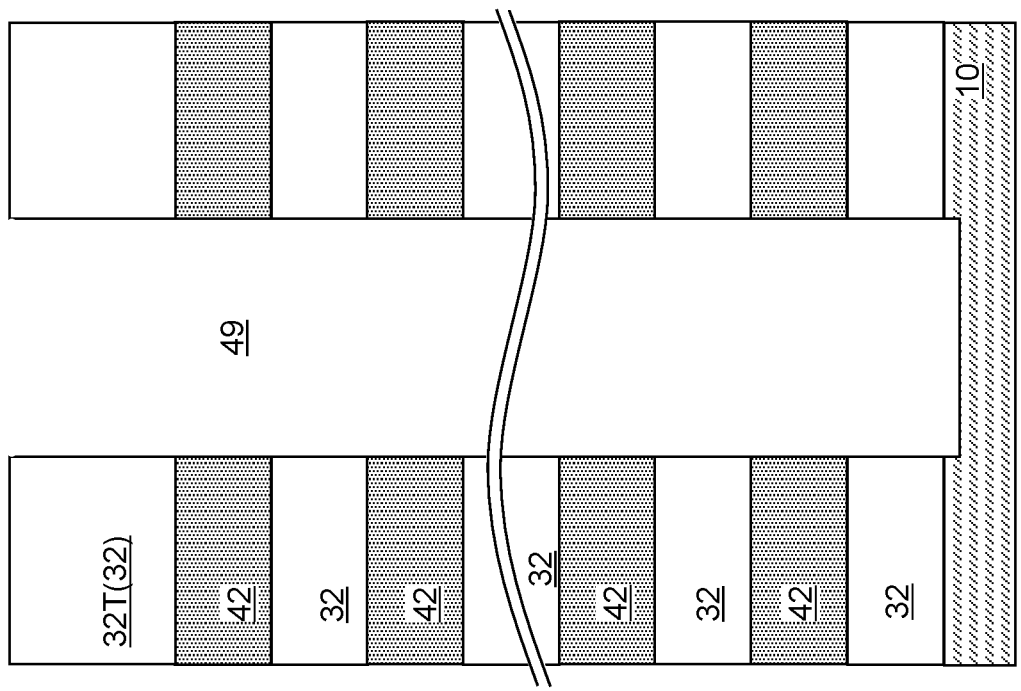

Referring to FIG. 9A, the fourth configuration of the exemplary structure is illustrated at a processing step that corresponds to the processing step described with reference to FIG. 4D. In this configuration, the insulating layers 32 are vertically interlaced with silicon nitride sacrificial material layers 42 in an alternating stack (32, 42).

Referring to FIG. 9B, an isotropic recess etch process can be performed to form the lateral recesses 49R by selectively recessing physically exposed surfaces of the silicon nitride sacrificial material layers 42 around each memory opening 49 and each support opening 19. Sidewalls of the silicon nitride sacrificial material layers 42 can be laterally recessed relative to sidewalls of the insulating layers 32 around each memory opening 49 and around each support opening 19. For example, a timed wet etch process employing phosphoric acid may be performed to isotropically recess the silicon nitride sacrificial material layers 42 selective to the insulating layers 32. The lateral recess distance of the isotropic etch process may be in a range from 5 nm to 50 nm, such as from 10 nm to 25 nm, although lesser and greater lateral recess distances may also be employed.

Referring to FIG. 9C, a semiconductor material layer can be conformally deposited in each of the memory openings 49 and the support openings 19 to form a semiconductor material layer 253L. The semiconductor material layer 253L may comprise amorphous silicon, polysilicon, a silicon-germanium alloy, or a compound semiconductor material that forms a dielectric oxide upon oxidation. In one embodiment, the thickness of the semiconductor material layer 253L may be selected such that volumes of the lateral recesses 49R around the memory openings 49 and the support openings 19 are filled with the semiconductor material layer 253L.

In one embodiment, the semiconductor material of the semiconductor material layer 253L consists essentially of undoped polysilicon or doped polysilicon. In one embodiment, the semiconductor material of the semiconductor material layer 253L comprises an electrical dopant that is a p-type dopant or an n-type dopant.

Referring to FIG. 9D, an anisotropic etch process can be performed to remove portions of the semiconductor material layer 253L that are not masked by an overlying portion of the insulating layers 32. A semiconductor material portion (e.g., a polysilicon floating gate) 253 can be formed within each volume of the lateral recesses 49R formed at the processing steps of FIG. 9B. The semiconductor material portions 253 are subsequently employed as memory elements 53. A vertical stack of memory elements 53 is formed within each memory opening 49. In one embodiment, the inner sidewalls of the semiconductor material portions 253 may be vertically coincident with sidewalls of the insulating layers 32.

Figure 9E:
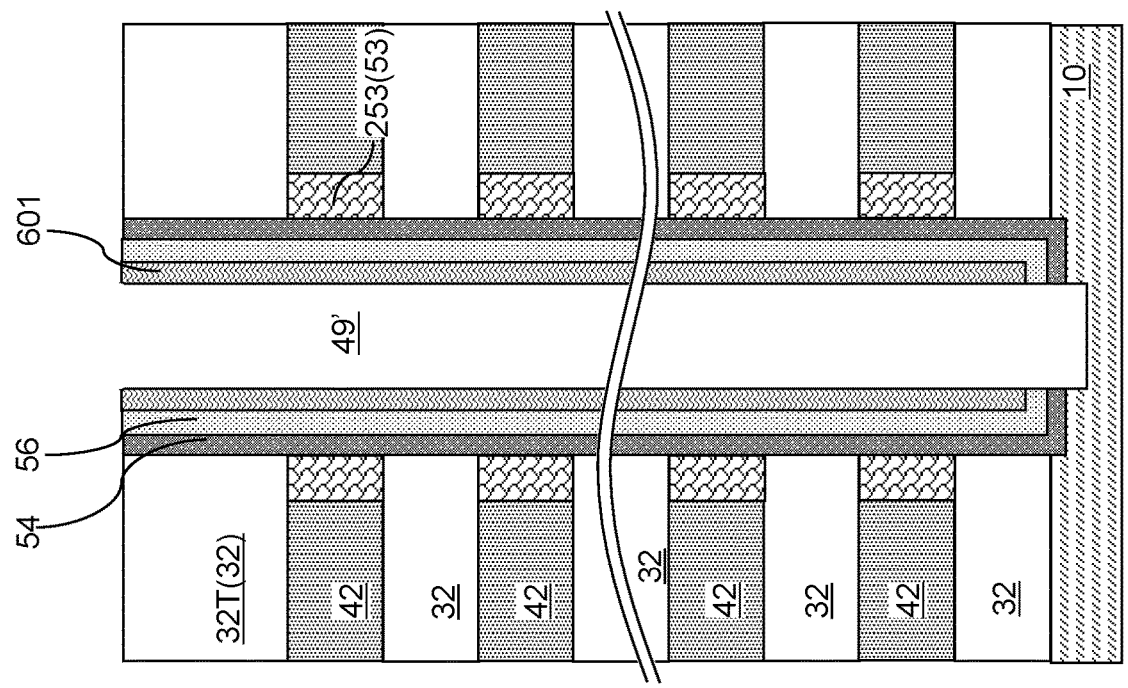

Referring to FIG. 9E, the processing steps described with reference to FIG. 7C may be performed to form a continuous charge storage material layer 54, a tunneling dielectric layer 56, and an optional sacrificial cover material layer 601.

Figure 9F:
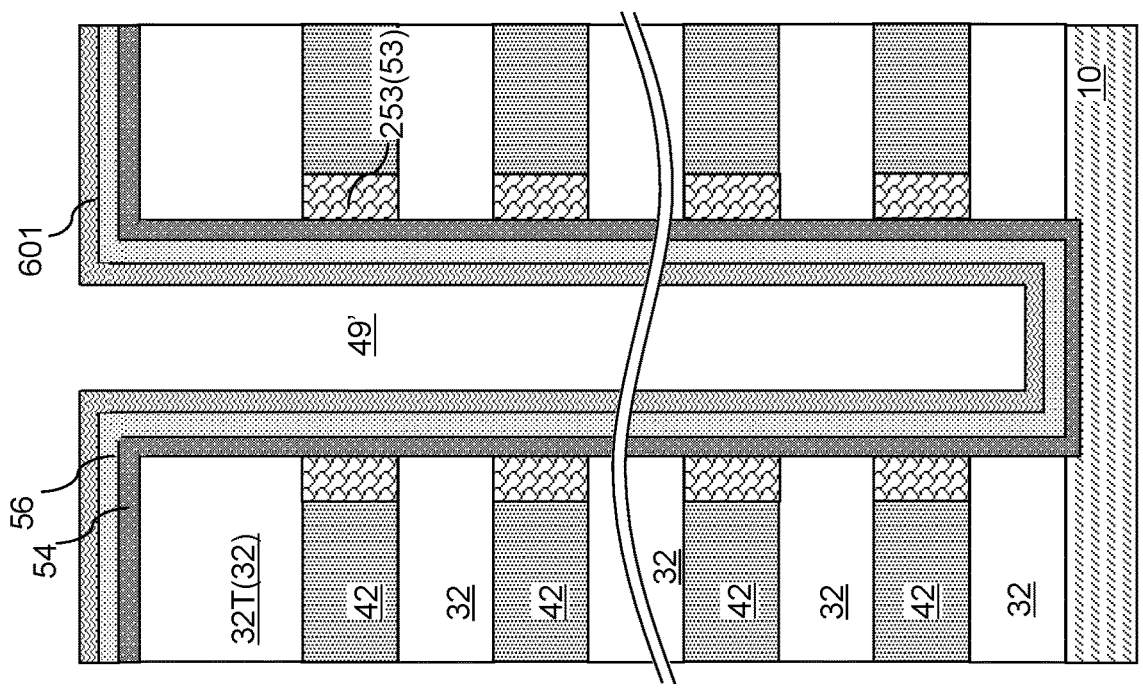

Referring to FIG. 9F, the processing steps described with reference to FIG. 7D may be performed. Specifically, an anisotropic etch process may be performed to remove horizontally-extending portions of the continuous charge storage material layer 54, a tunneling dielectric layer 56, and an optional sacrificial cover material layer 601.

Figure 9H:
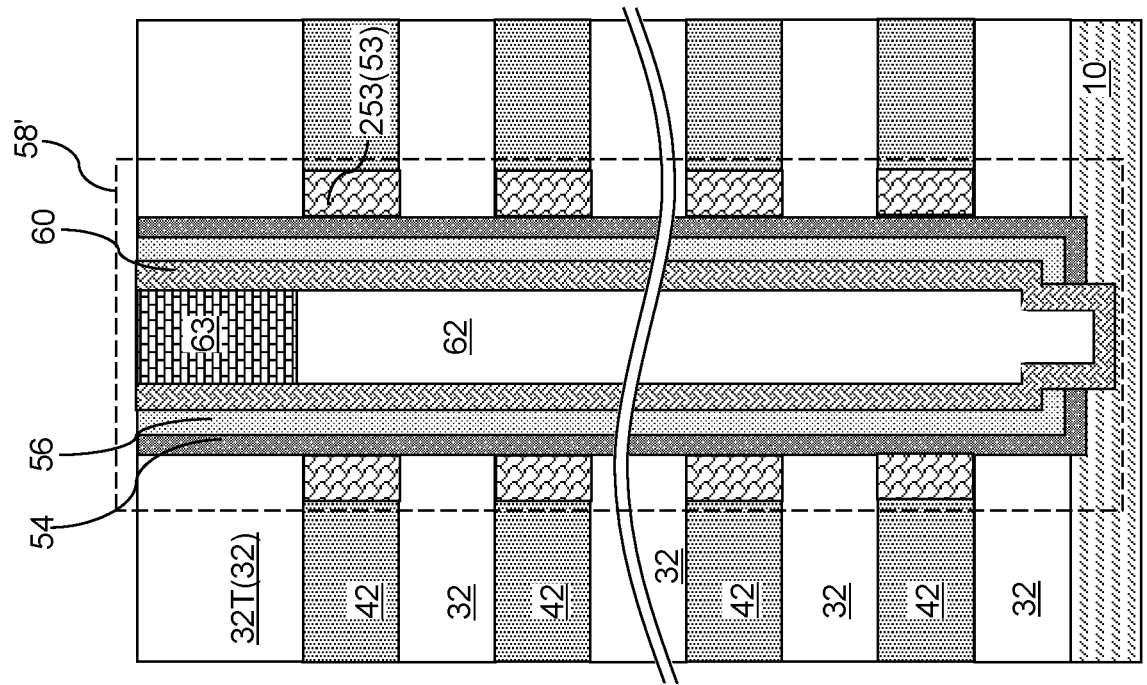
Figure 9G:
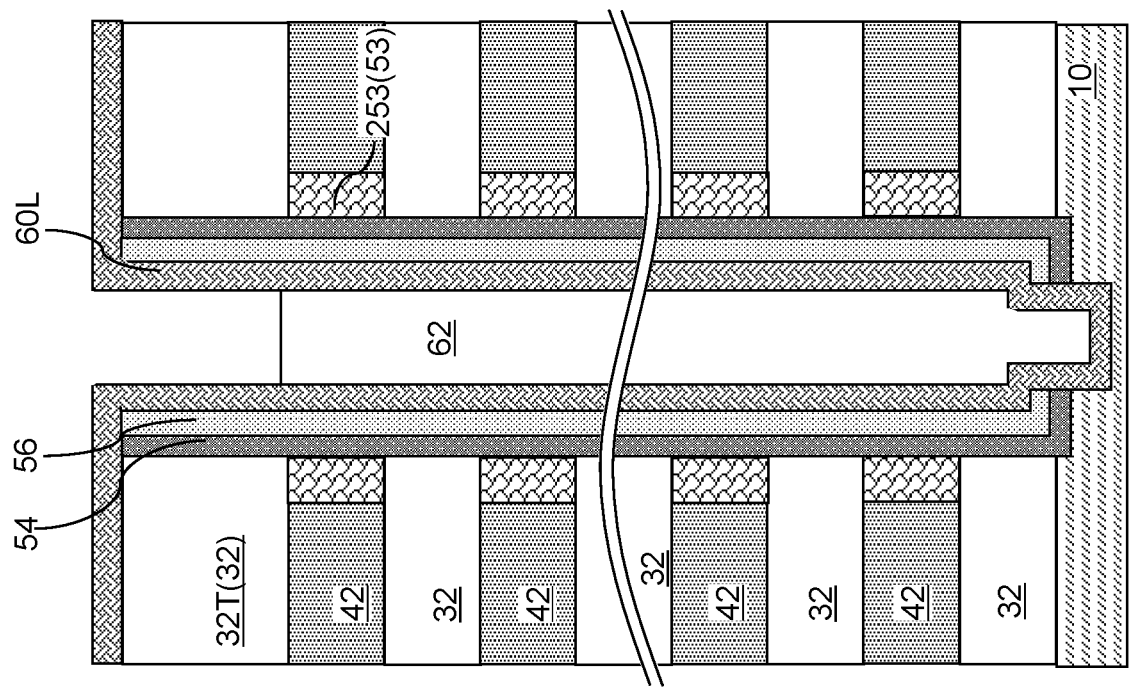

Referring to FIG. 9G, the processing steps described with reference to FIG. 5F can be performed to form a semiconductor channel layer 60L and dielectric cores 62.

Referring to FIG. 9H, the processing steps described with reference to FIG. 5G can be performed to form a drain region 63 and a vertical semiconductor channel 60 within each memory opening 49 and within each support opening 19.

The combination of all material portions that are formed in a memory opening 49 constitutes an in-process memory opening fill structure 58'. The in-process memory opening fill structure 58' comprises a vertical stack of discrete charge storage elements 53 located at levels of the semiconductor sacrificial material layers 41, a continuous charge storage material layer 54, a tunneling dielectric layer 56, and a vertical semiconductor channel 60. The vertical stack of discrete charge storage elements 53 comprises semiconductor material portions 253. The semiconductor material portions 253 are formed at levels of the silicon nitride sacrificial material layers 42, and are vertically spaced apart from each other by the insulating layers 32. In the fourth configuration illustrated in FIG. 9H, the silicon nitride sacrificial material layers 42 comprise silicon nitride, and the vertical stack of discrete charge storage elements 53 in each memory opening 49 is formed by deposition and patterning of a semiconductor material.

A continuous charge storage material layer 54 vertically extends through a plurality of silicon nitride sacrificial material layers 42 (which may be all of the silicon nitride sacrificial material layers 42), and has a uniform thickness throughout. A vertical stack of discrete charge storage elements 53 is located at levels of the silicon nitride sacrificial material layers 42, and contacts a respective surface segment of an outer sidewall of the continuous charge storage material layer 54. In one embodiment, the outer sidewall of the continuous charge storage material layer 54 vertically extends straight through the plurality of silicon nitride sacrificial material layers 42. Interfaces between the insulating layers 32 and the outer sidewall of the continuous charge storage material layer 54 are vertically coincident with interfaces between the vertical stack of discrete charge storage elements 53 and the surface segments of the outer sidewall of the continuous charge storage material layer 54. In one embodiment, the vertical stack of discrete charge storage elements 53 consists essentially of a semiconductor material.

Figure 10:
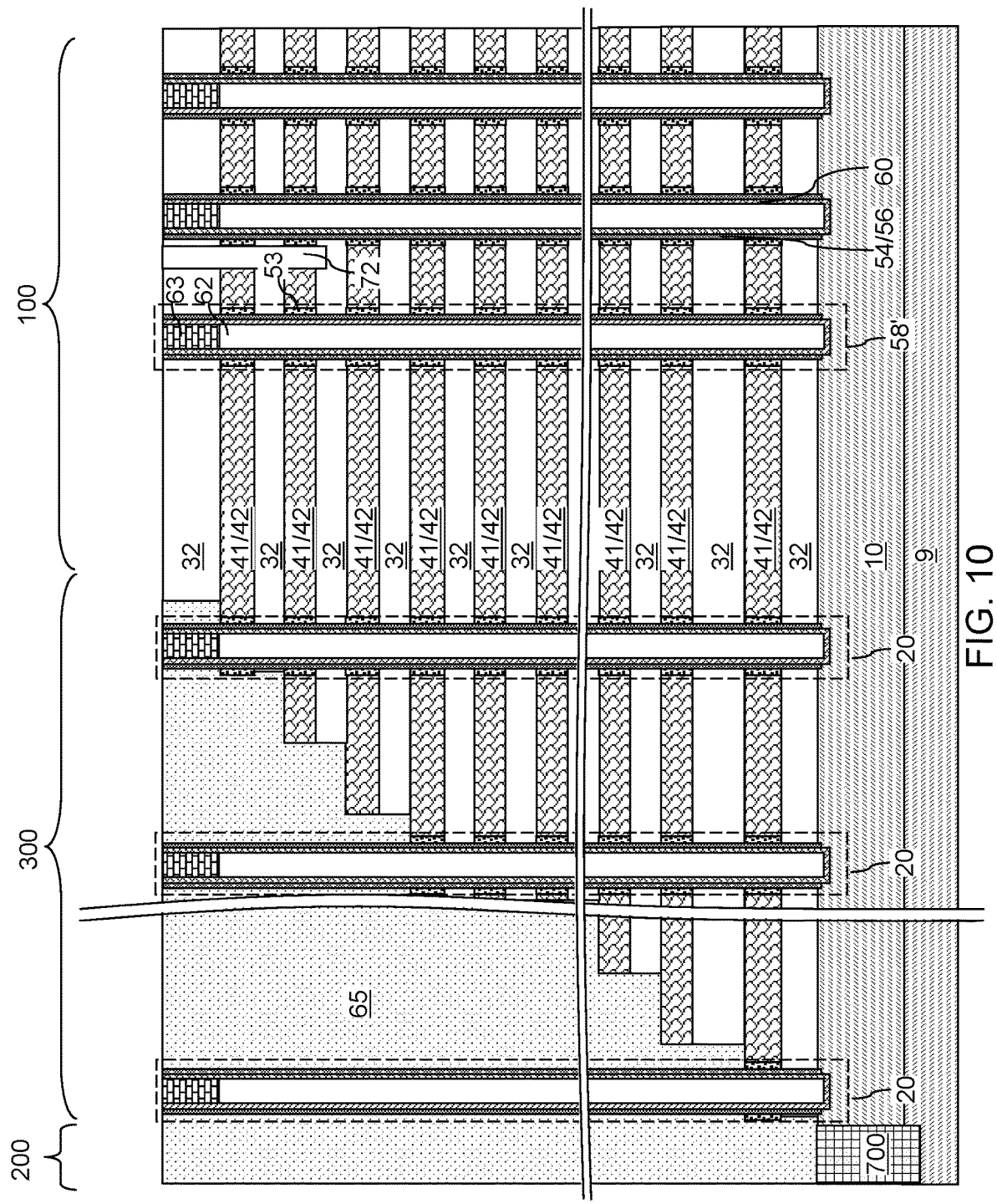
FIG. 10 is a schematic vertical cross-sectional view of the exemplary structure after formation of in-process memory opening fill structures and support pillar structures according to embodiments of the present disclosure.

Referring to FIG. 10, the exemplary structure is illustrated after formation of in-process memory opening fill structures 58' and support pillar structure 20 within the memory openings 49 and the support openings 19, respectively. An instance of an in-process memory opening fill structure 58' can be formed within each memory opening 49 of the structure of FIGS. 4A-4D. An instance of the support pillar structure 20 can be formed within each support opening 19 of the structure of FIGS. 4A-4D.

Figure 11A:
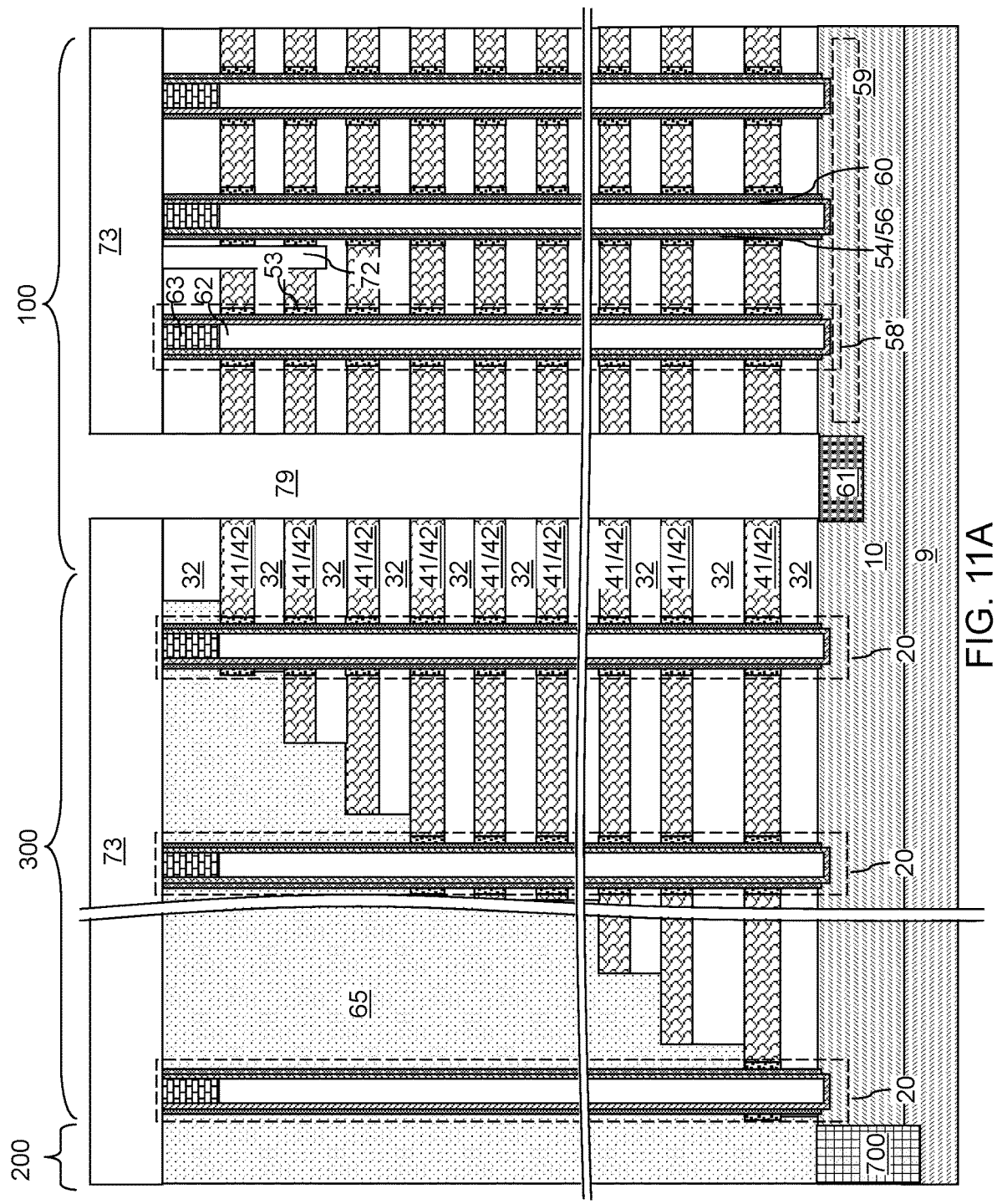
FIG. 11A is a schematic vertical cross-sectional view of the exemplary structure after formation of backside trenches according to embodiments of the present disclosure.
Figure 11B:
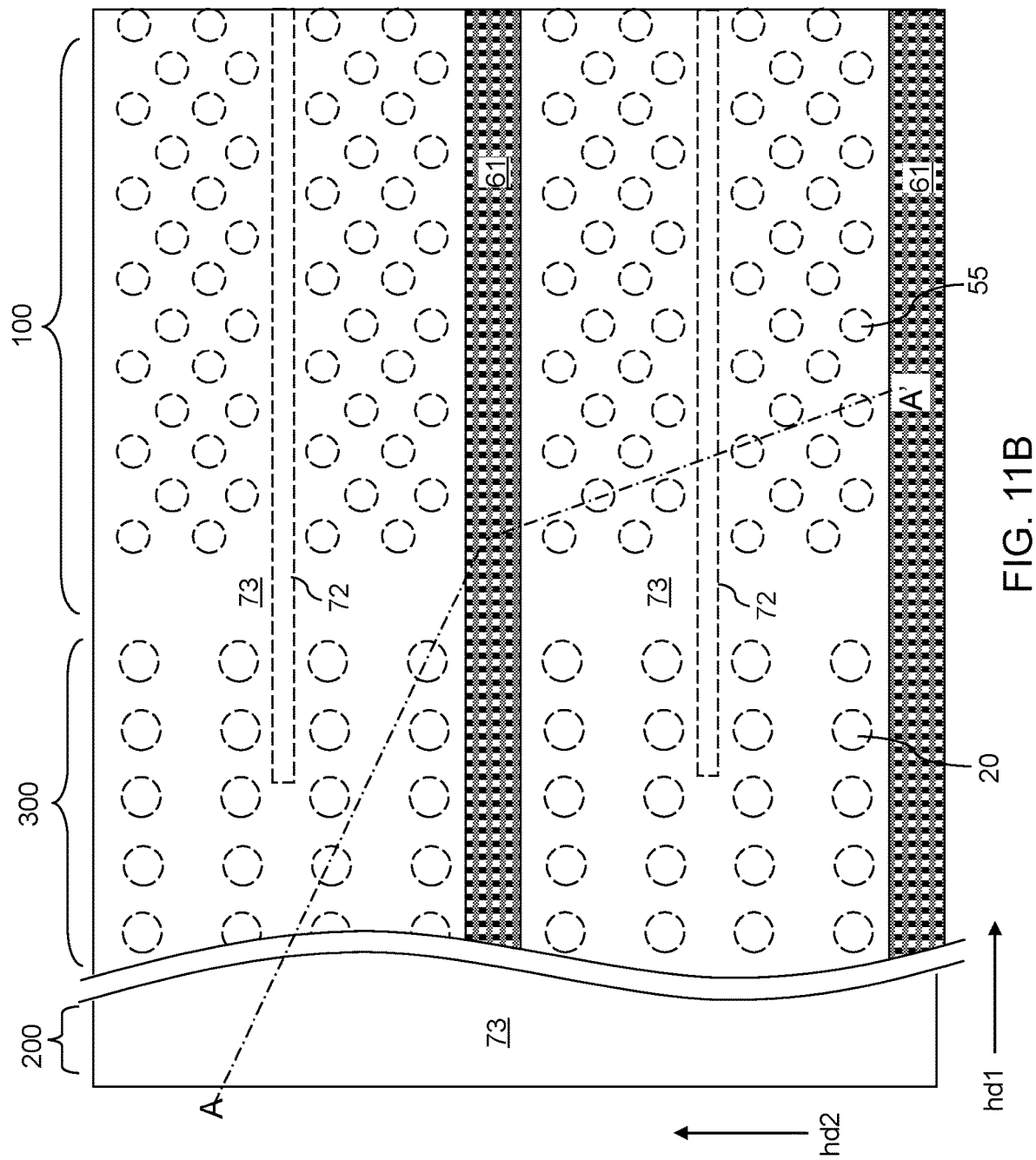
FIG. 11B is a partial see-through top-down view of the exemplary structure of FIG. 11A. The vertical plane A-A' is the plane of the schematic vertical cross-sectional view of FIG. 11A.

Referring to FIGS. 11A and 11B, a contact-level dielectric layer 73 can be formed over the alternating stack {32, (41 or 42)} of insulating layers 32 and sacrificial material layers (41 or 42), and over the in-process memory opening fill structures 58' and the support pillar structures 20. The contact-level dielectric layer 73 includes a dielectric material that is different from the dielectric material of the sacrificial material layers (41 or 42). For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of in-process memory opening fill structures 58. The pattern in the photoresist layer can be transferred through the contact-level dielectric layer 73, the alternating stack {32, (41 or 42)} and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The in-process memory opening fill structures 58' can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of in-process memory opening fill structures 58' can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the in-process memory opening fill structures 58' constitutes a horizontal semiconductor channel 59 for a plurality of field effect transistors. The horizontal semiconductor channel 59 is connected to multiple vertical semiconductor channels 60. The horizontal semiconductor channel 59 contacts the source region 61 and a plurality of vertical semiconductor channels 60.

Figure 12:
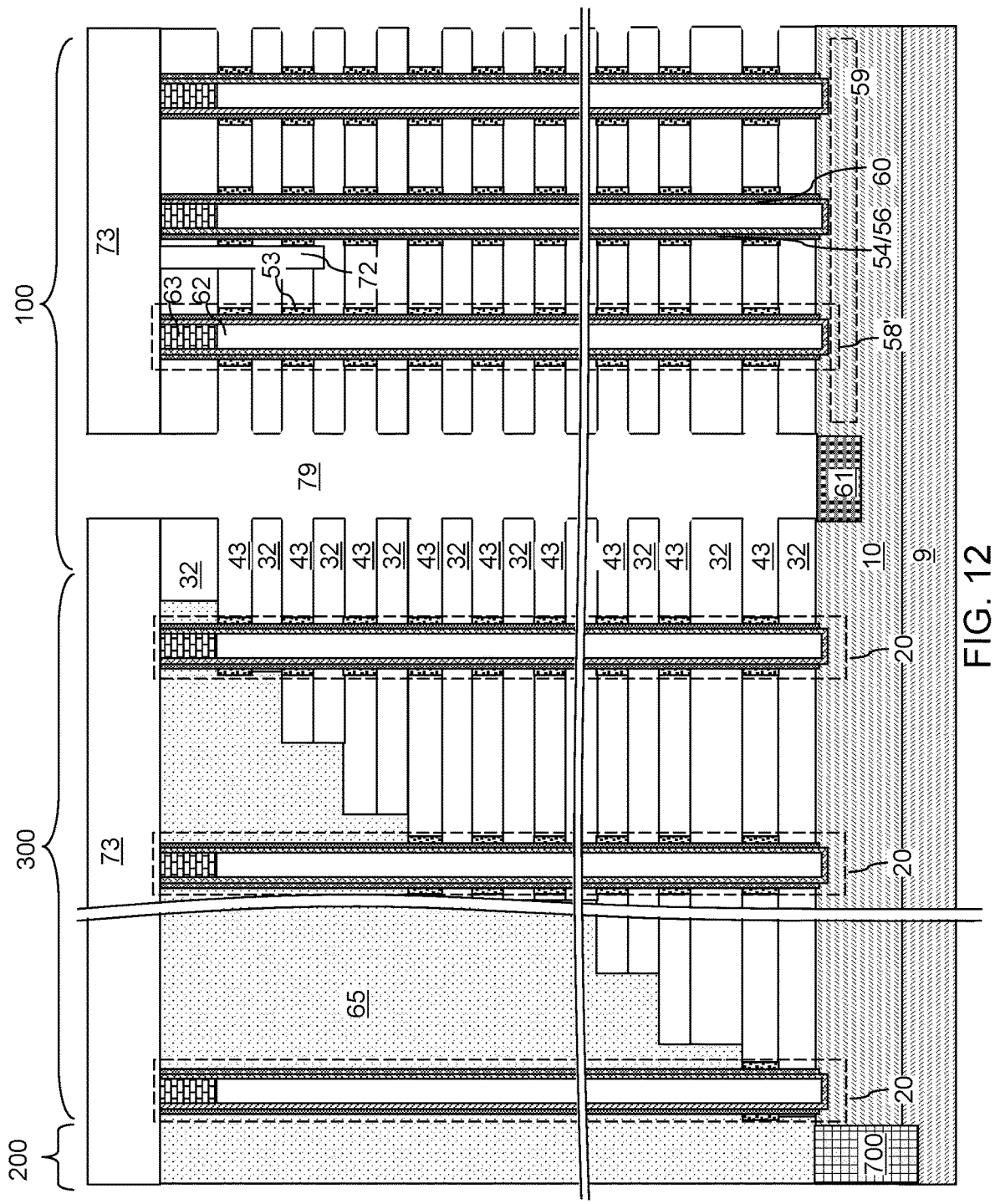
FIG. 12 is a schematic vertical cross-sectional view of the exemplary structure after formation of backside recesses according to embodiments of the present disclosure.

Referring to FIG. 12, an etchant that selectively etches the second material of the sacrificial material layers (41 or 42) with respect to the first material of the insulating layers 32 can be introduced into the backside trenches 79, for example, employing an etch process. Backside recesses 43 are formed in volumes from which the sacrificial material layers (41 or 42) are removed. The removal of the second material of the sacrificial material layers (41 or 42) can be selective to the first material of the insulating layers 32, the material of the retro-stepped dielectric material portion 65, the semiconductor material of the semiconductor material layer 10, and the material of the vertical stacks of discrete memory elements 53.

The etch process that removes the second material selective to the first material and the vertical stacks of discrete memory elements 53 can be a wet etch process employing a wet etch solution, or can be a gas phase (dry) etch process in which the etchant is introduced in a vapor phase into the backside trenches 79. For example, if the sacrificial material layers are polysilicon semiconductor sacrificial material layers 41, then the etch process can be a wet etch process employing hot trimethyl-2 hydroxyethyl ammonium hydroxide ("hot TMY") or tetramethyl ammonium hydroxide (TMAH), which etches semiconductor materials selective to silicon oxide, metallic materials, and various other materials employed in the art. If the sacrificial material layers are silicon nitride sacrificial material layers 42, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers (41 or 42).

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers (41 or 42) is removed. The memory openings in which the in-process memory opening fill structures 58' are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

FIGS. 13A-13E are sequential vertical cross-sectional views of a region of the exemplary structure during modification of in-process memory opening fill structures 58' in the first configuration of FIG. 5G and formation of electrically conductive layers 46 and backside trench fill structures (74, 76) according to an embodiment of the present disclosure.

Referring to FIG. 13A, the first configuration of the exemplary structure is illustrated after the processing steps described with reference to FIGS. 12A and 12B.

Figure 13B:
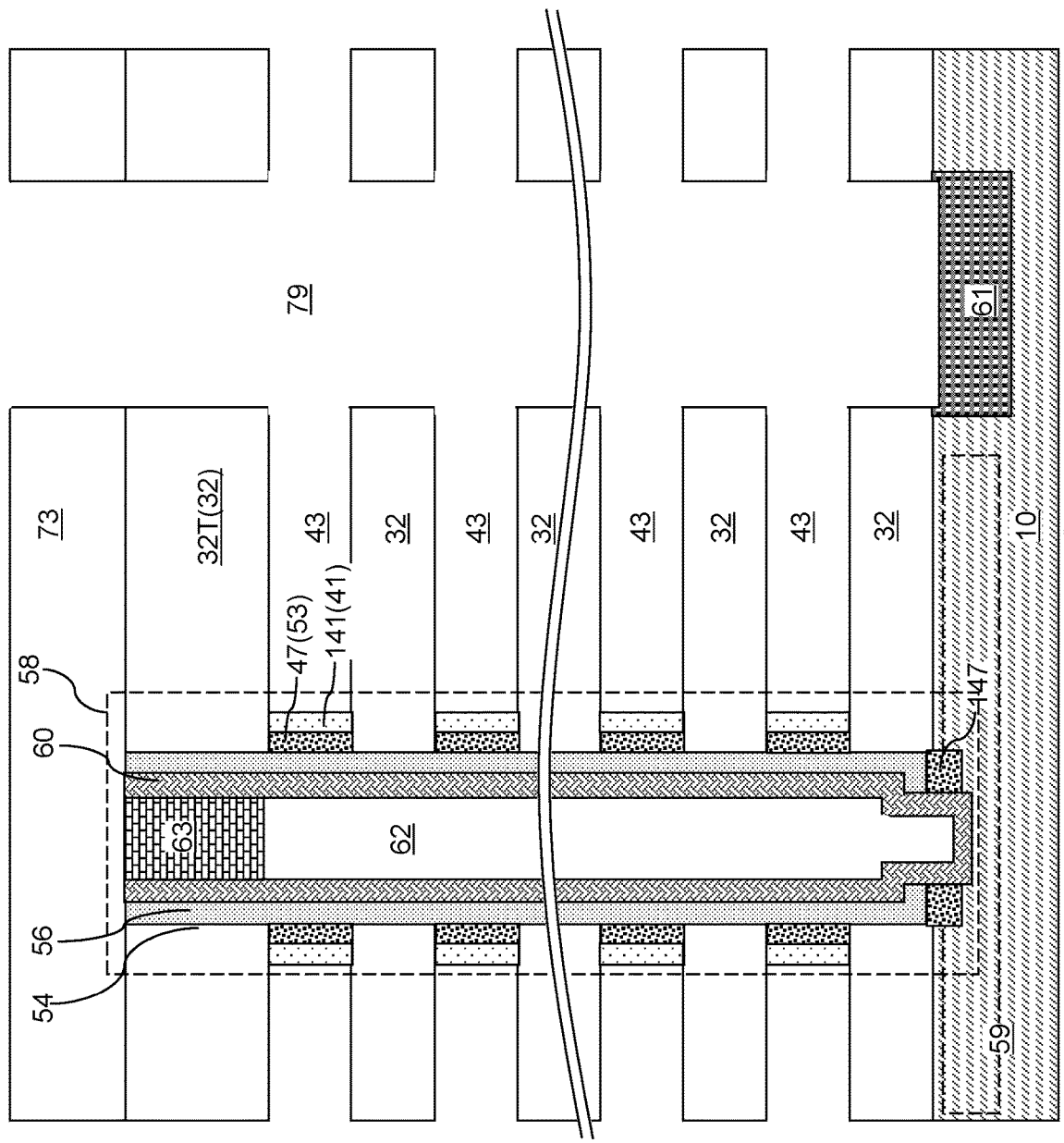

Referring to FIG. 13B, an oxidation process can be performed to convert outer surface portions of the discrete memory elements 53 (comprising the metal-semiconductor alloy portions 47) which are exposed in the backside recesses 53 into dielectric oxide material portions, which function as blocking dielectric material portions 41. Depending on the composition of the metal-semiconductor alloy portions (e.g., metal silicide portions) 47, the blocking dielectric material portions 41 may comprise silicon oxide or a dielectric oxide of the metal-semiconductor alloy material in the metal-semiconductor alloy portions 47. Thus, in one embodiment, the blocking dielectric material portions 41 may comprise mixed dielectric oxide material portions 141 containing an alloy of a dielectric metal oxide of the metal in the metal-semiconductor alloy portions 47 and a semiconductor oxide of the semiconductor material in the metal-semiconductor alloy portion 47 (e.g., a mixed silicon oxide and metal oxide). The remaining portions of the discrete memory elements 53 have a reduced lateral thickness between a respective inner cylindrical sidewall and a respective outer cylindrical sidewall.

Each in-process memory opening fill structure 58' is converted into a respective memory opening fill structure 58 upon formation of a vertical stack of blocking dielectric material portions 41. Each memory opening fill structure 58 comprises a vertical stack of discrete memory elements 53, and a vertical stack of blocking dielectric material portions 41.

Figure 13C:
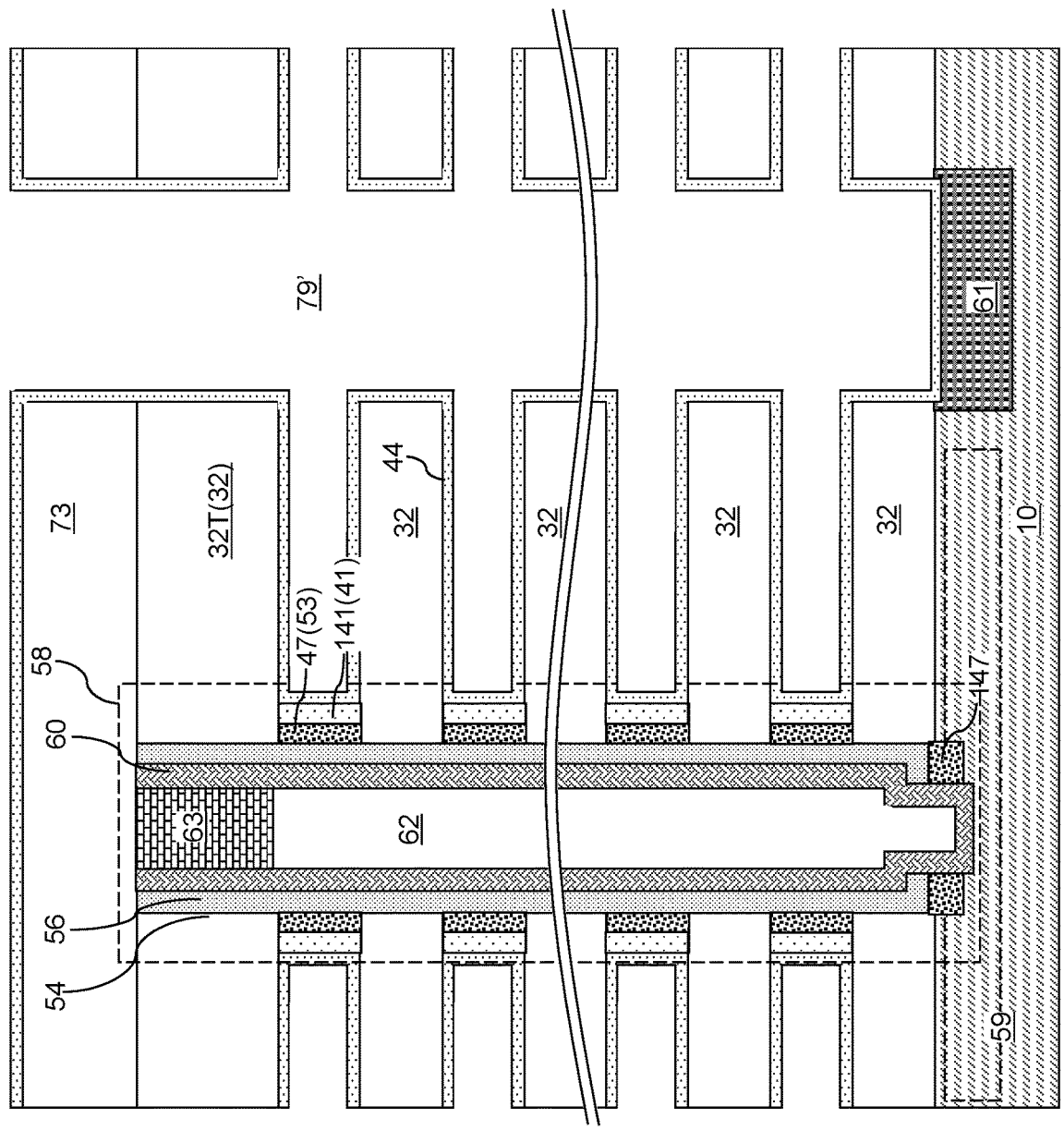

Referring to FIG. 13C, a backside blocking dielectric layer 44 can be optionally formed in the backside recesses 43 and on a sidewall of the backside trench 79. The backside blocking dielectric layer 44 can be formed directly on horizontal surfaces of the insulating layers 32 and sidewalls of the memory opening fill structures 58 (such as outer cylindrical sidewalls of the blocking dielectric material portions 41) within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide, such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory opening fill structures 58 that are physically exposed to the backside recesses 43 (such as the outer cylindrical sidewalls of the blocking dielectric material portions 41). A backside cavity 79' is present within the portion of each backside trench 79 that is not filled with the backside blocking dielectric layer 44.

Figure 13D:
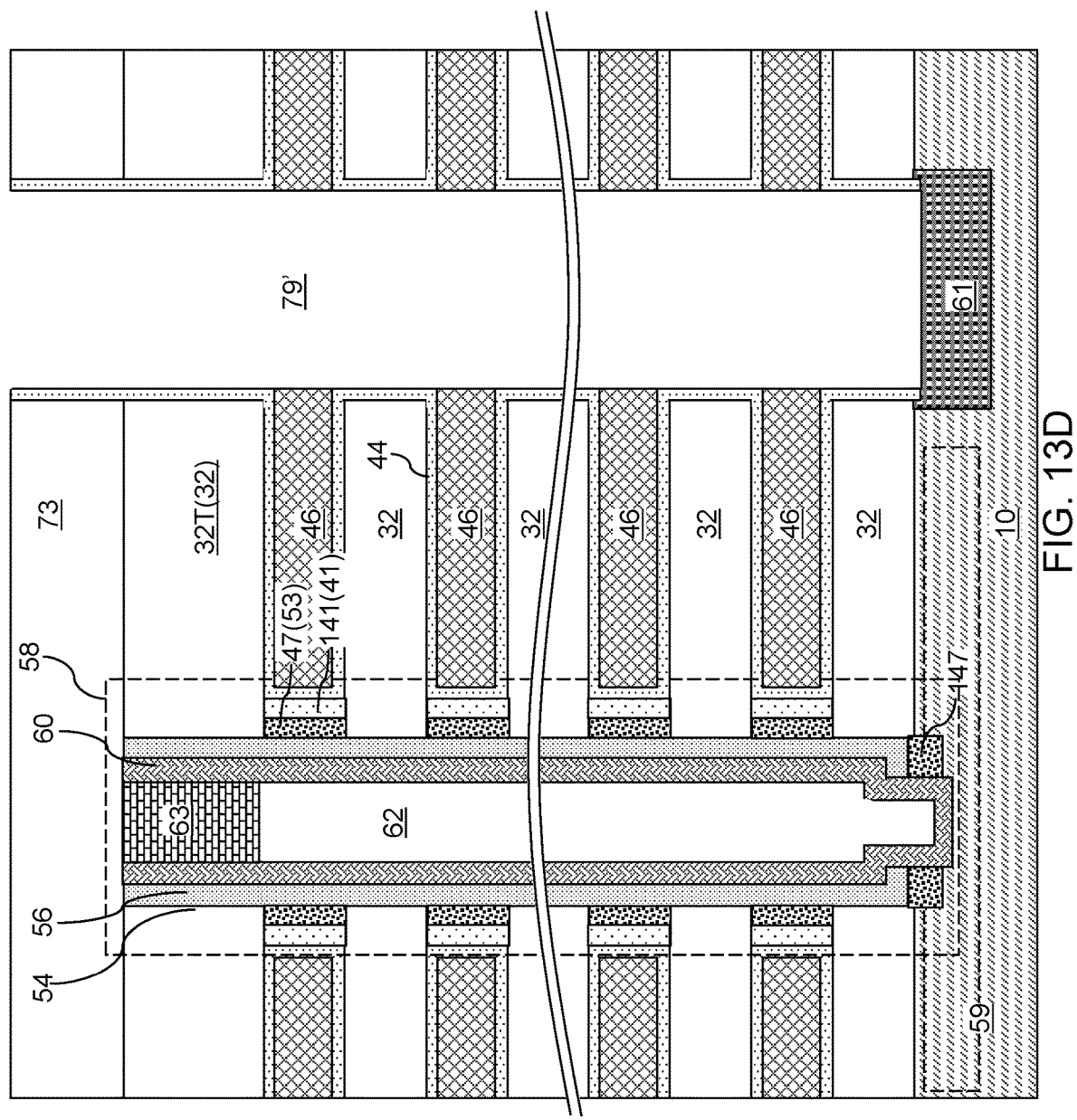

Referring to FIG. 13D, at least one electrically conductive material can be conformally deposited in the backside recesses 43 and at peripheral portions of the backside trenches 79. The at least one electrically conductive material may comprise a metallic barrier material and a metal fill material. The metallic barrier layer can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited over the metallic barrier layer to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory opening fill structures 58 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer (not shown) can be formed on the sidewalls of each backside trench 79 and over the contact-level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact-level dielectric layer 73.

The deposited metallic material of the continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers (41 or 42) are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory opening fill structures 58. In other words, each electrically conductive layer 46 can be a word line that functions as a common control gate electrode for the plurality of vertical memory devices. One or more topmost electrically conductive layers 46 may function as drain side select gate electrodes, while one or more bottommost electrically conductive layers 46 may function as source side select gate electrodes.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. A backside cavity 79' is present within each backside trench 79.

Each source region 61 is formed in an upper portion of the semiconductor substrate (9, 10). Semiconductor channels (59, 60) extend between each source region 61 and a respective set of drain regions 63. The semiconductor channels (59, 60) include the vertical semiconductor channels 60 of the memory opening fill structures 58.

In one embodiment, each of the electrically conductive layers 46 is laterally spaced from the vertical stack of blocking dielectric material portions 41 by a respective backside blocking dielectric layer 44 laterally surrounding and contacting a respective backside blocking dielectric material portion 41. In one embodiment, each of the electrically conductive layers 46 is vertically spaced from a respective overlying insulating layer 32 by an upper horizontally-extending portion of the respective backside blocking dielectric layer 44, and is vertically spaced from a respective underlying insulating layer 32 by a lower horizontally-extending portion of the respective backside blocking dielectric layer 44.

Figure 13E:
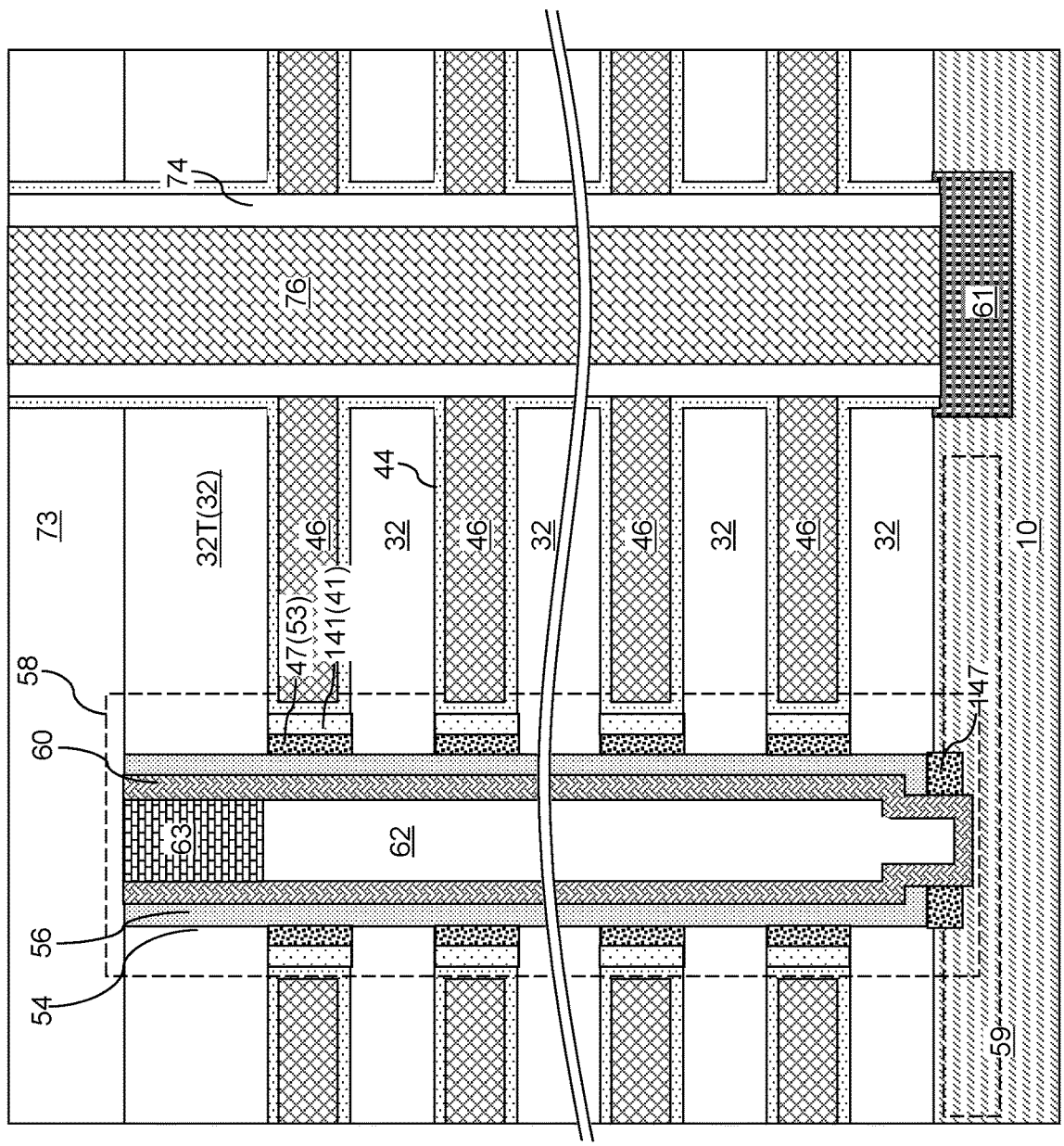

Referring to FIG. 13E, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Generally, each backside trench 79 can be filled with a respective backside trench fill structure. In one embodiment, each backside trench fill structure may comprise a combination of an insulating spacer 74 and a backside contact via structure 76.

FIGS. 14A-14E are sequential vertical cross-sectional views of a region of the exemplary structure during modification of in-process memory opening fill structures 58' in the second configuration of FIG. 7F and formation of electrically conductive layers 46 and backside trench fill structures (74, 76) according to an embodiment of the present disclosure.

Figure 14A:
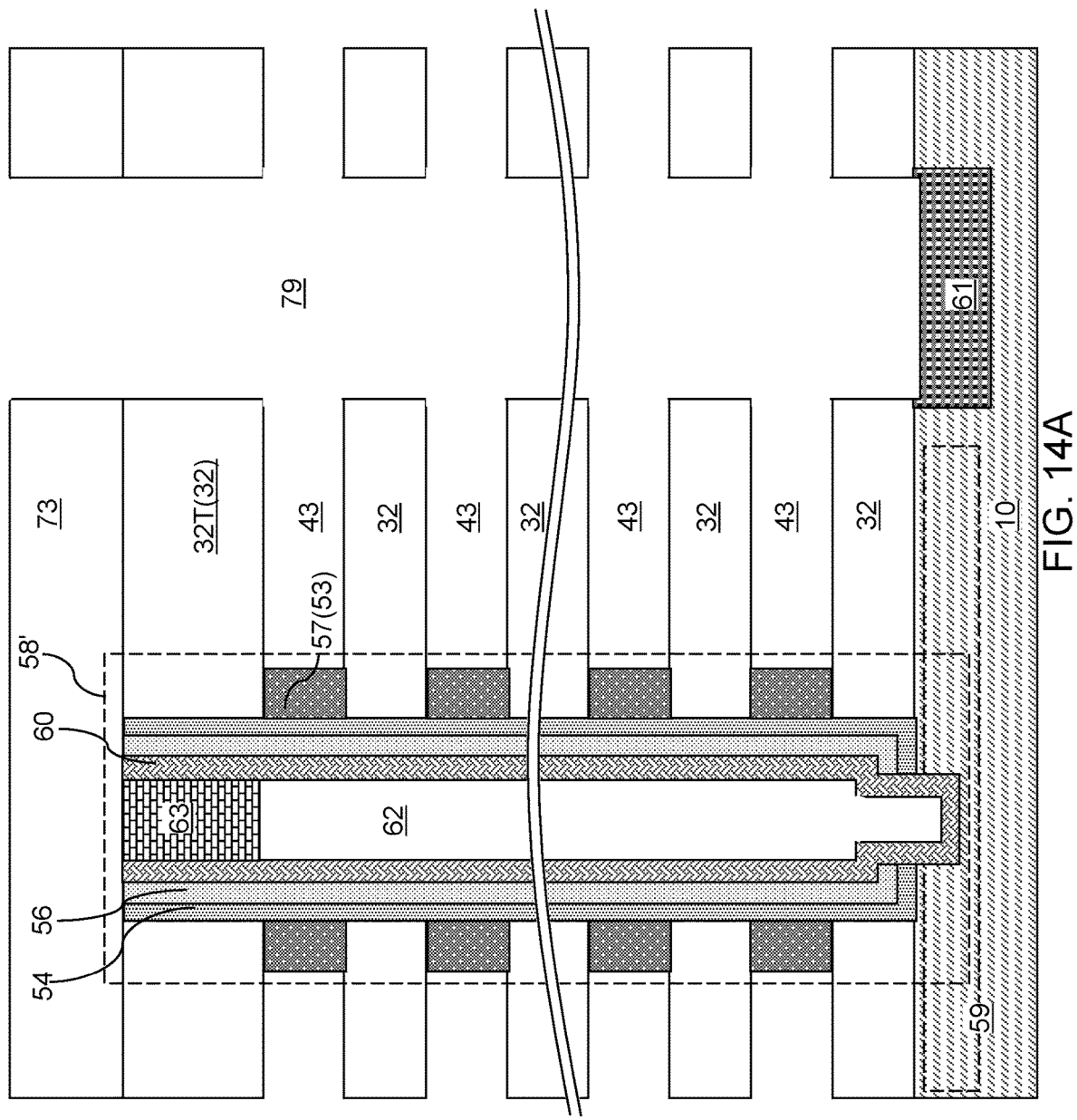

Referring to FIG. 14A, the second configuration of the exemplary structure is illustrated after the processing steps described with reference to FIGS. 12A and 12B. Each in-process memory opening fill structure 58' includes the additional continuous charge storage material layer 54.

Referring to FIG. 14B, an oxidation process can be performed to convert outer surface portions of the discrete memory elements 53 (comprising silicon-rich silicon nitride charge storage material portions 57) into dielectric oxide material portions, which are blocking dielectric material portions 41. The blocking dielectric material portions 41 comprise a dielectric oxide of the charge storage material of the charge storage material portions 57. In one embodiment, the charge storage material portions 57 may comprise silicon oxide (such as a stoichiometric silicon dioxide or a non-stoichiometric silicon oxide that is silicon-rich), and the blocking dielectric material portions 41 comprise silicon-oxide-containing blocking dielectric material portions 241. The silicon-oxide-containing blocking dielectric material portions 241 may comprise and/or may consist essentially of silicon oxide. Alternatively, the silicon-oxide-containing blocking dielectric material portions 241 may comprise, and/or may consist essentially of, silicon oxynitride in which the atomic percentage of nitrogen atoms decreases with a lateral distance from an interface with the unoxidized remaining portions of the charge storage material portions 57. The remaining portions of the discrete memory elements 53 have a reduced lateral thickness between a respective inner cylindrical sidewall and a respective outer cylindrical sidewall.

Each in-process memory opening fill structure 58' is converted into a respective memory opening fill structure 58 upon formation of a vertical stack of blocking dielectric material portions 41. Each memory opening fill structure 58 comprises a vertical stack of discrete memory elements 53, and a vertical stack of blocking dielectric material portions 41.

Figure 14C:
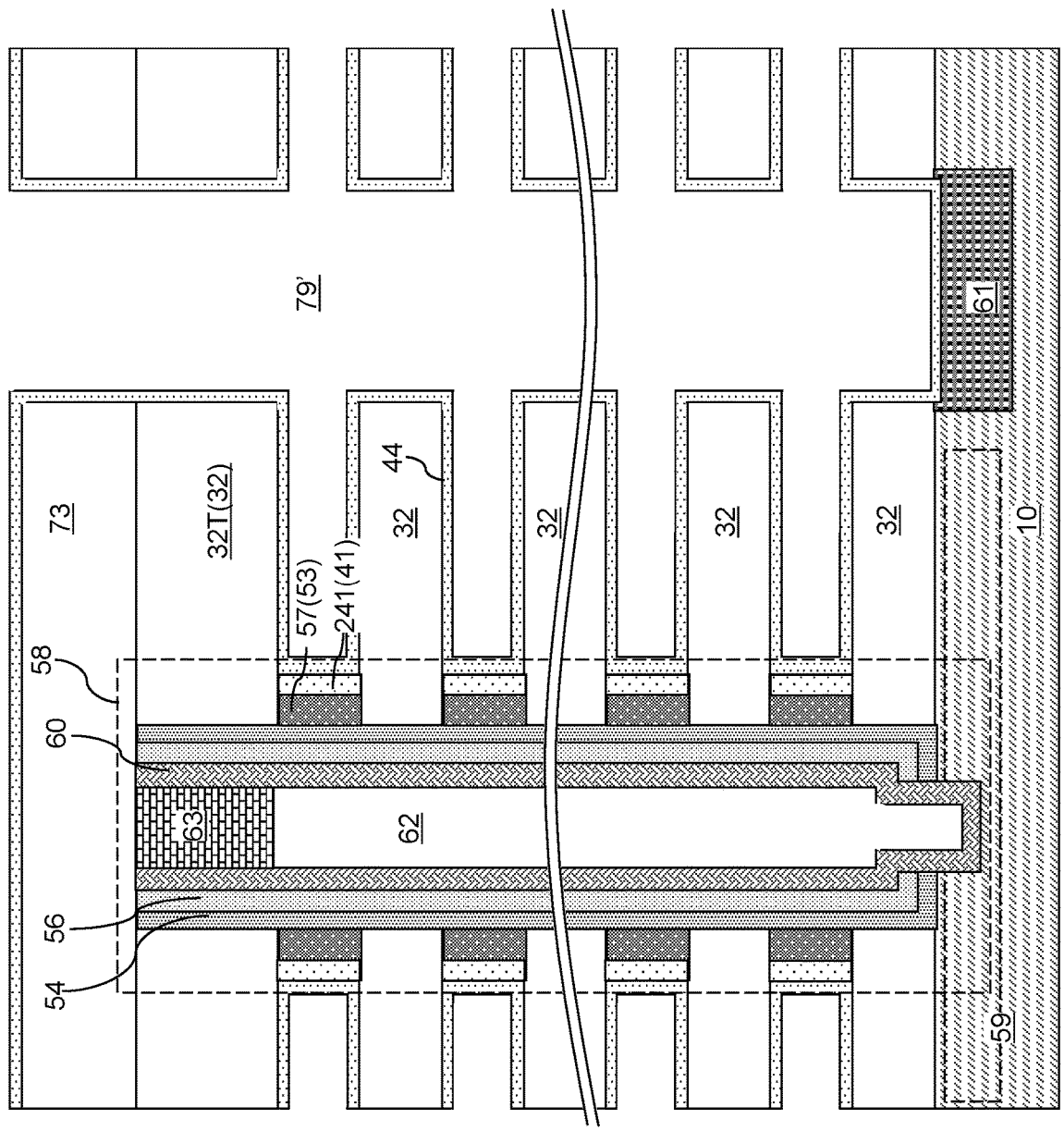

Referring to FIG. 14C, the processing steps described with reference to FIG. 13C may be performed to form a backside blocking dielectric layer 44.

Figure 14D:
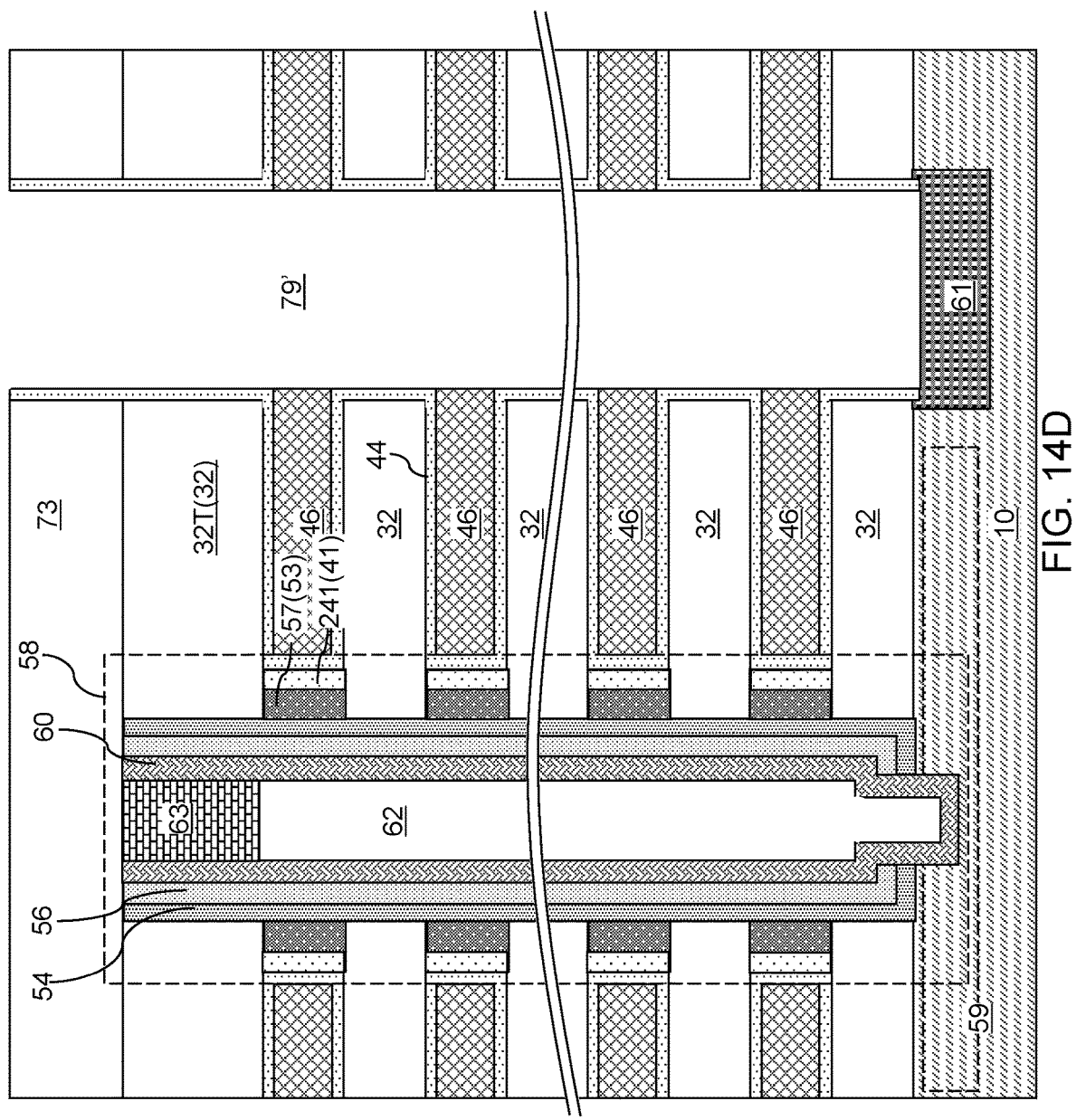

Referring to FIG. 14D, the processing steps described with reference to FIG. 13D may be performed to form electrically conductive layers 46.

Figure 14E:
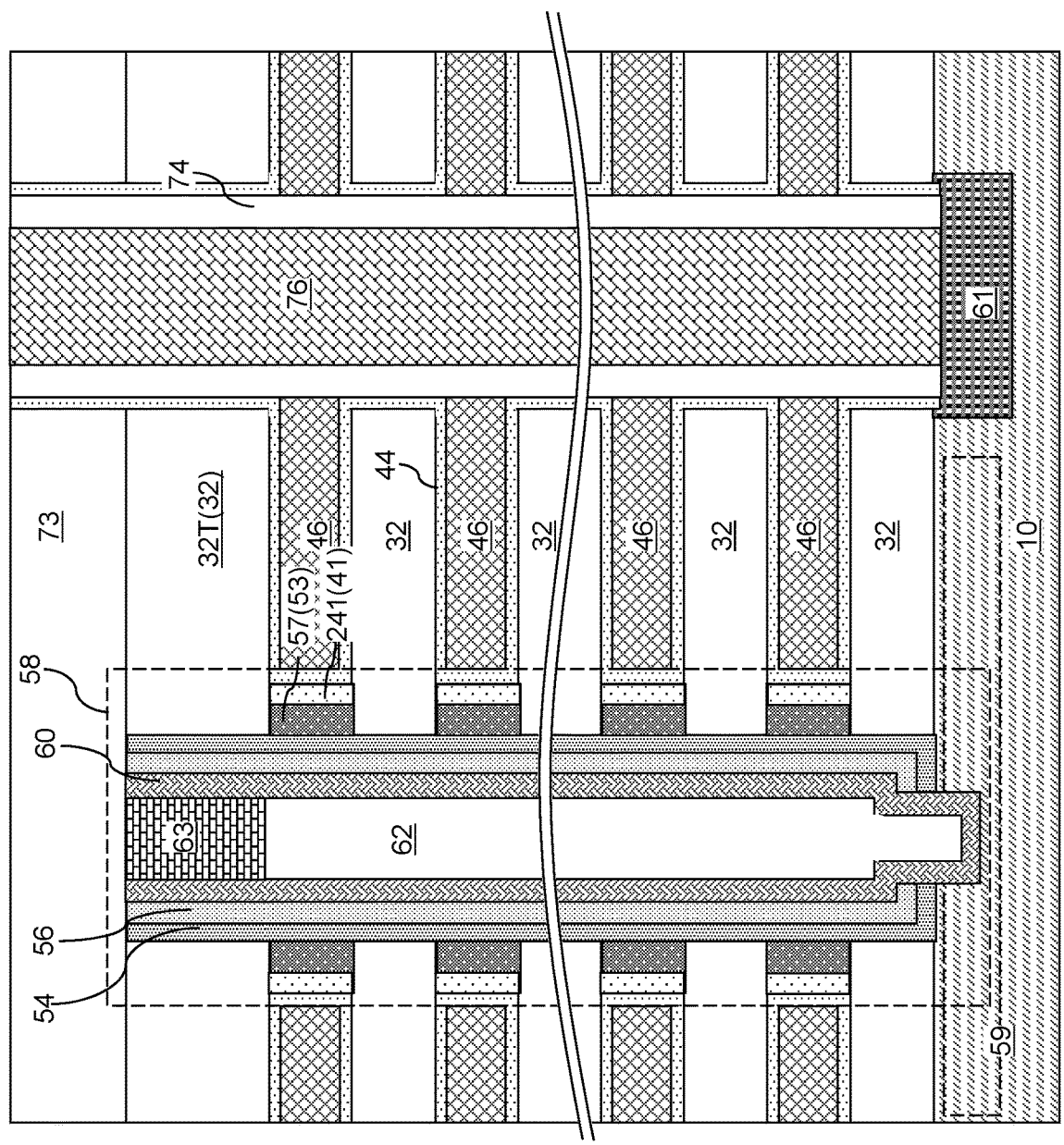

Referring to FIG. 14E, the processing steps described with reference to FIG. 13E may be performed to form backside trench fill structures (74, 76).

FIGS. 15A-15E are sequential vertical cross-sectional views of a region of the exemplary structure during modification of in-process memory opening fill structures 58' in the third configuration of FIG. 8E and formation of electrically conductive layers 46 and backside trench fill structures (74, 76) according to an embodiment of the present disclosure.

Figure 15A:
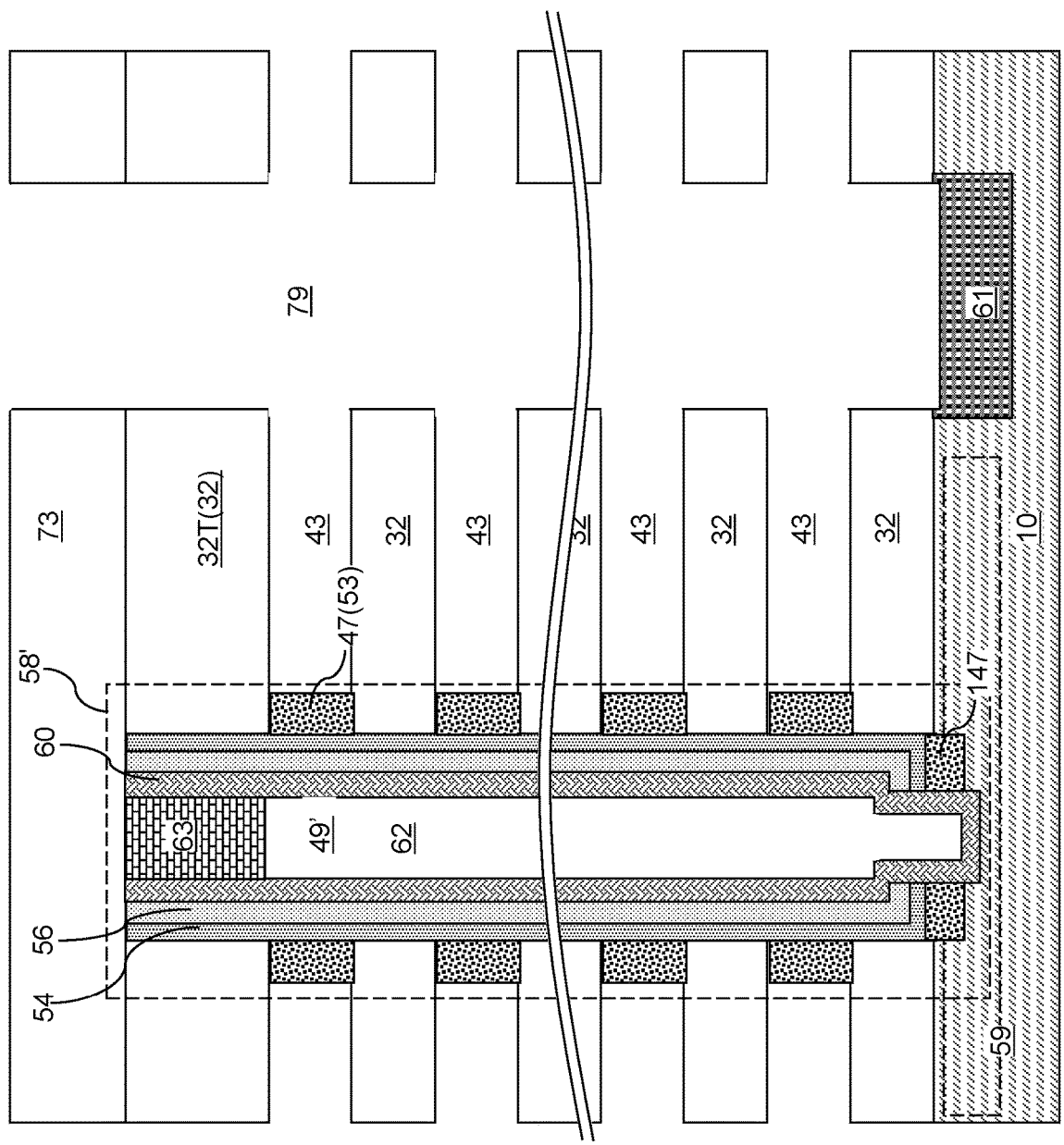
FIGS. 15A-15E are sequential vertical cross-sectional views of a region of the exemplary structure during modification of in-process memory opening fill structures in the third configuration and formation of electrically conductive layers and backside trench fill structures according to an embodiment of the present disclosure.

Referring to FIG. 15A, the third configuration of the exemplary structure is illustrated after the processing steps described with reference to FIGS. 12A and 12B. Each in-process memory opening fill structure 58' comprises a continuous charge storage material layer 54.

Figure 15B:
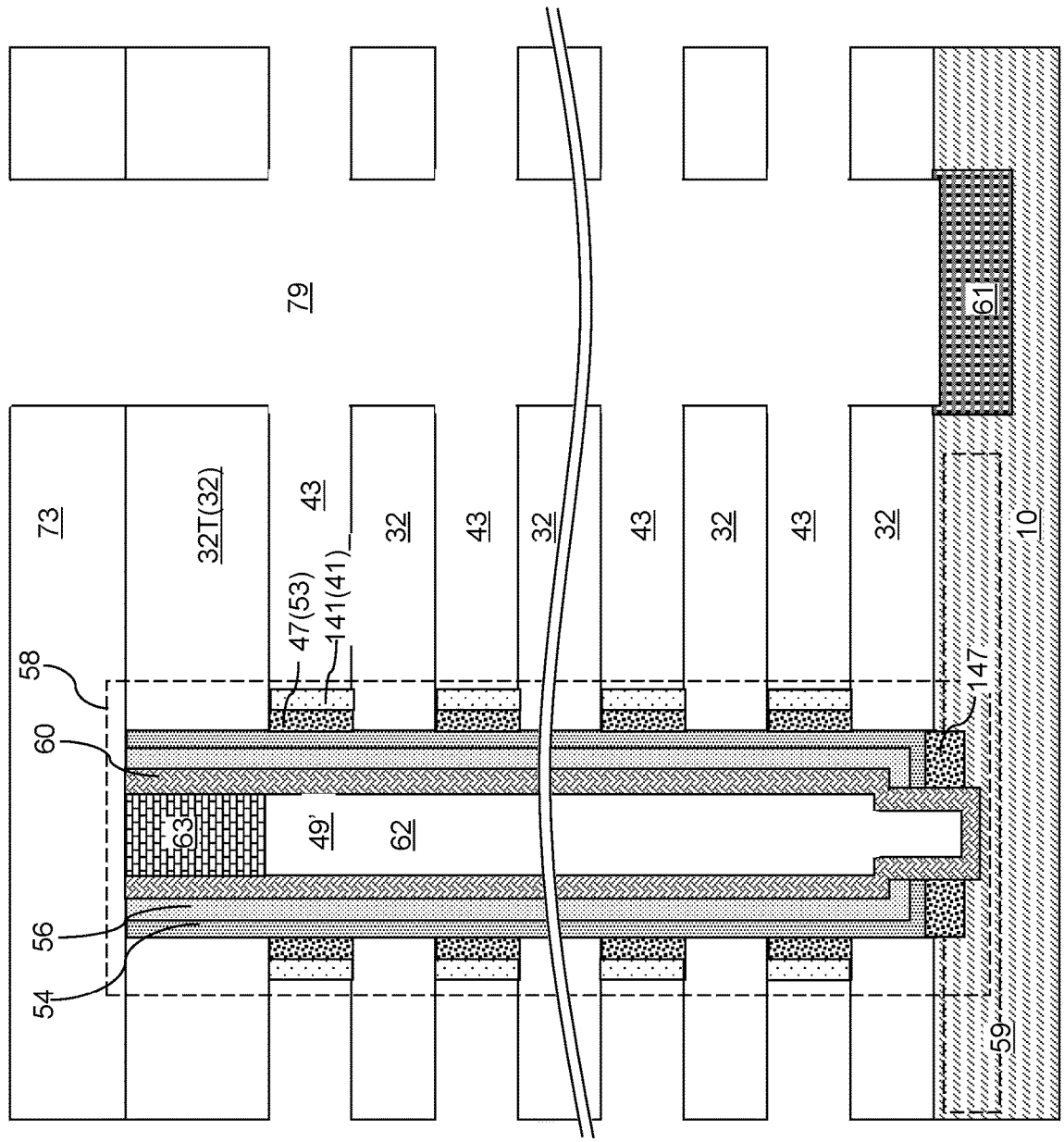

Referring to FIG. 15B, an oxidation process can be performed to convert outer surface portions of the discrete memory elements 53 (comprising the metal-semiconductor alloy portions 47) into dielectric oxide material portions, which are blocking dielectric material portions 41, as described above with respect to FIG. 13B. In one embodiment, the blocking dielectric material portions 41 may comprise mixed dielectric oxide material portions 141 containing an alloy of a dielectric metal oxide of the metal in the metal-semiconductor alloy portions 47 and a semiconductor oxide of the semiconductor material in the metal-semiconductor alloy portion 47. The remaining portions of the discrete memory elements 53 have a reduced lateral thickness between a respective inner cylindrical sidewall and a respective outer cylindrical sidewall.

Each in-process memory opening fill structure 58' is converted into a respective memory opening fill structure 58 upon formation of a vertical stack of blocking dielectric material portions 41. Each memory opening fill structure 58 comprises a vertical stack of discrete memory elements 53, and a vertical stack of blocking dielectric material portions 41.

Figure 15C:
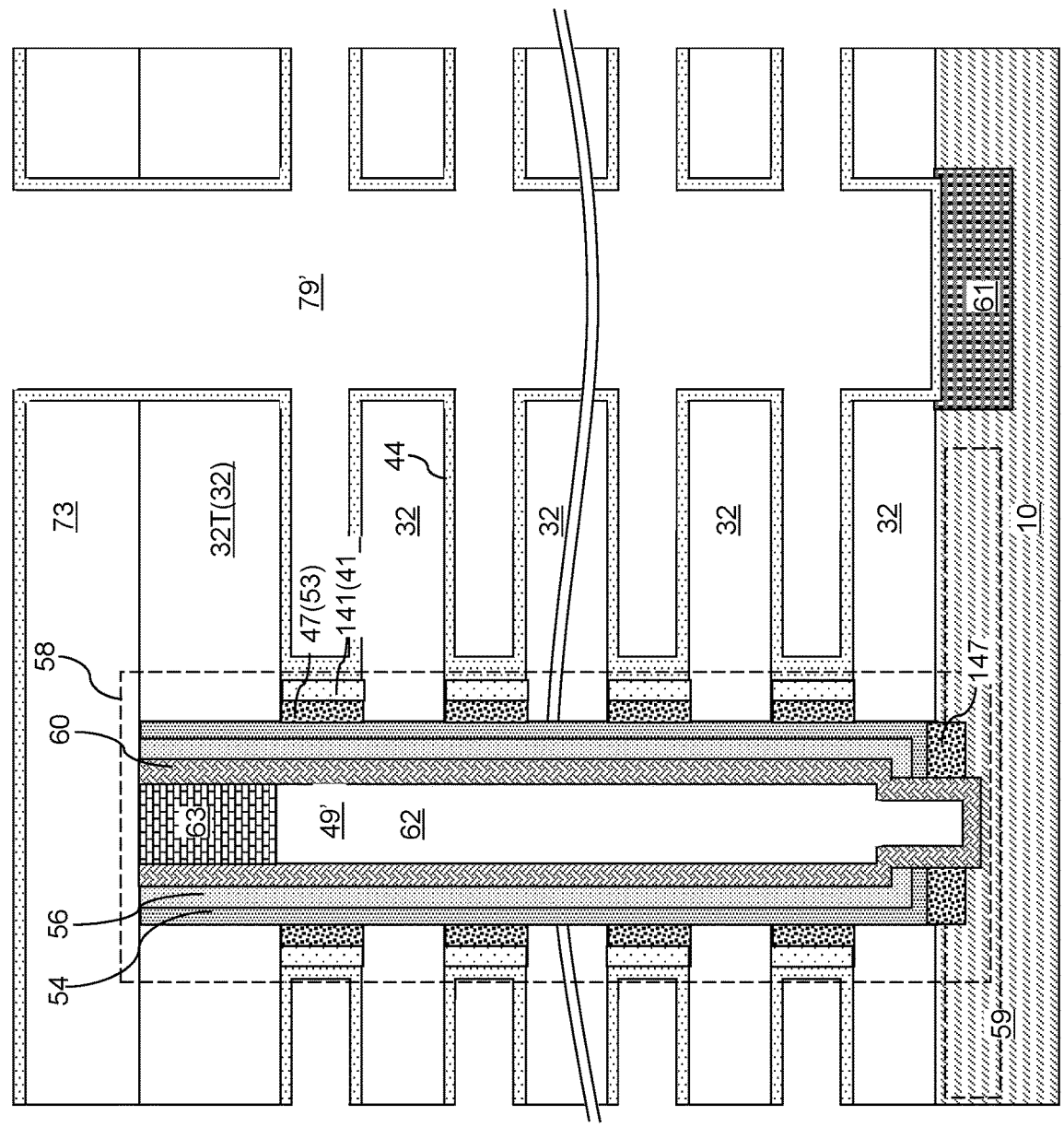

Referring to FIG. 15C, the processing steps described with reference to FIG. 13C may be performed to form a backside blocking dielectric layer 44.

Figure 15D:
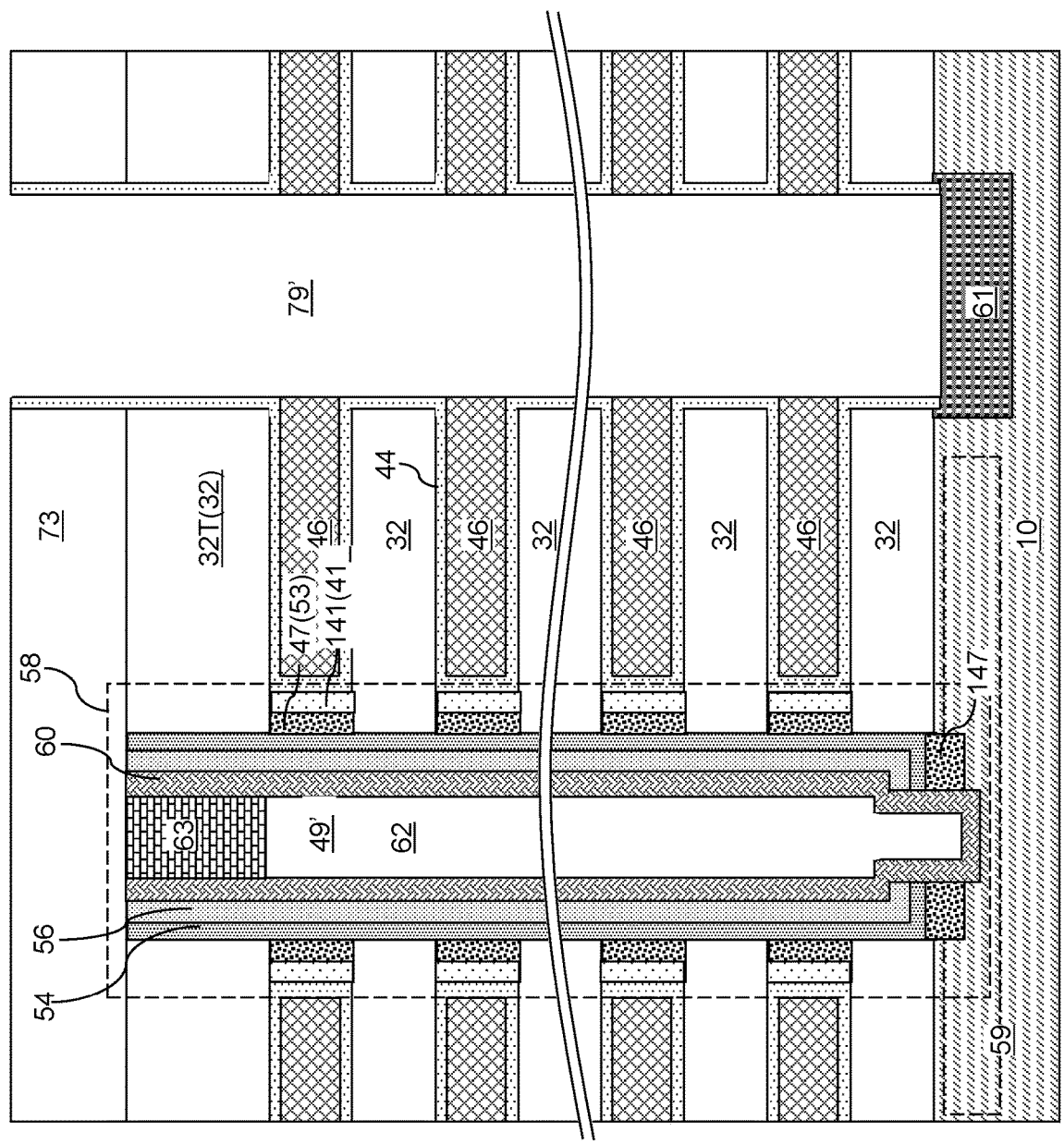

Referring to FIG. 15D, the processing steps described with reference to FIG. 13D may be performed to form electrically conductive layers 46.

Figure 15E:
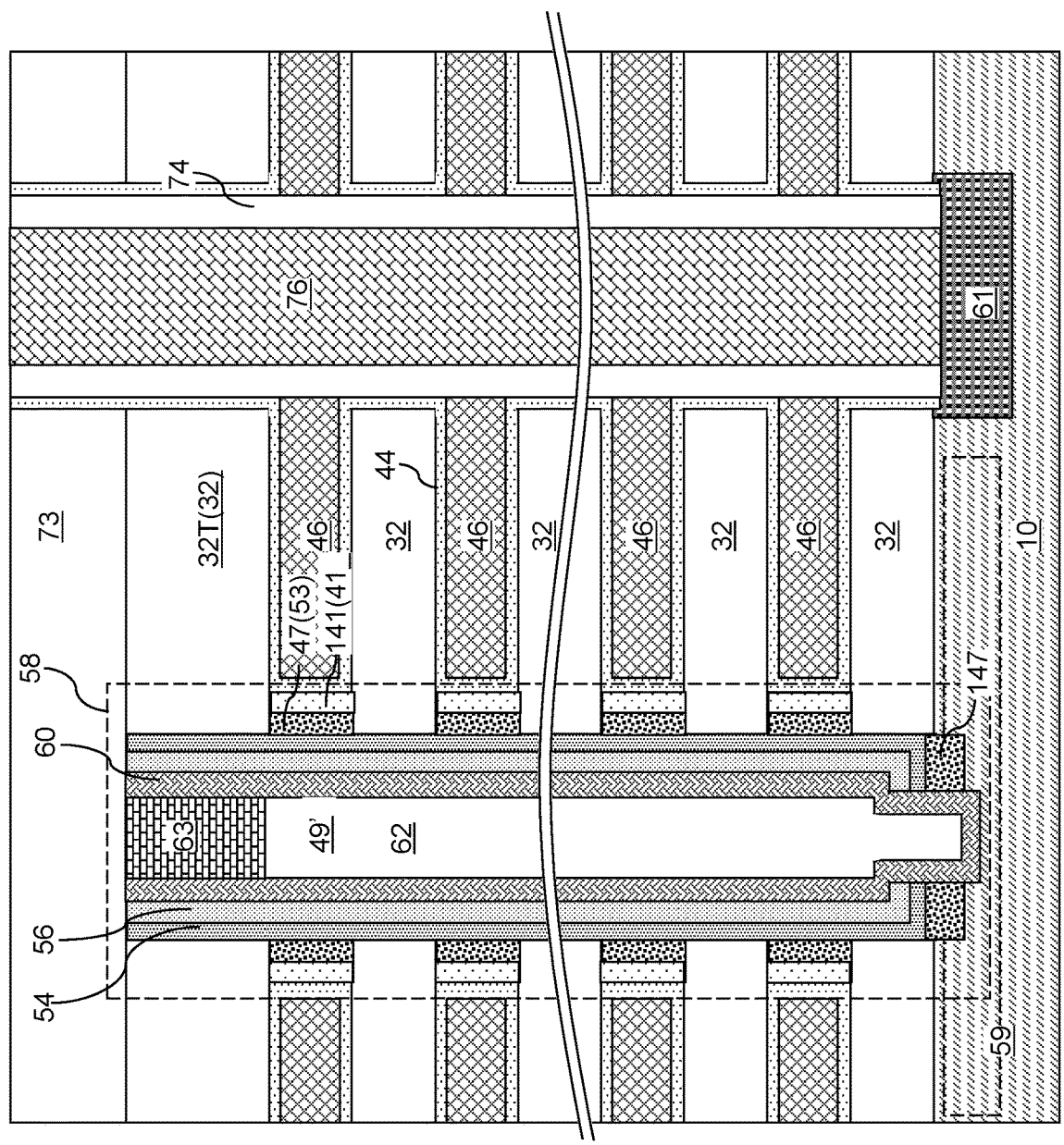

Referring to FIG. 15E, the processing steps described with reference to FIG. 13E may be performed to form backside trench fill structures (74, 76).

FIGS. 16A-16E are sequential vertical cross-sectional views of a region of the exemplary structure during modification of in-process memory opening fill structures 58' in the fourth configuration of FIG. 9H and formation of electrically conductive layers 46 and backside trench fill structures (74, 76) according to an embodiment of the present disclosure.

Figure 16A:
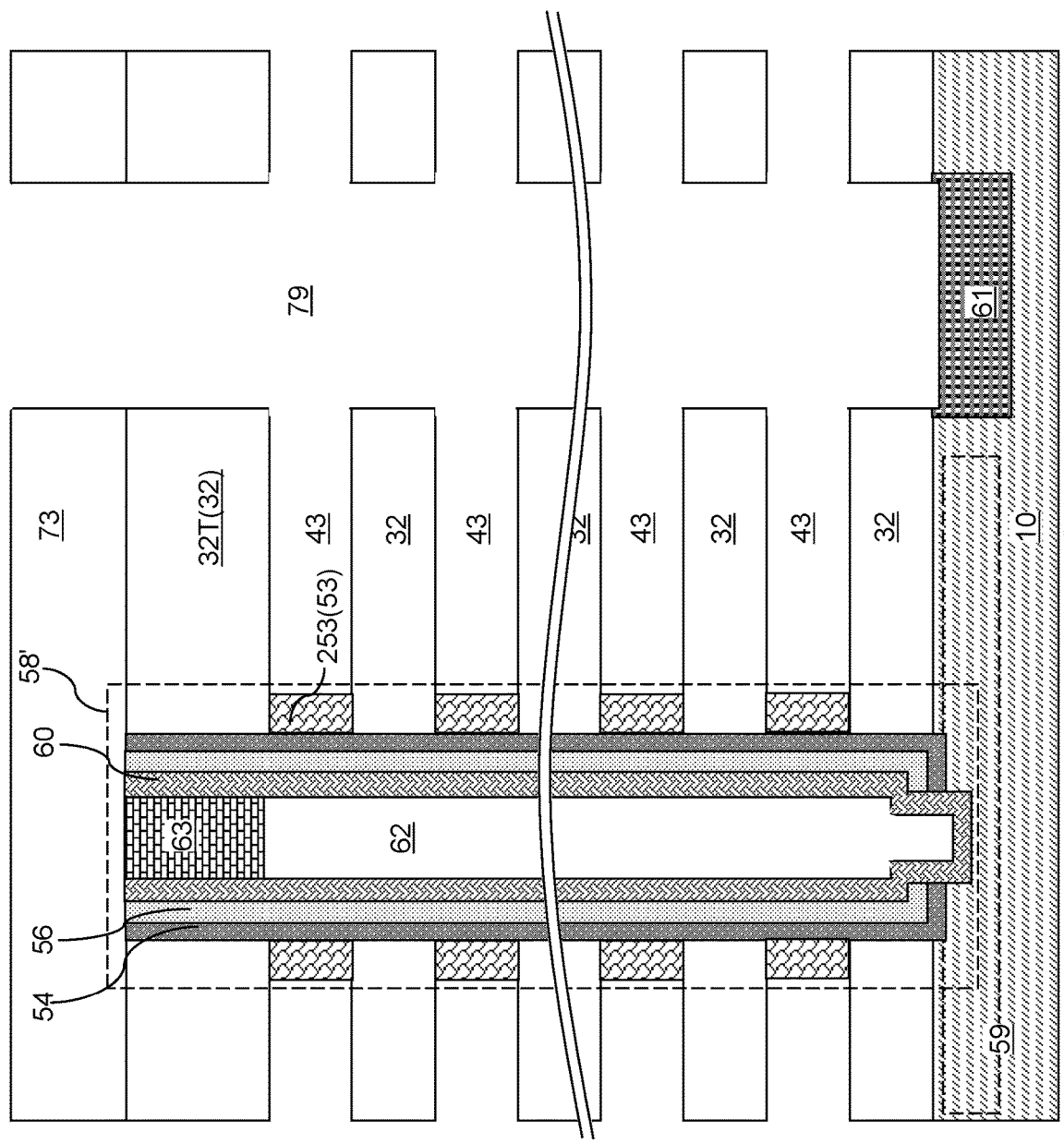

Referring to FIG. 16A, the fourth configuration of the exemplary structure is illustrated after the processing steps described with reference to FIGS. 12A and 12B. Each in-process memory opening fill structure 58' comprises a continuous charge storage material layer 54.

Referring to FIG. 16B, an oxidation process can be performed to convert outer surface portions of the discrete memory elements 53 (comprising semiconductor material portions 253) into dielectric semiconductor oxide material portions 341, which are blocking dielectric material portions 41. The blocking dielectric material portions 41 comprise a dielectric oxide of the semiconductor material in the semiconductor material portions 253. In one embodiment, the semiconductor material portions 253 comprises silicon atoms, and may comprise undoped silicon, p-doped silicon, or n-doped silicon. In this case, the dielectric semiconductor oxide material portions 341 may comprise silicon atoms and oxygen atoms, and may comprise undoped silicon oxide or a doped silicon oxide. In one embodiment, the vertical stack of discrete charge storage elements 53 consists essentially of a semiconductor material (such as silicon), and the vertical stack of blocking dielectric material portions 41 (comprising the dielectric semiconductor oxide material portions 341) consists essentially of a dielectric oxide (such as silicon oxide) of the semiconductor material.

In one embodiment, the semiconductor material of the vertical stack of discrete charge storage elements 53 consists essentially of undoped polysilicon or doped polysilicon. In case the vertical stack of discrete charge storage elements 53 consists essentially of undoped polysilicon or doped polysilicon. In some embodiments, the electrical dopants in the semiconductor material portions 253 may induce dopant pile-up during the oxidation process. In this case, a non-homogeneous oxidation concentration profile may be present within each of the dielectric semiconductor oxide material portions 341 such that the atomic concentration of an electrical dopant is lower at or in proximity to the outer cylindrical sidewall of each dielectric semiconductor oxide material portion 341 than at or in proximity to the inner cylindrical sidewall of each dielectric semiconductor oxide material portion 341. In this case, the semiconductor material of the discrete memory elements 53 (comprising the semiconductor material portions 253) comprises an electrical dopant that is a p-type dopant or an n-type dopant, and an atomic concentration of the electrical dopant laterally decreases within each of the blocking dielectric material portions 41 (comprising the dielectric semiconductor oxide material portions 341) with a lateral distance from the vertical semiconductor channel 60.

Each in-process memory opening fill structure 58' is converted into a respective memory opening fill structure 58 upon formation of a vertical stack of blocking dielectric material portions 41. Each memory opening fill structure 58 comprises a vertical stack of discrete memory elements 53, and a vertical stack of blocking dielectric material portions 41.

Figure 16C:
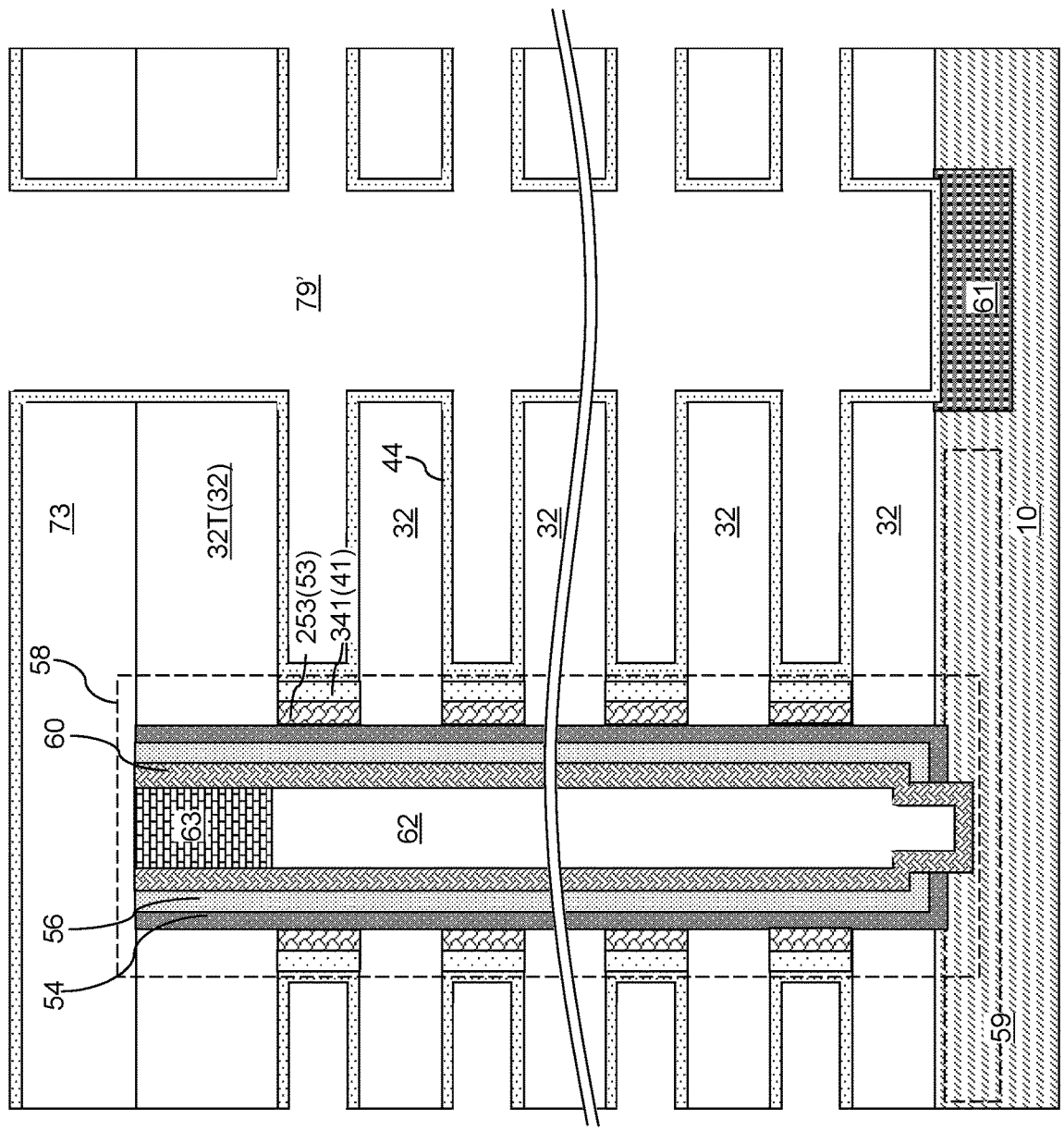

Referring to FIG. 16C, the processing steps described with reference to FIG. 13C may be performed to form a backside blocking dielectric layer 44.

Figure 16D:
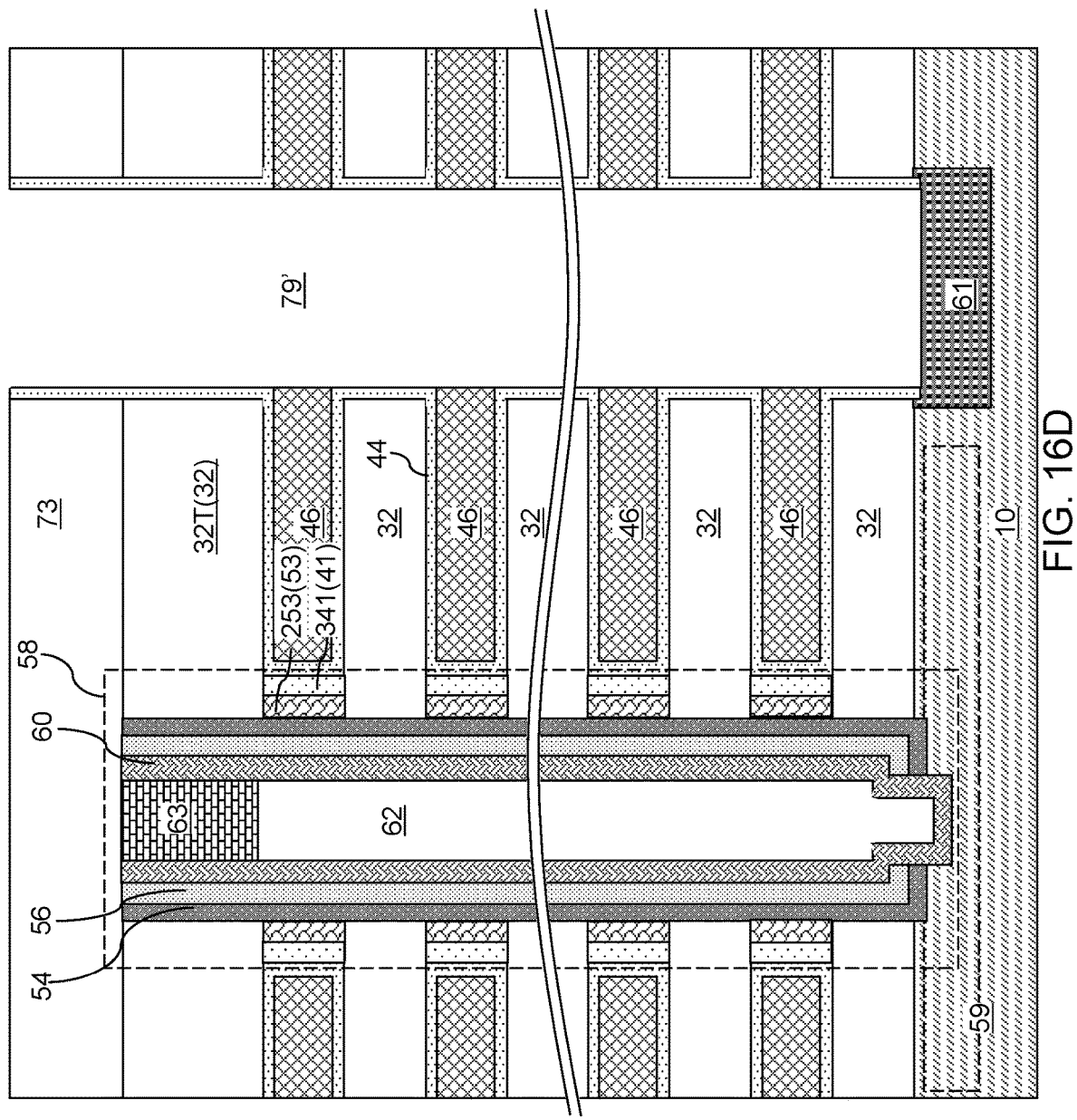

Referring to FIG. 16D, the processing steps described with reference to FIG. 13D may be performed to form electrically conductive layers 46.

Figure 16E:
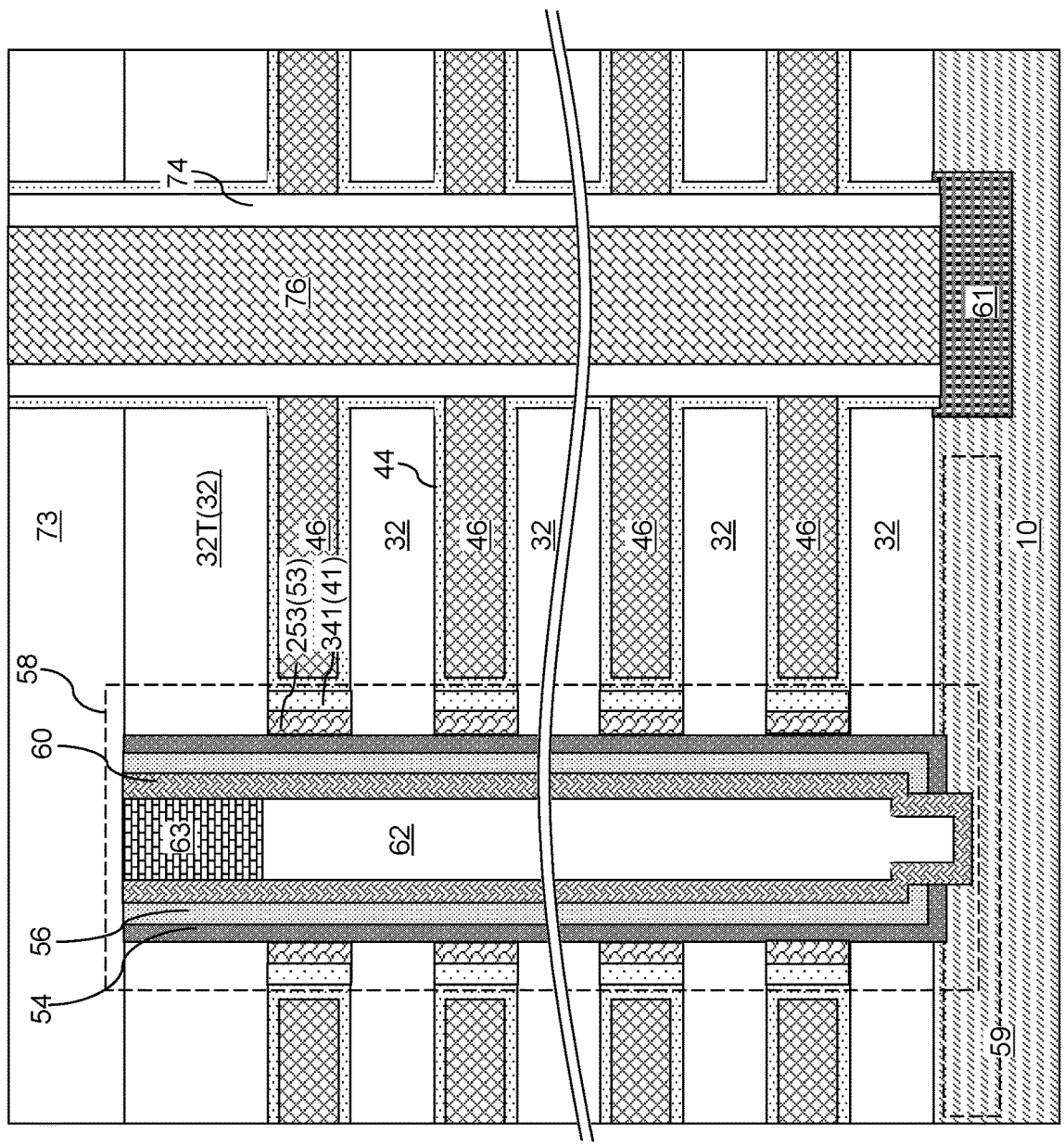

Referring to FIG. 16E, the processing steps described with reference to FIG. 13E may be performed to form backside trench fill structures (74, 76).

Figure 17A:
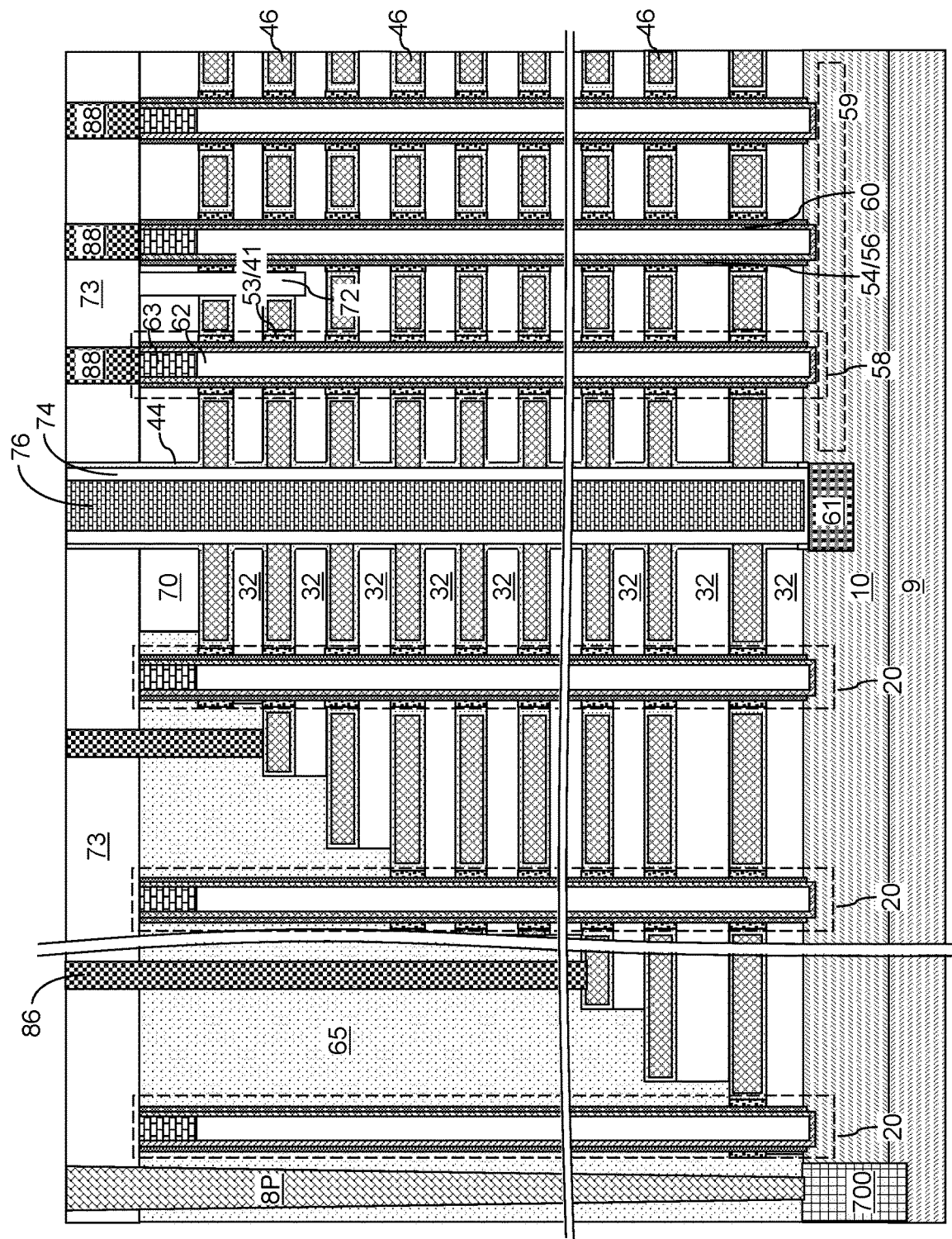
FIG. 17A is a schematic vertical cross-sectional view of the exemplary structure after formation of additional contact via structures according to an embodiment of the present disclosure.
Figure 17B:
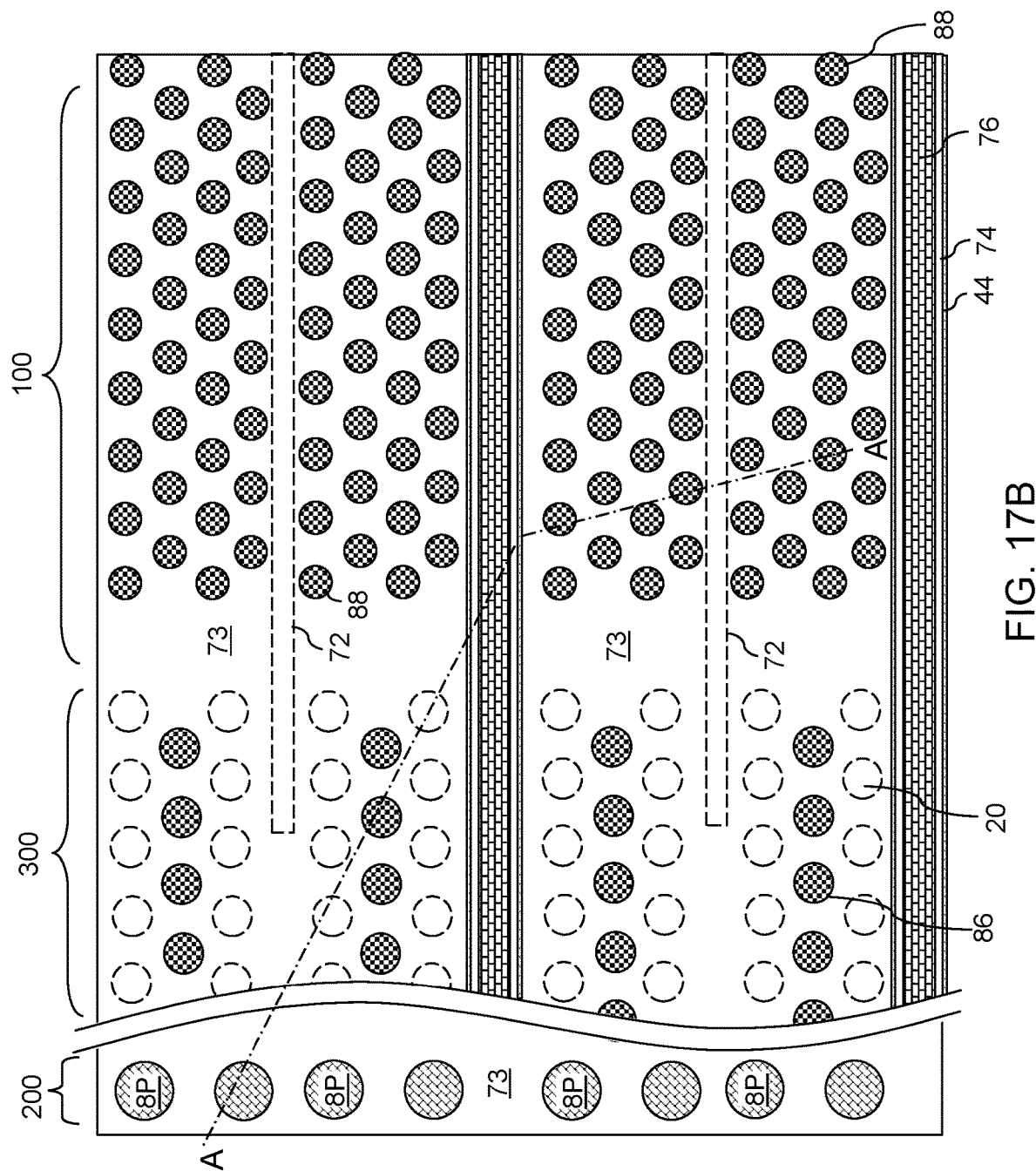
FIG. 17B is a top-down view of the exemplary structure of FIG. 17A. The vertical plane A-A' is the plane of the schematic vertical cross-sectional view of FIG. 17A.

Referring to FIGS. 17A and 17B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a semiconductor structure comprises: an alternating stack (32, 46) of insulating layers 32 and electrically conductive layers 46; a memory opening 49 vertically extending through the alternating stack (32, 46); and a memory opening fill structure 58 located in the memory opening 49 and comprising a vertical semiconductor channel 60 and a memory film (56, 54, 53, 41), wherein the memory film (56, 54, 53, 41) comprises: a tunneling dielectric layer 56; a continuous charge storage material layer 54 vertically extending through a plurality of the electrically conductive layers 46; a vertical stack of discrete charge storage elements 53 located at levels of the electrically conductive layers 46 and contacting a respective surface segment of an outer sidewall of the continuous charge storage material layer 54; and a vertical stack of discrete blocking dielectric material portions 41 comprising silicon atoms and oxygen atoms and located at the levels of the electrically conductive layers 46 and vertically spaced from each other.

In one embodiment, each of the discrete blocking dielectric material portions 41 has a cylindrical shape. Thus, each of the discrete blocking dielectric material portions 41 does not extend between horizontal surfaces of the electrically conductive layers 46 and the insulating layers 32. In other words, the discrete blocking dielectric material portions 41 do not have horizontal portions that extend between horizontal surfaces of the electrically conductive layers 46 and the insulating layers 32.

In one embodiment, the outer sidewall of the continuous charge storage material layer 54 vertically extends straight through the plurality of electrically conductive layers 46; and interfaces between the insulating layers 32 and the outer sidewall of the continuous charge storage material layer 54 are vertically coincident with interfaces between the vertical stack of discrete charge storage elements 53 and the surface segments of the outer sidewall of the continuous charge storage material layer 54.

In one embodiment, the vertical stack of discrete charge storage elements 53 comprise non-stoichiometric silicon-rich silicon nitride material. In one embodiment, the continuous charge storage material layer 54 comprises a stoichiometric silicon nitride material.

In one embodiment, the vertical stack of discrete charge storage elements 53 consists essentially of a semiconductor material; and the vertical stack of blocking dielectric material portions 41 consists essentially of a dielectric oxide of the semiconductor material. In one embodiment, the semiconductor material consists essentially of undoped polysilicon or doped polysilicon. In one embodiment, the semiconductor material comprises an electrical dopant that is a p-type dopant or an n-type dopant; and an atomic concentration of the electrical dopant laterally decreases within each of the blocking dielectric material portions 41 with a lateral distance from the vertical semiconductor channel 60.

In one embodiment, the vertical stack of discrete charge storage elements 53 consists essentially of a metal-semiconductor alloy of a semiconductor element and a metal. In one embodiment, the vertical stack of blocking dielectric material portions 41 consists essentially of a compound or a mixture of an oxide of the semiconductor element and an oxide of the metal. In one embodiment, the metal-semiconductor alloy is a metal silicide material. In one embodiment, the semiconductor structure comprises an planar metal-semiconductor alloy portion in contact with a bottom surface of the memory film (56, 54, 53, 41) and a semiconductor material layer in the substrate (9, 10).

In one embodiment, each of the electrically conductive layers 46 is laterally spaced from the vertical stack of blocking dielectric material portions 41 by a respective backside blocking dielectric layer 44 laterally surrounding and contacting a respective backside blocking dielectric material portion of the vertical stack of blocking dielectric material portions 41. In one embodiment, each of the electrically conductive layers 46 is vertically spaced from a respective overlying insulating layer 32 by an upper horizontally-extending portion of the respective backside blocking dielectric layer 44, and is vertically spaced from a respective underlying insulating layer 32 by a lower horizontally-extending portion of the respective backside blocking dielectric layer 44.

The various embodiments of the present disclosure include a vertical stack of discrete charge storage elements 53, which may be used as the only charge storage elements or may be used in combination with a continuous charge storage material layer 54. The vertical stack of discrete charge storage elements 53 can be advantageously employed to provide enhanced charge storage characteristics for a three-dimensional memory device. The polysilicon or silicide floating gates of some embodiments may provide enhanced data retention and faster erase speeds. In other embodiments, a combination of stoichiometric and silicon-rich silicon nitride charge storage materials provide an improved P/E window compared to a single silicon nitride charge storage material. In other embodiments, hybrid polysilicon or silicide floating gates with a continuous silicon nitride charge storage layer may provide a combination of the above benefits.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
   an alternating stack comprising a plurality of insulating layers and a plurality of electrically conductive layers;
   a memory opening vertically extending through the alternating stack; and
   a memory opening fill structure located in the memory opening and comprising a vertical semiconductor channel and a memory film, wherein the memory film comprises:
   a tunneling dielectric layer;
   a continuous charge storage material layer extending through the alternating stack and being continuous between vertical levels of the electrically conductive layers of the plurality of electrically conductive layers;
   a vertical stack of a plurality of discrete charge storage elements, each discrete charge storage element of the plurality of discrete charge storage elements is located at a vertical level of a respective electrically conductive layer of the plurality of electrically conductive layers and having a first sidewall facing a center of the memory opening and directly contacting a respective surface segment of an outer sidewall of the continuous charge storage material layer; and
   a discontinuous blocking dielectric material layer comprising a vertical stack of a plurality of discrete blocking dielectric material portions comprising silicon atoms and oxygen atoms and vertically spaced apart from each other, each discrete blocking dielectric material portion of the plurality of discrete blocking dielectric material portions is located at the vertical level of a respective electrically conductive layer of the plurality of electrically conductive layers,
   wherein the plurality of discrete charge storage elements are floating gates.

2. The semiconductor structure of claim 1, wherein: each of the discrete blocking dielectric material portions of the plurality of discrete blocking dielectric portions has a cylindrical shape and does not extend between horizontal surfaces of the plurality of electrically conductive layers and the plurality of insulating layers; the outer sidewall of the continuous charge storage material layer vertically extends straight through the plurality of electrically conductive layers; and interfaces between the plurality of insulating layers and the outer sidewall of the continuous charge storage material layer are vertically coincident with interfaces between the vertical stack of the plurality of discrete charge storage elements and the surface segments of the outer sidewall of the continuous charge storage material layer.

3. The semiconductor structure of claim 1, wherein: and the continuous charge storage material layer comprises a stoichiometric silicon nitride material.

4. The semiconductor structure of claim 1, wherein: the vertical stack of the plurality of discrete charge storage elements consists essentially of a semiconductor material; and the vertical stack of the plurality of blocking dielectric material portions consists essentially of a dielectric oxide of the semiconductor material.

5. The semiconductor structure of claim 4, wherein the semiconductor material consists essentially of undoped polysilicon or doped polysilicon.

6. The semiconductor structure of claim 4, wherein: the semiconductor material comprises an electrical dopant that is a p-type dopant or an n-type dopant; and an atomic concentration of the electrical dopant laterally decreases within each of the blocking dielectric material portions with a lateral distance from the vertical semiconductor channel.

7. The semiconductor structure of claim 1, wherein the vertical stack of the plurality of discrete charge storage elements consists essentially of a metal-semiconductor alloy of a semiconductor element and a metal.

8. The semiconductor structure of claim 7, wherein the vertical stack of the plurality of blocking dielectric material portions consists essentially of a compound or a mixture of an oxide of the semiconductor element and an oxide of the metal.

9. The semiconductor structure of claim 7, wherein the metal-semiconductor alloy is a metal silicide material.

10. The semiconductor structure of claim 7, further comprising a planar metal-semiconductor alloy portion in contact with a bottom surface of the memory film and a semiconductor material layer in the substrate.

11. The semiconductor structure of claim 1, wherein each of the electrically conductive layers of the plurality of electrically conductive layers is laterally spaced from the vertical stack of the plurality of blocking dielectric material portions by a respective backside blocking dielectric layer laterally surrounding and contacting a respective blocking dielectric material portion of the plurality of blocking dielectric material portions.

12. A semiconductor structure, comprising:
    an alternating stack comprising a plurality of insulating layers and a plurality of electrically conductive layers;

a memory opening vertically extending through the alternating stack; and a memory opening fill structure located in the memory opening and comprising a vertical semiconductor channel and a memory film, wherein the memory film comprises:

a tunneling dielectric layer;

a continuous charge storage material layer extending through the alternating stack and being continuous between vertical levels of the electrically conductive layers of the plurality of electrically conductive layers;

a vertical stack of a plurality of discrete polysilicon or metal silicide floating gates, each discrete floating gate of the plurality of floating gates is located at a vertical level of a respective electrically conductive layer of the plurality of the electrically conductive layers and having a first sidewall facing a center of the memory opening and directly contacting a respective surface segment of an outer sidewall of the continuous charge storage material layer; and a discontinuous blocking dielectric material layer comprising a vertical stack of a plurality of discrete blocking dielectric material portions comprising silicon atoms and oxygen atoms and vertically spaced apart from each other, each discrete blocking dielectric material portion of the plurality of discrete blocking dielectric material portions is located at the vertical level of a respective electrically conductive layer of the plurality of electrically conductive layers, wherein each discrete blocking dielectric portion of the plurality of discrete blocking dielectric material portions has a cylindrical shape and does not extend between horizontal surfaces of the plurality of electrically conductive layers and the plurality of insulating layers.

13. A method of forming a semiconductor structure, comprising:

forming an alternating stack comprising a plurality of insulating layers and a plurality of sacrificial material layers over a substrate;

forming a memory opening through the alternating stack;

forming an in-process memory opening fill structure in the memory opening, wherein the in-process memory opening fill structure comprises a vertical stack of a plurality of discrete charge storage elements, a continuous charge storage material layer, a tunneling dielectric layer, and a vertical semiconductor channel, each discrete charge storage element of the plurality of discrete charge storage elements located at a vertical level of a respective sacrificial material layer of the plurality of sacrificial material layers;

forming backside recesses by removing the plurality of sacrificial material layers selective to the plurality of insulating layers and the vertical stack of the plurality of discrete charge storage elements;

converting outer surface portions of the vertical stack of the plurality of discrete charge storage elements into a discontinuous blocking dielectric material layer comprising a vertical stack of a plurality of discrete blocking dielectric material portions by performing an oxidation process; and forming a plurality of electrically conductive layers within the backside recesses, wherein the continuous charge storage material layer extends through the alternating stack and is continuous between vertical levels of the electrically conductive layers of the plurality of electrically conductive layers, each discrete charge storage element of the plurality of discrete charge storage elements has a first sidewall facing a center of the memory opening and directly contacting a respective surface segment of an outer sidewall of the continuous charge storage material layer, each discrete blocking dielectric material portion of the plurality of discrete blocking dielectric material portions is located at the vertical level of a respective electrically conductive layer of the plurality of electrically conductive layers, wherein the plurality of discrete charge storage elements are floating gates.

14. The method of claim 13, wherein the vertical stack of the plurality of discrete charge storage elements comprises discrete portions of a metal-semiconductor alloy of a semiconductor element and a metal vertically spaced apart from each other by the plurality of insulating layers.

15. The method of claim 14, wherein: the plurality of sacrificial material layers comprise silicon; and the vertical stack of the plurality of discrete charge storage elements is formed by forming a metal on surface portions of the plurality of sacrificial material layers around the memory opening and reacting the metal with the silicon to form the plurality of discrete charge storage elements comprising a metal silicide.

16. The method of claim 13, wherein: the vertical stack of the plurality of discrete blocking dielectric material portions is formed by oxidizing outer surface portions of the vertical stack of the plurality of discrete charge storage elements into silicon oxide portions.

17. The method of claim 13, wherein the continuous charge storage material layer comprises a stoichiometric silicon nitride material.

18. The method of claim 13, wherein: the plurality of sacrificial material layers comprise silicon nitride; the vertical stack of the plurality of discrete charge storage elements comprises a semiconductor material; and the vertical stack of the plurality of discrete blocking dielectric material portions comprises a dielectric oxide of the semiconductor material.

* * * * *